US010787744B2

(12) United States Patent
George et al.

(10) Patent No.: US 10,787,744 B2
(45) Date of Patent: *Sep. 29, 2020

(54) ENHANCEMENT OF THERMAL ATOMIC LAYER ETCHING

(71) Applicant: THE REGENTS OF THE UNIVERSITY OF COLORADO, A BODY CORPORATE, Denver, CO (US)

(72) Inventors: Steven McClellan George, Boulder, CO (US); Nicholas Ray Johnson, Louisville, CO (US); Jaime Willadean Dumont, Racine, WI (US); Amy Elizabeth Marquardt, Chicago, IL (US); Younghee Lee, Boulder, CO (US); David Richard Zywotko, Boulder, CO (US); Aziz Abdulagatov, Boulder, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 69 days.

This patent is subject to a terminal disclaimer.

(21) Appl. No.: 16/049,258

(22) Filed: Jul. 30, 2018

(65) Prior Publication Data
US 2019/0055654 A1 Feb. 21, 2019

Related U.S. Application Data

(63) Continuation-in-part of application No. PCT/US2017/034027, filed on May 23, 2017.
(Continued)

(51) Int. Cl.
*C23F 4/00* (2006.01)
*H01L 21/465* (2006.01)
(Continued)

(52) U.S. Cl.
CPC .......... *C23F 4/00* (2013.01); *H01L 21/30621* (2013.01); *H01L 21/31116* (2013.01); *H01L 21/31122* (2013.01); *H01L 21/465* (2013.01)

(58) Field of Classification Search
CPC ................. C23F 4/00; H01L 21/30621; H01L 21/31116; H01L 21/31122; H01L 21/465
See application file for complete search history.

(56) References Cited

U.S. PATENT DOCUMENTS

| 5,368,687 | A | 11/1994 | Sandhu et al. |
| 5,389,196 | A | 2/1995 | Bloomstein et al. |
(Continued)

FOREIGN PATENT DOCUMENTS

| WO | 2017205658 A1 | 11/2017 |
| WO | 2017213842 A2 | 12/2017 |

OTHER PUBLICATIONS

Kanarik, et al., "Overview of Atomic Layer Etching in the Semiconductor Industry," J Vac Sci Technol A, vol. 33(2), 2015, pp. 1-14.
(Continued)

*Primary Examiner* — Anita K Alanko
(74) *Attorney, Agent, or Firm* — Saul Ewing Arnstein & Lehr LLP; Kathryn Doyle; Domingos J. Silva

(57) ABSTRACT

The invention includes a method of promoting atomic layer etching (ALE) of a surface. In certain embodiments, the method comprises sequential reactions with a metal precursor and a halogen-containing gas. In other embodiments, the etching rate is increased by removing residual species bound to and/or adsorbed onto the surface.

21 Claims, 71 Drawing Sheets

Related U.S. Application Data

(60) Provisional application No. 62/340,152, filed on May 23, 2016.

(51) Int. Cl.
  *H01L 21/311* (2006.01)
  *H01L 21/306* (2006.01)

(56) References Cited

U.S. PATENT DOCUMENTS

| | | | |
|---|---|---|---|
| 5,705,443 A | 1/1998 | Stauf et al. | |
| 5,814,238 A | 9/1998 | Ashby et al. | |
| 6,010,966 A | 1/2000 | Ionov | |
| 6,690,014 B1 | 2/2004 | Gooch et al. | |
| 7,357,138 B2 | 4/2008 | Ji et al. | |
| 7,416,989 B1 | 8/2008 | Liu et al. | |
| 7,781,340 B2 | 8/2010 | Chen et al. | |
| 10,115,601 B2* | 10/2018 | Tapily | H01L 21/3065 |
| 10,208,383 B2* | 2/2019 | George | C23F 1/12 |
| 10,381,227 B2* | 8/2019 | George | H01L 21/32135 |
| 10,460,946 B2* | 10/2019 | Lin | H01L 21/02046 |
| 2006/0003145 A1 | 1/2006 | Hansen et al. | |
| 2006/0292877 A1 | 12/2006 | Lake et al. | |
| 2008/0023800 A1 | 1/2008 | Holzig et al. | |
| 2010/0099264 A1 | 4/2010 | Elers et al. | |
| 2014/0273492 A1 | 9/2014 | Anthis et al. | |
| 2015/0162214 A1 | 6/2015 | Martin et al. | |
| 2015/0270140 A1 | 9/2015 | Jurcik et al. | |
| 2016/0111294 A1 | 4/2016 | Lill et al. | |
| 2016/0203995 A1* | 7/2016 | Kanarik | H01L 21/0228 438/703 |
| 2017/0018439 A1 | 1/2017 | Wang et al. | |
| 2017/0365478 A1 | 12/2017 | George et al. | |

OTHER PUBLICATIONS

Lee, et al., "Atomic Layer Etching of Al2O3 Using Sequential, Self-Limiting Thermal Reactions with Sn(acac)2 and Hydrogen Fluoride," ACS Nano, vol. 9, No. 2, 2015, pp. 2061-2070.

Yang,X. et al., Drying Etching of Al2O3 Thin Films in O2/BCl3/Ar Inductively Coupled Plasma, Transactions on Electrical and Electronic Materials, vol. 11, No. 5 ,2010 ,pp. 202-205.

International Search Report and Written Opinion for PCT International Application No. PCT/US2017/034027 dated Jan. 24, 2018.

\* cited by examiner

Al$_2$O$_3$ ALD

ALE

Prior to ALE

After 80 Cycles of ALE

ENHANCEMENT OF THERMAL ATOMIC LAYER ETCHING

CROSS-REFERENCE TO RELATED APPLICATIONS

The present application is a continuation-in-part, and claims priority to, PCT International Application No. PCT/US2017/034027, filed May 23, 2017 and published under PCT Article 21(2) in English, which claims priority under 35 U.S.C. § 119(e) to U.S. Provisional Patent Application No. 62/340,152, filed May 23, 2016, all of which applications are hereby incorporated by reference in their entireties herein.

STATEMENT REGARDING FEDERALLY SPONSORED RESEARCH OR DEVELOPMENT

This invention was made with government support under grant numbers CHE1306131 and CHE1609554 awarded by the National Science Foundation, and grant number W911NF-13-1-0041 awarded by the U.S. Army Research Office. The government has certain rights in the invention.

BACKGROUND OF THE INVENTION

A thin film corresponds to a layer of material deposited on a solid support or substrate, wherein the layer ranges in thickness from fractions of a nanometer (monolayer) to several micrometers. Thin films are employed, for example, in electronics (e.g., insulators, semiconductors, or conductors for integrated circuits), optical coatings (e.g., reflective, anti-reflective coatings, or self-cleaning glass) and packaging (e.g., aluminum-coated PET film).

Thin film deposition may be accomplished using a variety of gas phase chemical and/or physical vapor deposition techniques. Many of these deposition techniques are able to control layer thickness within a few tens of nanometers. Thin film deposition is also achieved by liquid phase and electrochemical techniques, where the thickness of the final film is not well controlled. Examples include copper deposition by electroplating and sol gel deposition.

Gas phase deposition techniques fall into two broad categories, depending on whether the process is primarily chemical or physical. In a chemical deposition process, a precursor undergoes a chemical change at a solid surface, leaving a solid layer on the surface. In a chemical vapor deposition (CVD) process, a gas-phase precursor, often a halide or hydride of the element to be deposited, reacts with a substrate on the surface, leading to formation of the thin film on the surface. Atomic layer deposition (ALD) is a thin film growth technique based on sequential, self-limiting surface reactions. ALD can deposit extremely conformal thin films with atomic layer control. ALD has developed rapidly over the last 10-15 years to meet industrial needs such as the miniaturization of semiconductor devices. ALD can deposit a wide range of materials from metal oxides to metals, and is typically accomplished using thermal chemistry. Further, sometimes plasma ALD is employed to enhance the surface reactions.

In contrast, atomic layer etching (ALE) is a thin film removal technique based on sequential, self-limiting surface reactions. ALE can be viewed as the reverse of ALD. ALE allows for removal of thin films with atomic layer (Ångstrom-level) control. Compared with the large number of ALD processes, ALE processes have not been developed for as many materials. Most ALE processes reported so far have used excitation such as ion-enhanced or energetic noble gas atom-enhanced surface reactions. These previously reported ALE process can be described as "plasma ALE" processes. Most of the documented plasma ALE processes have adsorbed a halogen on the surface of the material. Directional ion or noble gas atom bombardment is then used to desorb halogen compounds that etch the material. Directional etching with energetic ion or atom bombardment allows for anisotropic material removal, but can also damage the underlying substrate.

Developing thermal self-limiting ALE reactions that are the reverse of ALD reactions is difficult. ALD reactions are typically favorable exothermic thermochemical reactions, which are spontaneous with negative $\Delta G$ values (G is the Gibbs free energy). Performing ALD reactions in reverse should not be possible because of these thermodynamic considerations. The challenge for thermal ALE reactions is to find alternative, self-limiting, reactions with different reactants.

Thermal ALE methods have recently been developed based on sequential, self-limiting reactions that are spontaneous and exothermic, displaying negative $\Delta G$ values. Non-limiting examples are thermal ALE for $Al_2O_3$ and/or $HfO_2$ using hydrogen fluoride (HF) and tin(II) acetylacetonate ($Sn(acac)_2$) as the reactants; and thermal ALE for $Al_2O_3$ using HF and trimethylaluminum (TMA) as the reactants. During the thermal ALE reactions, HF fluorinates the metal oxide and forms a metal fluoride layer on the surface. The metal precursors, either $Sn(acac)_2$ or TMA, then accept fluorine from the metal fluoride and transfer their ligands to the metal fluoride in a ligand-exchange reaction. This transmetalation or redistribution process can form volatile species such as $AlF(acac)_2$ or $AlF(CH_3)_2$.

There is a need in the art for novel methods of performing ALE on a surface. Such methods should be self-limiting and display atomic level precision. Further, such methods should be amenable to further rate enhancement as a function of reaction conditions and to allow for lower operational temperatures. The present invention meets this need.

BRIEF SUMMARY OF THE INVENTION

The invention provides a method of promoting atomic layer etching (ALE) on a solid substrate comprising a first metal compound. The invention further provides a method of forming and/or enlarging pores in a porous substrate or features in a high aspect-ratio structure, wherein the porous substrate or high aspect-ratio structure comprises a first metal compound. The invention further provides a method of patterning a solid substrate, wherein a portion of the surface of the solid substrate has an exposed first metal compound. The invention further provides a method of selectively removing a portion of a solid substrate, wherein the solid substrate comprises a first metal compound. The invention further provides a method of smoothing the surface of a solid substrate, wherein the solid substrate comprises a first metal compound. The invention further provides a method of removing at least a fraction of an impurity from a solid substrate, wherein a portion of the surface of the solid substrate has an exposed first metal compound. The invention further provides a method of reducing the size of at least one 3D architecture feature on a surface of a solid substrate, wherein the surface of the solid substrate comprises a first metal compound. The invention further provides a method of reducing ALE etching rates of a surface. The invention further provides a method of reducing size of a particle, wherein the surface of the particle comprises a first metal compound. The invention further provides a method of performing an anisotropic ALE reaction on a solid substrate.

The invention provides a solid substrate, which can be prepared according to the methods of the invention. The invention further provides a porous substrate or high aspect-ratio structure, which can be prepared according to the methods of the invention. The invention further provides a patterned solid substrate, which can be prepared according to the methods of the invention. The invention further provides a solid substrate, which can be prepared according to the methods of the invention. The invention further provides a smoothened solid substrate, which can be prepared according to the methods of the invention. The invention further provides a substrate comprising an impurity, wherein at least a fraction of an impurity is removed from the substrate according to the methods of the invention. The invention further provides a solid substrate, wherein a 3D architectural feature is located on a surface of the solid substrate, wherein the feature is reduced according to the methods of the invention. The invention further provides a particle that has been reduced in size according to the methods of the invention.

In certain embodiments, the method comprises sequentially (a) contacting the solid substrate with a gaseous second metal precursor, wherein the second metal precursor comprises at least one ligand selected from the group consisting of a monodentate ligand, chelate and any combinations thereof, whereby a first metal product is formed. In other embodiments, the method comprises (b) contacting the solid substrate formed in step (a) with a halogen-containing gas, whereby first metal halide is formed. In other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed onto the solid substrate.

In certain embodiments, the monodentate ligand comprises at least one selected from the group consisting of alkyl, hydride, carbonyl, halide, alkoxide, alkylamide, silylamide and any combinations thereof. In other embodiments, the chelate comprises at least one selected from the group consisting of β-diketonate, amidinate, acetamidinate, β-diketiminate, diamino alkoxide, metallocene and any combinations thereof.

In certain embodiments, the solid substrate is contacted with a halogen-containing gas before step (a), thereby forming a first metal halide.

In certain embodiments, treatment with the agent enhances etching of the solid substrate or lowers the temperature required for etching of the solid substrate.

In certain embodiments, the agent is at least one selected from the group consisting of a radical, photon, ion, electron, catalyst, and molecular adsorbate. In other embodiments, the agent is generated by a plasma. In yet other embodiments, the agent comprises a radical and the plasma comprises a $H_2$ plasma. In yet other embodiments, the agent comprises a photon and the plasma comprises an Ar plasma. In yet other embodiments, the agent is applied directionally to at least a fraction of the surface. In yet other embodiments, the ALE is at least partially anisotropic. In yet other embodiments, the agent comprises an alkali metal catalyst, which is formed on the solid substrate from an alkali metal molecular precursor.

In certain embodiments, the agent comprises a molecular precursor that adsorbs on the solid substrate and displaces other surface-adsorbed species that limit the progress of the thermal ALE.

In certain embodiments, before the solid substrate is submitted to ALE, an ALD film of a third metal compound is grown over at least a fraction of the solid substrate surface, wherein the ALE etches the solid substrate surface covered by the ALD film at a higher rate than the first metal compound. In other embodiments, the third metal compound reacts at least partially with the first metal compound. In yet other embodiments, the third metal compound comprises $Al_2O_3$ and the first metal compound comprises $SiO_2$. In yet other embodiments, before the solid substrate is submitted to ALE, a third metal precursor is adsorbed over at least a fraction of the substrate surface, wherein the ALE etches the substrate surface upon which the third metal precursor is adsorbed at a higher rate than the first metal compound. In yet other embodiments, the metal element from the third metal precursor diffuses into the first metal compound upon adsorption thereon. In yet other embodiments, the third metal precursor comprises $Al(CH_3)_3$ and the first metal compound comprises $SiO_2$. In yet other embodiments, before the solid substrate is submitted to ALE, a third metal precursor is reacted with at least a fraction of the substrate surface, wherein the first metal compound is converted to a new metal compound, which is etched by the ALE at a higher rate than the first metal compound. In yet other embodiments, the third metal precursor comprises $BCl_3$, wherein the reaction product comprises $B_2O_3$, and wherein the first metal compound comprises $SiO_2$. In yet other embodiments, the third metal precursor comprises $AlCl_3$, wherein the reaction product comprises $Al_2O_3$, and the first metal compound comprises $SiO_2$.

In certain embodiments, the solid substrate is contained in a single system and is sequentially contacted with the gaseous compound of the second metal in step (a) and the halogen-containing gas in step (b). In other embodiments, the solid substrate is purged with an inert gas after step (a) and/or step (b). In other embodiments, the inert gas comprises $N_2$ or Ar. In yet other embodiments, step (a) and/or step (b) is/are run at a temperature that is equal to or greater than a value ranging from about 25° C. to about 450° C. In yet other embodiments, the gaseous compound of the second metal in step (a) and the halogen-containing gas in step (b) are contained in separate systems, and the solid substrate is physically moved from one system to the other.

In certain embodiments, the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof.

In certain embodiments, before step (a) takes place, the elemental metal is converted to the corresponding metal halide. In other embodiments, the solid substrate is first submitted to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, hybrid organic-inorganic material, and any combinations thereof.

In certain embodiments, the first metal comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof. In other embodiments, the first metal compound is deposited on an inert substrate. In yet other embodiments, the inert substrate comprises Si. In yet other embodiments, the inert substrate comprises a Si wafer.

In certain embodiments, the second metal comprises at least one selected from the group consisting of Sn, Ge, Al, B, Ga, In, Zn, Ni, Pb, Si, S, P, Hf, Zr, Ti and any combinations thereof.

In certain embodiments, the β-diketonate comprises at least one selected from the group consisting of acac (acetylacetonate), hfac (hexafluoroacetylacetonate), tfac (trifluoroacetylacetonate), ttmhd (tetramethylheptanedionate) and any combinations thereof.

In certain embodiments, the halogen-containing gas comprises a hydrogen halide. In other embodiments, the hydrogen halide comprises HF. In yet other embodiments, the hydrogen halide comprises HCl, HBr or HI. In yet other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $SOCl_2$, $SOF_2$ and any combinations thereof. In yet other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $SOCl_2$, $SOF_2$, $CF_4$, $CF_2Cl_2$, $CCl_4$, $CF_3Cl$, $C_2F_6$, $CHF_3$ and any combinations thereof, and wherein the halogen-containing gas is ionized in a plasma to produce at least one halogen radical and/or ion.

In certain embodiments, the solid substrate is pretreated by sequentially contacting with a gaseous second metal precursor, and a halogen-containing gas. In other embodiments, the first metal compound is formed using atomic layer deposition.

In certain embodiments, each cycle of step (a) and step (b) is self-limiting. In other embodiments, each cycle of step (a) and step (b) allows for about the same etch rate and/or mass loss of the solid substrate. In yet other embodiments, the resulting etched solid substrate has about the same or lower surface roughness as the starting solid substrate. In yet other embodiments, the density of the etched solid substrate is about the same as of the starting solid substrate. In yet other embodiments, the refractive index of the etched solid substrate is about the same as of the initial solid substrate.

In certain embodiments, the solid substrate comprises at least one additional metal compound, and ALE of the first metal compound is selective over ALE of the at least one additional metal compound. In other embodiments, the ALE rate is (a) controlled by the solid substrate temperature, and/or (b) enhanced by pressure of the fluorination reagent and/or the second metal precursor. In yet other embodiments, the ALE is performed using a spatial ALE technique.

In certain embodiments, the method comprises (a) contacting the porous substrate or high-aspect-ratio structure with a gaseous second metal precursor, wherein the precursor comprises at least one selected from the group consisting of monodentate ligands, chelates and any combinations thereof, whereby a first metal product is formed. In other embodiments, the method comprises (b) contacting the porous substrate or high-aspect-ratio structure formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed on the solid substrate.

In certain embodiments, the method comprises (a) contacting the solid substrate with a gaseous second metal precursor, wherein the precursor comprises at least one selected from the group consisting of monodentate ligands, chelates and any combinations thereof, whereby a first metal product is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed on the solid substrate.

In certain embodiments, the surface of the starting solid substrate is at least partially masked, whereby only a portion of the surface of the solid substrate is exposed. In other embodiments, the surface of the starting solid substrate is at least partially masked with a photoresist. In yet other embodiments, the solid substrate is further patterned using a technique selected from the group consisting of monolayer self-assembling, nano-imprint and stamping.

In certain embodiments, the method comprises (a) contacting the solid substrate with a gaseous metal precursor, wherein the precursor comprises at least one selected from the group consisting of monodentate ligands, chelates and any combinations thereof, whereby a first metal product is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times. In yet other embodiments, the method comprises in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed on the solid substrate.

In certain embodiments, the solid substrate comprises a carbon composite.

In certain embodiments, the method comprises (a) contacting the solid substrate with a gaseous second metal precursor, wherein the precursor comprises at least one selected from the group consisting of monodentate ligands, chelates and any combinations thereof, whereby a first metal product is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed on the solid substrate. In yet other embodiments, a solid substrate that has lower surface roughness than the starting solid substrate is formed. In yet other embodiments, a continuous ultrathin film is obtained using the "deposit/etch back" strategy.

In certain embodiments, the method comprises (a) contacting the solid substrate with a gaseous second metal precursor, wherein the precursor comprises at least one selected from the group consisting of monodentate ligands, chelates and any combinations thereof, whereby a first metal product is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of any ligand, or any residual surface species that results from a surface reaction, that is bound to and/or adsorbed on the solid substrate.

In certain embodiments, the method comprises (a) contacting the solid substrate with a gaseous second metal precursor, wherein the precursor comprises at least one selected from the group consisting of monodentate ligands, chelates and any combinations thereof, whereby a first metal product is formed. In other embodiments, the method comprises (b) contacting the solid substrate formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface is treated with an agent that promotes removal of at least a fraction of the ligand, or any residual surface species that results from a surface reaction, that is bound to and/or adsorbed on the solid substrate.

In certain embodiments, the method comprises treating the surface with a species that binds onto and/or adsorbs onto the surface, wherein the ALE rates of the surface to which the species is bound and/or adsorbed is reduced, as compared to the ALE rates of the surface in the absence of the species.

In certain embodiments, the method comprises (a) contacting the particle with a gaseous second metal precursor, wherein the precursor comprises at least one selected from the group consisting of monodentate ligands, chelates and any combinations thereof, whereby a first metal product is formed. In other embodiments, the method comprises (b) contacting the particle formed in step (a) with a halogen-containing gas, whereby first metal halide is formed. In yet other embodiments, the method comprises (c) optionally repeating steps (a) and (b) one or more times. In yet other embodiments, in at least one time point selected from the group consisting of: during step (a), inbetween step (a) and step (b), during step (b), and inbetween step (b) and step (a) of the following iteration, the surface of the particle is treated with an agent that promotes removal of at least a fraction of the ligand, or any residual surface species that results from a surface reaction, that is bound to and/or adsorbed on the particle.

In certain embodiments, the method comprises applying directionally to a fraction of the surface of the solid substrate an agent that promotes removal of at least a fraction of any surface species that results from the ALE reaction and is bound to, and/or adsorbed on, a fraction of the surface of the solid substrate. In other embodiments, the applying is performed concomitantly with the ALE reaction and/or inbetween steps of the ALE reaction.

In certain embodiments, the agent is at least one selected from the group consisting of a radical, photon, ion, electron, catalyst, and molecular adsorbate. In other embodiments, the agent is generated by a plasma. In yet other embodiments, the agent comprises a radical and the plasma comprises a $H_2$ plasma. In yet other embodiments, the agent comprises a photon and the plasma comprises an Ar plasma. In yet other embodiments, the agent comprises an alkali metal catalyst, which is formed on the solid substrate from an alkali metal molecular precursor. In yet other embodiments, wherein the agent comprises a molecular precursor that adsorbs on the solid substrate and displaces other surface-adsorbed species that limit progress of the thermal ALE.

In certain embodiments, the invention provides a method of atomic layer etching (ALE) a solid substrate comprising a first metal compound. In other embodiments, the method comprises (x) submitting the solid substrate to a chemical treatment that results in the formation, on at least a portion of the surface of the solid substrate, of a first metal compound selected from the group consisting of a first metal oxide, first metal nitride, first metal phosphide, first metal sulfide, first metal arsenide, first metal fluoride, first metal silicide, first metal boride, first metal carbide, first metal selenide, first metal telluride, elemental first metal, first metal alloy, and hybrid organic-inorganic material. In yet other embodiments, the method comprises (b) contacting the solid substrate formed in step (x) with a halogen-containing gas, whereby first metal halide is formed as a product on the surface. In yet other embodiments, the method comprises (a) contacting the solid substrate formed in step (b) with a gaseous second metal precursor, wherein the precursor comprises at least one selected from the group consisting of monodentate ligands, chelates and any combinations thereof, whereby a first metal reaction product is formed. In yet other embodiments, the method comprises (c) optionally repeating steps (x), (b) and (a) one or more times. In yet other embodiments, in at least one time point selected from the group consisting of: during step (x), inbetween step (x) and step (b), during step (b), inbetween step (b) and step (a), during step (a), and inbetween step (a) and step (x) of the following iteration, the surface is treated with an agent that promotes removal of at least a fraction of any ligand, or any residual surface species that results from a surface reaction, that is bound to and/or adsorbed onto the solid substrate. In yet other embodiments, the monodentate ligand comprises at least one selected from the group consisting of alkyl, hydride, carbonyl, halide, alkoxide, alkylamide, silylamide and any combinations thereof. In yet other embodiments, the chelate comprises at least one selected from the group consisting of β-diketonate, amidinate, acetamidinate, β-diketiminate, diamino alkoxide, metallocene and any combinations thereof.

In certain embodiments, the solid substrate comprises at least one selected from the group consisting of Si, SiN, $SiN_xO_y$, $Si_xGe_y$, SiC, $SiB_3$, SiP, SiAs, SiSe, and SiTe, wherein x is an integer from 1 to 6 and y is an integer from 1 to 6. In other embodiments, the solid substrate comprises at least one selected from the group consisting of RuSi, $Ti_xSi_y$, $V_xSi_y$, $Nb_xSi_y$, $Mo_xSi_y$, $Ta_xSi_y$, $Re_xSi_y$, and $W_xSi_y$, wherein x is an integer from 1 to 6 and y is an integer from 1 to 6.

In certain embodiments, the chemical treatment is oxidation, the metal compound formed in (x) is $SiO_2$, the halogen containing gas is HF, and the gaseous second metal precursor is $Al(CH_3)_3$.

In certain embodiments, the chemical treatment is oxidation conducted by contacting the solid substrate with a chemical oxidant selected from the group consisting of oxygen ($O_2$), ozone ($O_3$), hydrogen peroxide ($H_2O_2$), water ($H_2O$) or an oxygen-containing plasma. In other embodiments, the solid substrate is contacted with the chemical oxidant at a temperature of about 30° C. to about 300° C. In yet other embodiments, the solid substrate is contacted with the chemical oxidant at a pressure of about 20 Torr to about 400 Torr.

In certain embodiments, the solid substrate is contained in a single system and is sequentially contacted with the chemical treatment in step (x), the halogen-containing gas in step (b) and the gaseous compound of the second metal in step (a) and wherein the solid substrate is purged with an inert gas after at least one of step (x), step (b) and step (a).

In certain embodiments, the chemical treatment in step (x), the halogen-containing gas in step (b) and the gaseous compound of the second metal in step (a) are contained in separate systems, and the solid substrate is physically moved from one system to the other. In certain embodiments, the method further comprises treating the solid substrate with an agent that promotes removal of at least a fraction of any ligand, or any other residual surface species that result from the surface reaction(s), that is bound to and/or adsorbed onto the solid substrate, wherein the treatment takes place in at least one time point selected from the group consisting of: during step (x), inbetween step (x) and step (b), during step (b), inbetween step (b) and step (a), during step (a), and inbetween step (a) and the step (x) of the following iteration.

BRIEF DESCRIPTION OF THE FIGURES

For the purpose of illustrating the invention, there are depicted in the drawings certain embodiments of the invention. However, the invention is not limited to the precise arrangements and instrumentalities of the embodiments depicted in the drawings.

FIG. 8A: Etch rate versus HF exposure with $Sn(acac)_2$ exposure fixed at 900 mTorr·s. FIG. 8B: Etch rate versus $Sn(acac)_2$ exposure with HF exposure fixed at 1270 mTorr·s.

FIG. 15A shows the initial absorbance for the Si—O stretching vibration in a $SiO_2$ film and the absorbance after 5 cycles of TMA/HF. FIG. 15B shows the initial absorbance for both Si—O and Al—O stretching vibrations in an $Al_2O_3/SiO_2$ film and the absorbance after 5 cycles of TMA/HF.

Figure 46A:
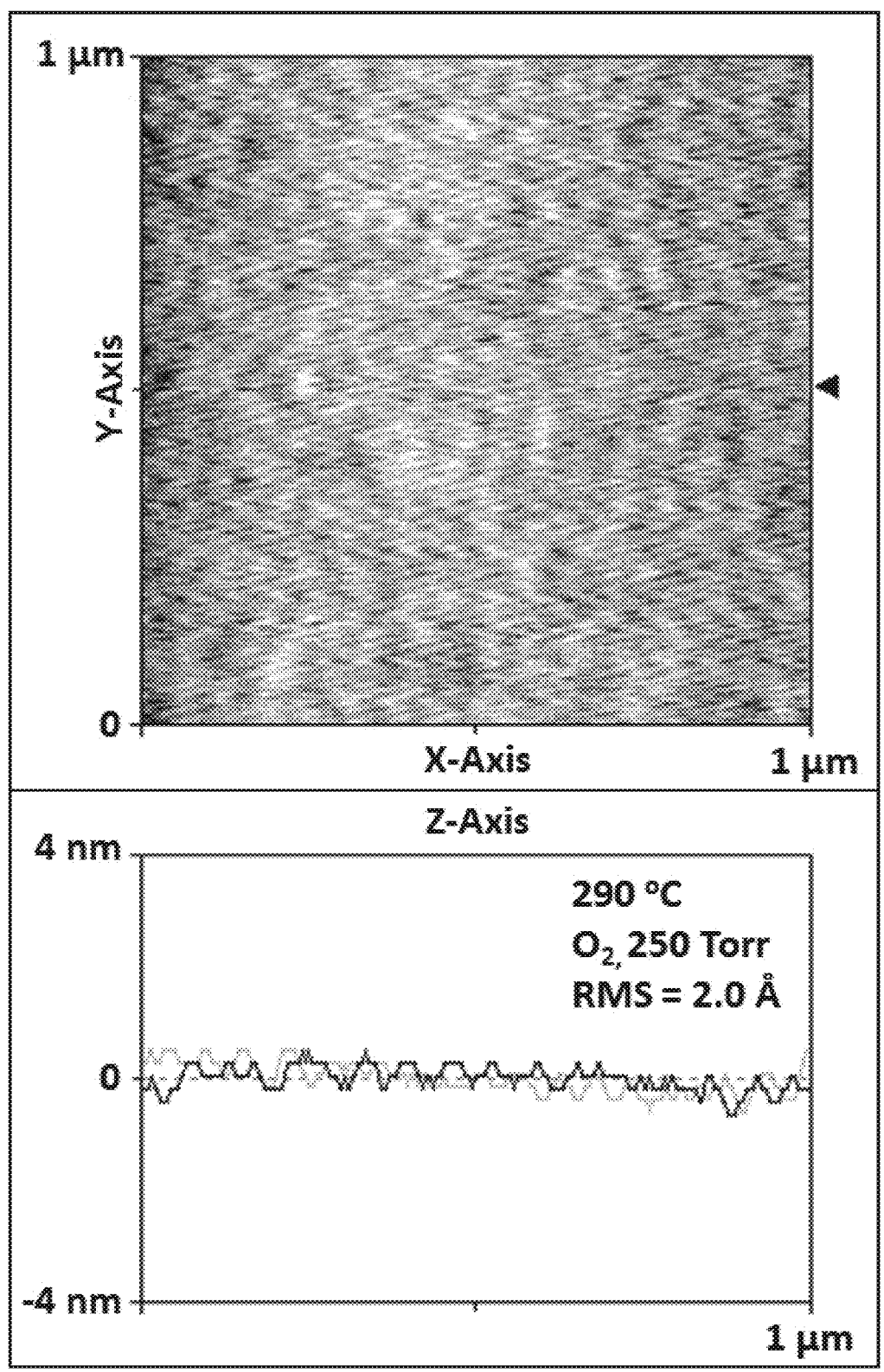
FIGS. 46A-46B are a set of AFM images and graphs of SOI wafers after 100 cycles of Si ALE using the $O_2$—HF-TMA exposure sequence at 290° C. with $O_2$ pressures at 250
Figure 46B:
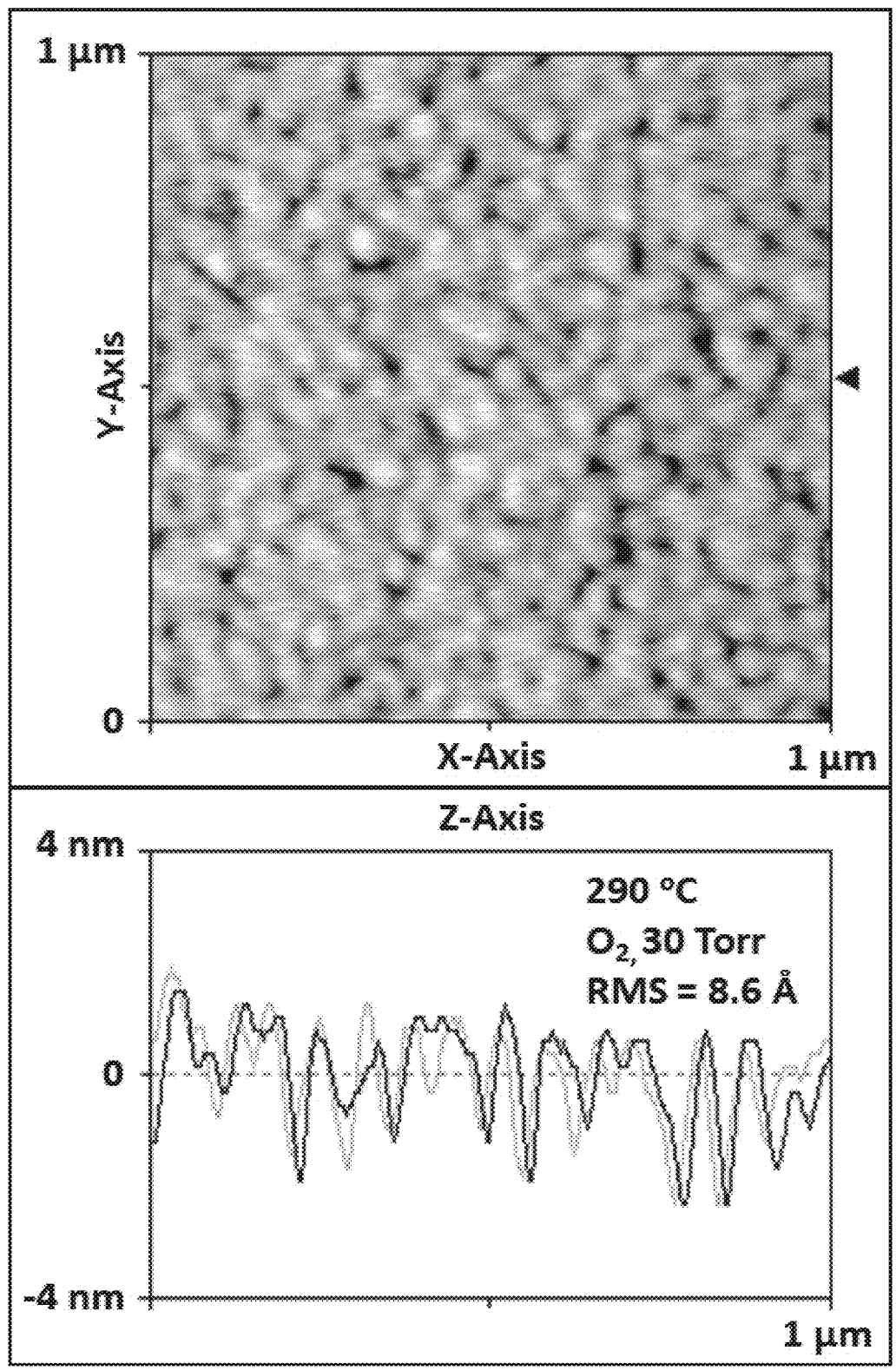

Torr (FIG. 46A) and O$_2$ pressures at 30 Torr (FIG. 46B). RMS was 2.0 Å with O$_2$ pressure at 250 Torr and 8.6 Å with O$_2$ pressure at 30 Torr.

Figure 47:
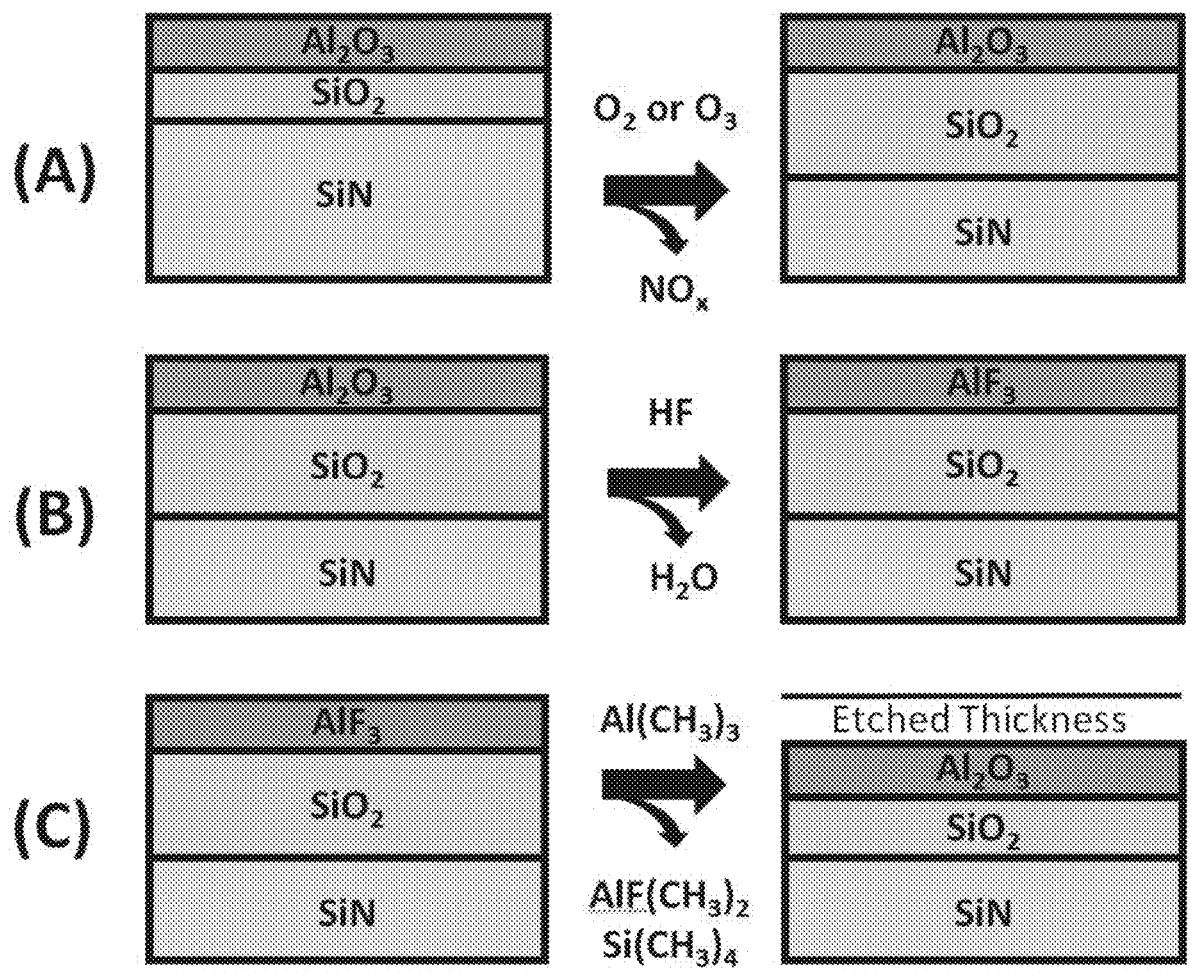

FIG. 47 is a schematic for thermal SiN ALE based on (A) oxidation by O$_2$; (B) fluorination by HF; and (C) ligand-exchange and conversion by Al(CH$_3$)$_3$.

Figure 48:
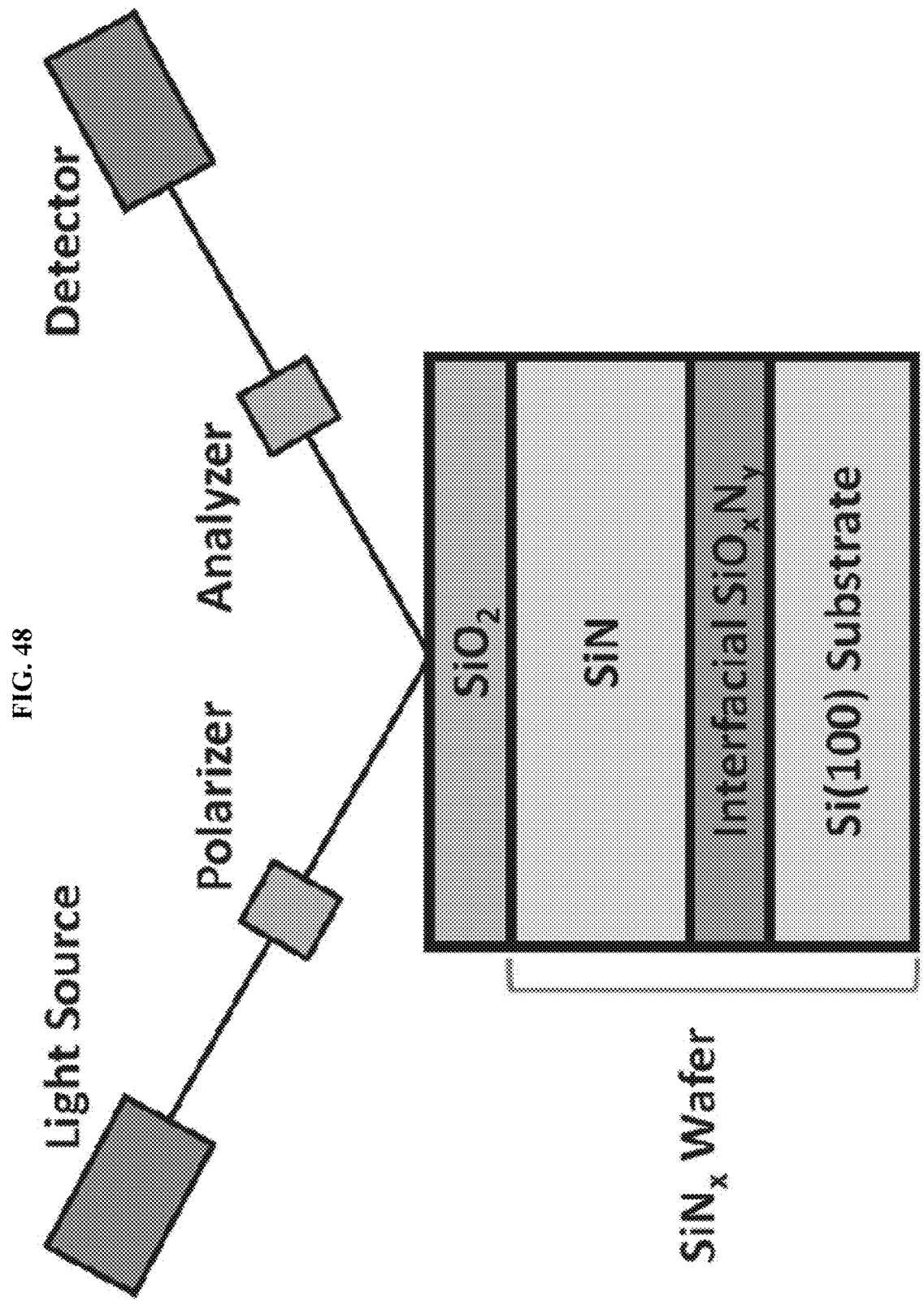

FIG. 48 is a schematic of an ellipsometer beam interacting with a film stack on a SiN$_x$ wafer. The stack was comprised of a SiO$_2$ layer, a SiN layer, a SiO$_x$N$_y$ buried layer, and an underlying Si substrate.

Figure 49:
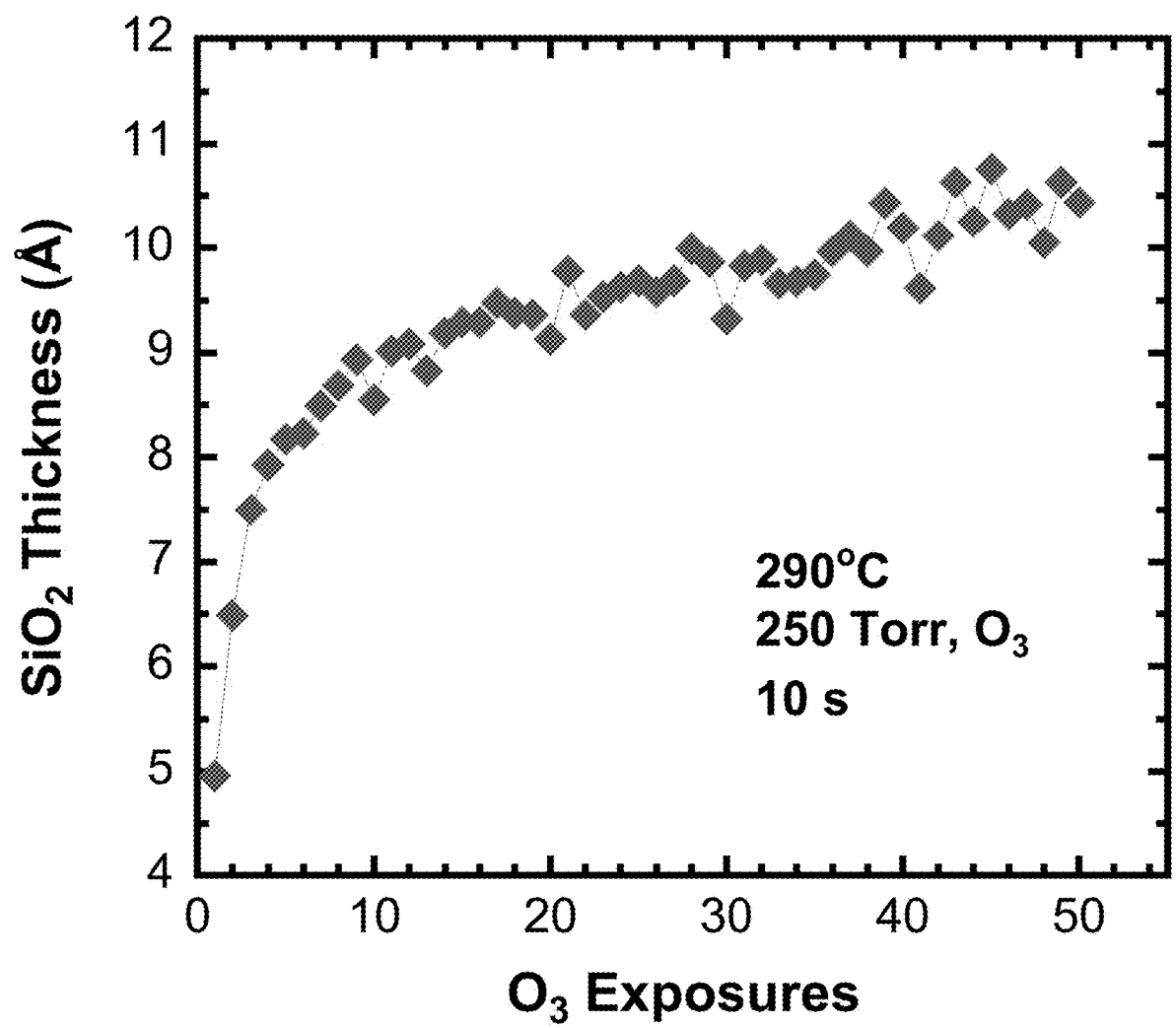

FIG. 49 is a graph showing growth of SiO$_2$ on the surface of a SiN wafer after exposure to oxone. The graph shows thickness versus the number of ozone (O$_3$) exposures at 250 Torr and 290° C., wherein each exposure was 10 seconds.

Figure 50A:
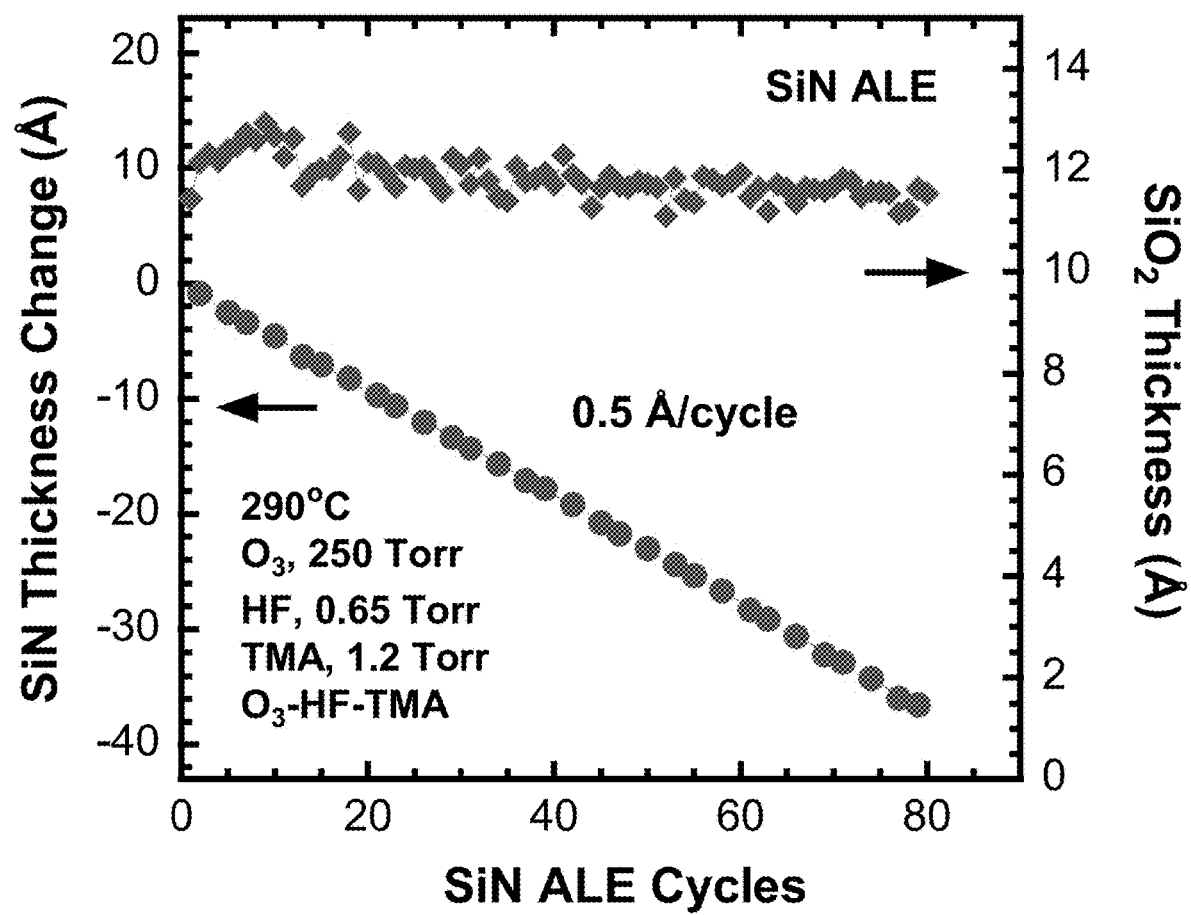
Figure 50B:
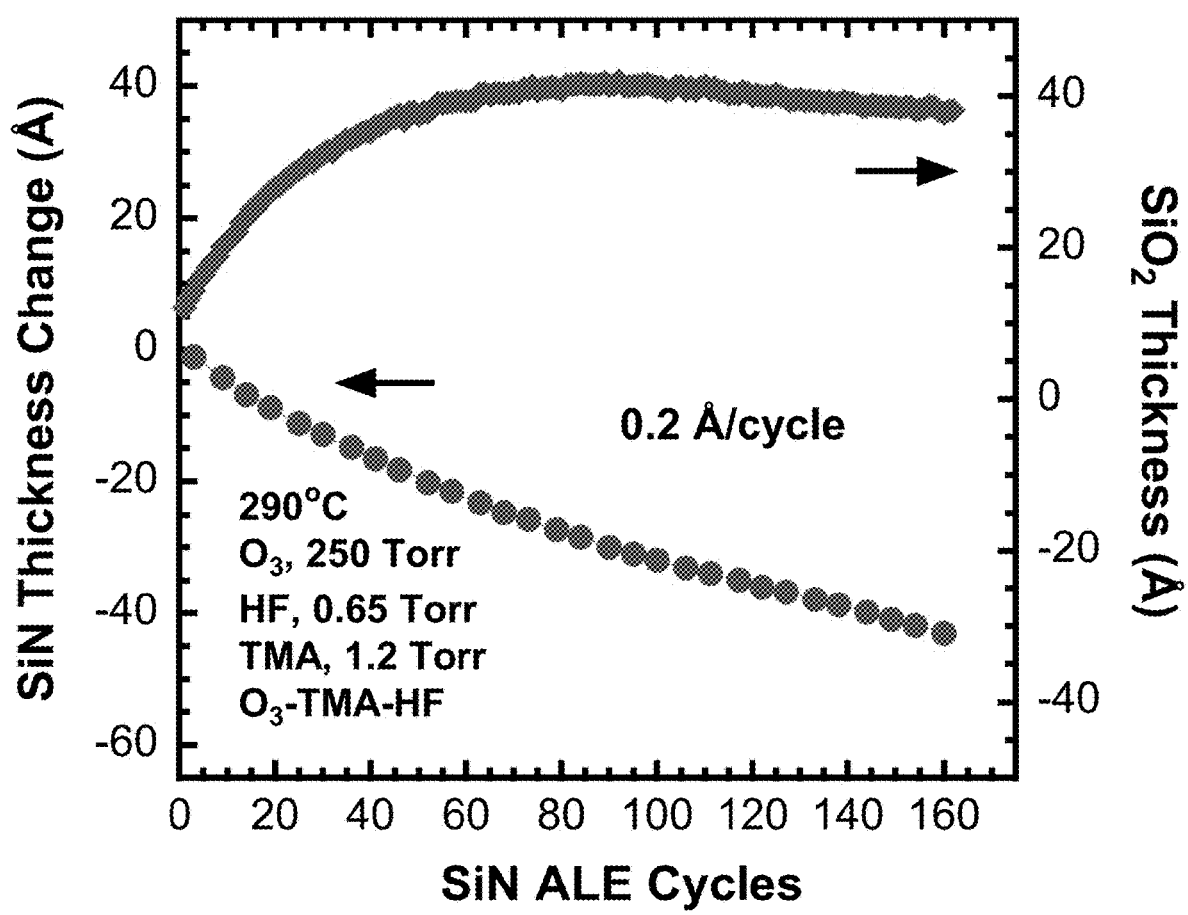

FIGS. 50A-50B are graphs showing SiO$_2$ thickness and SiN thickness change versus the number of SiN ALE cycles for the O$_3$—HF-TMA (FIG. 50A) and O$_3$-TMA-HF (FIG. 50B) exposure sequences at 290° C.

Figure 51A:
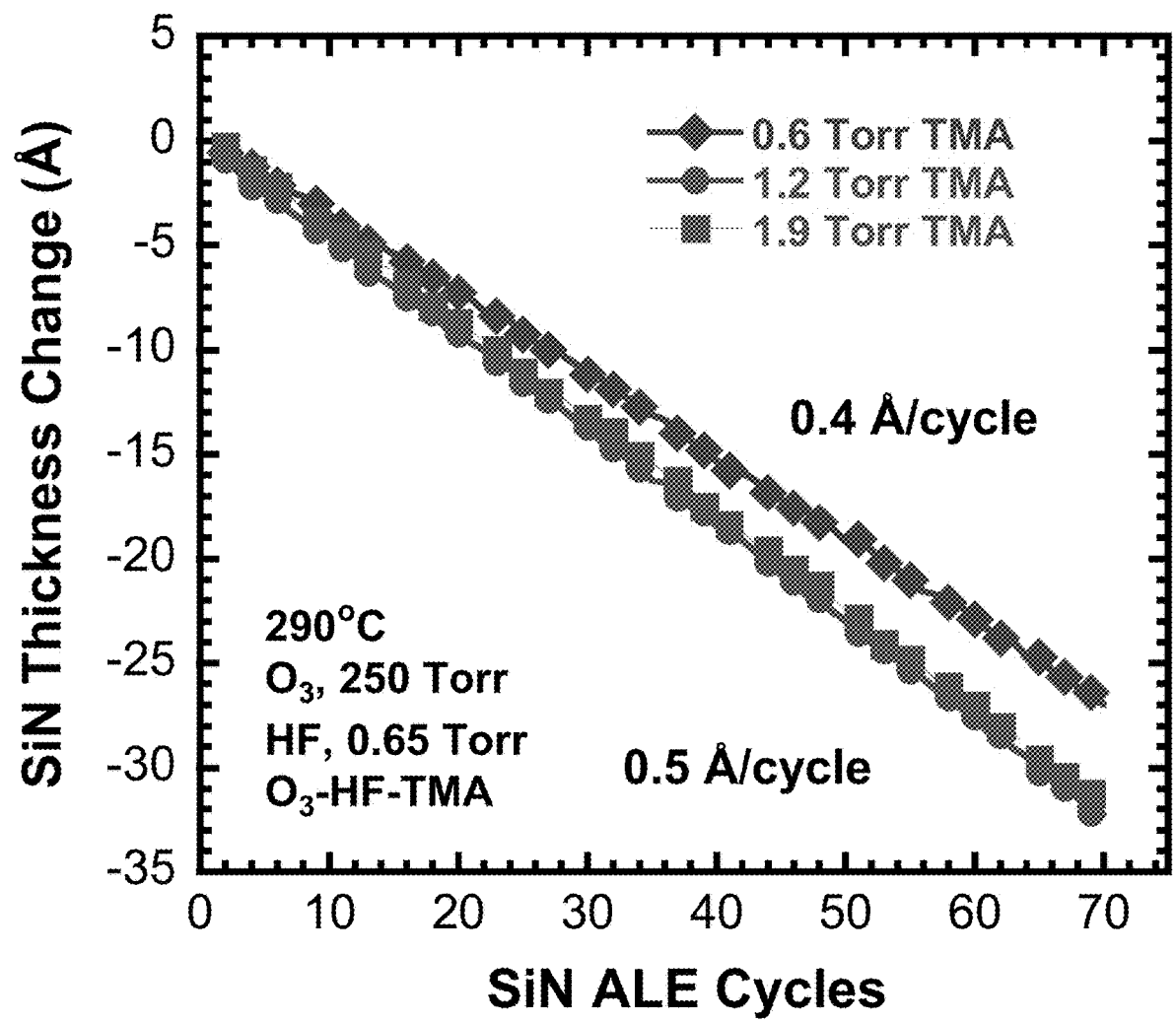
Figure 51B:
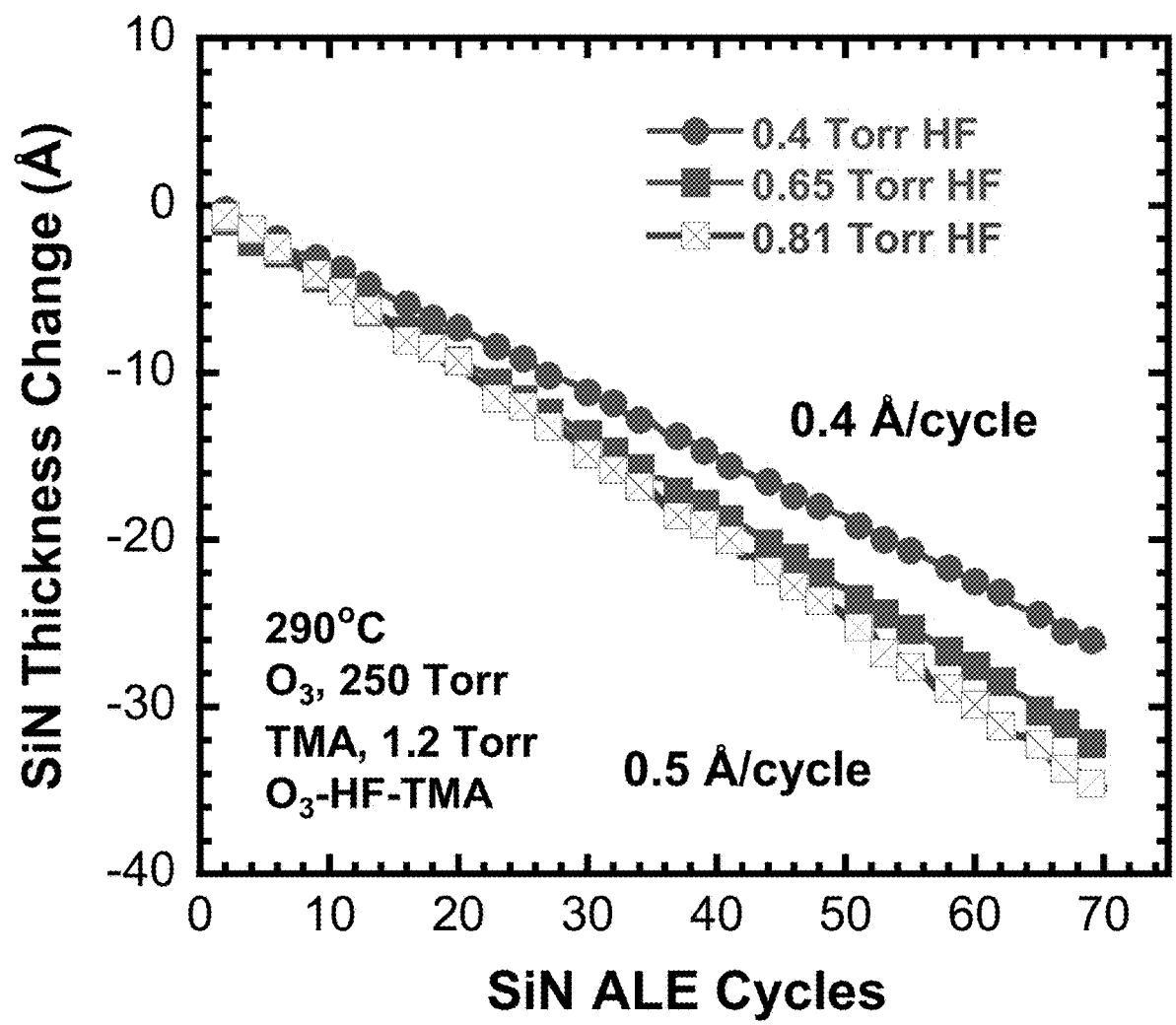

FIGS. 51A-51B are graphs showing change in SiN thickness change versus the number of SiN ALE cycles for the O$_3$—HF-TMA exposure sequence at 290° C. at various TMA pressures (FIG. 51A) and various HF pressures (FIG. 51B).

Figure 52:
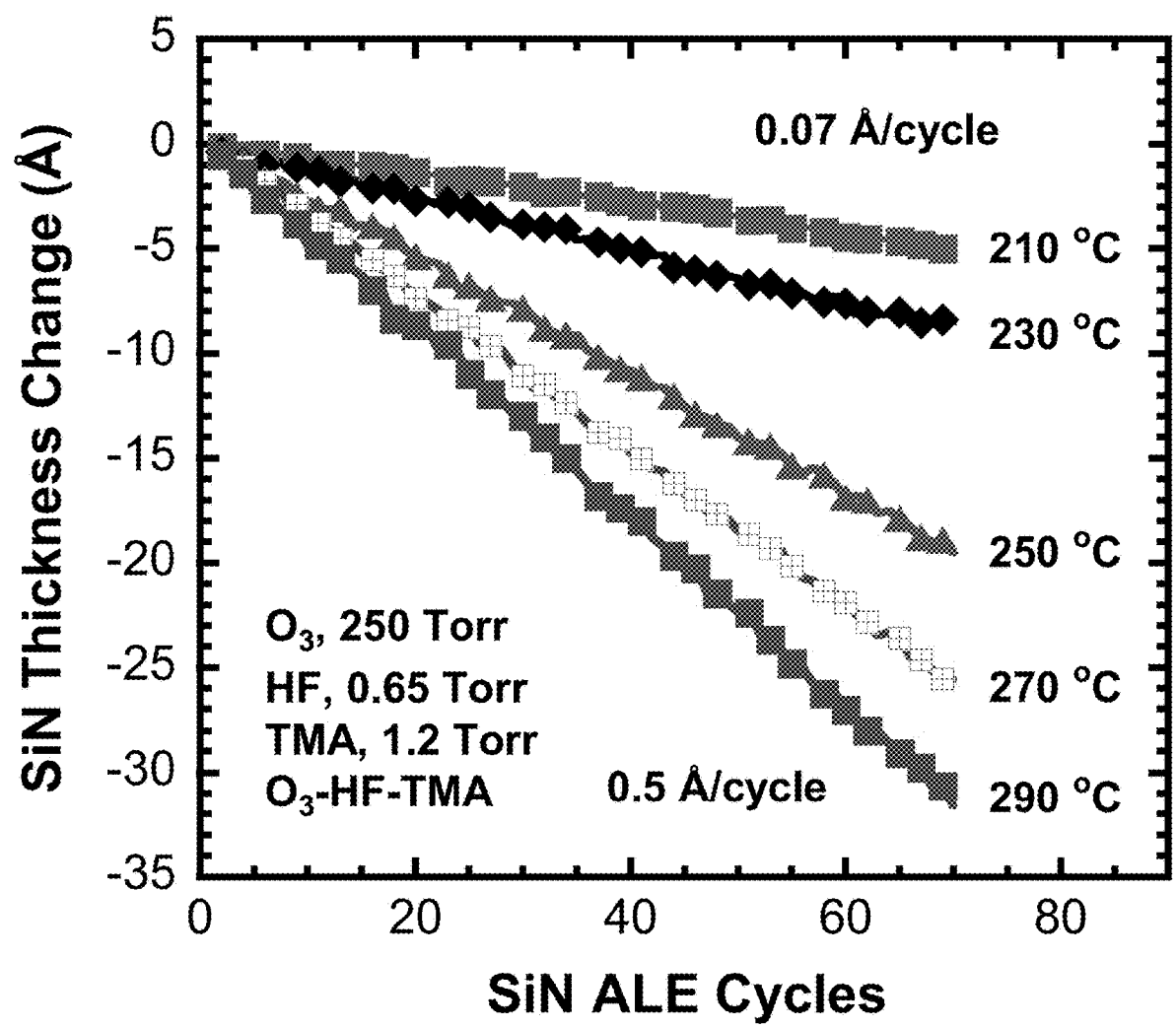

FIG. 52 is a graph change in SiN thickness change versus the number of SiN ALE cycles for the O2-HF-TMA exposure sequence at various temperatures.

Figure 53A:
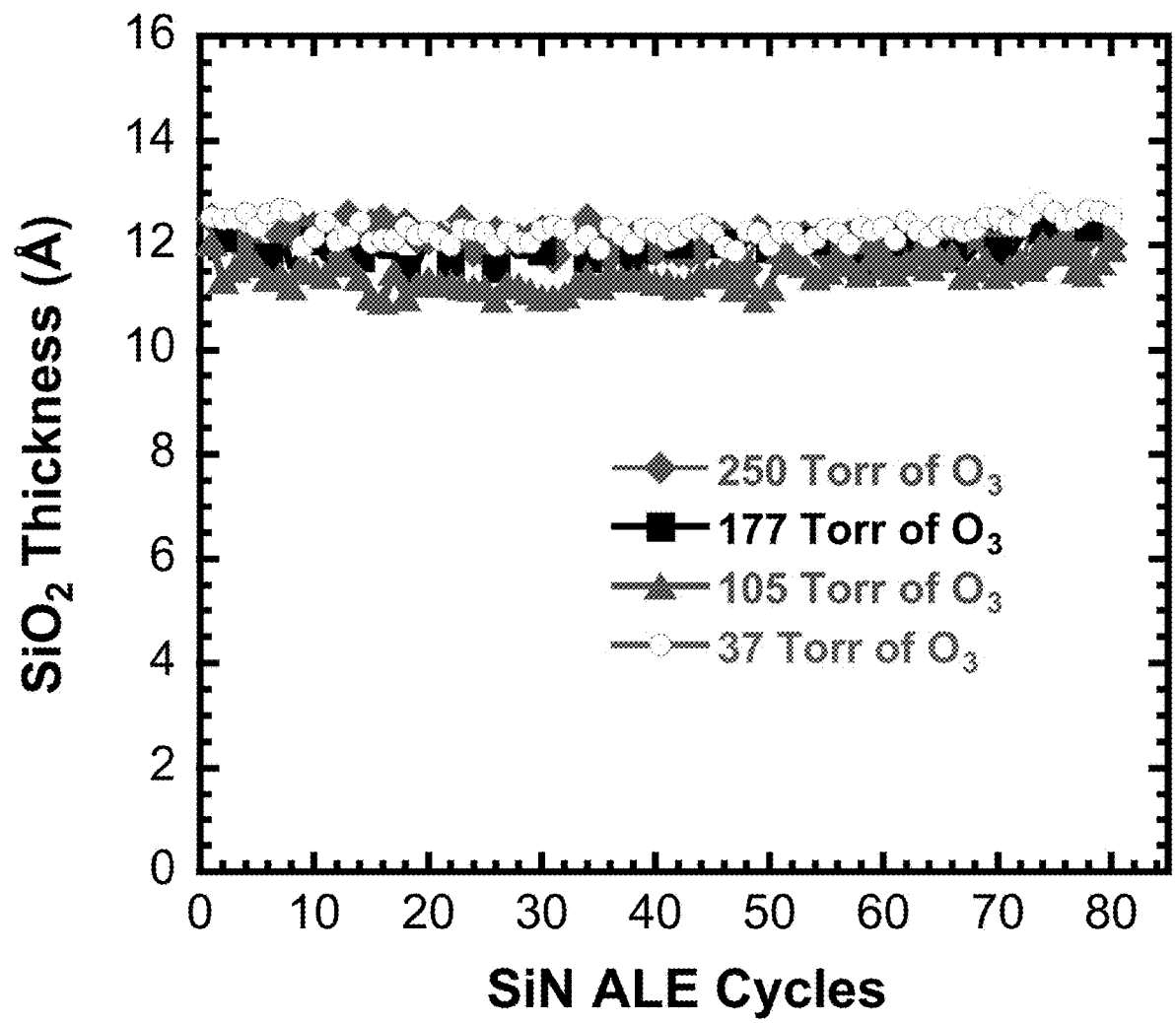
Figure 53B:
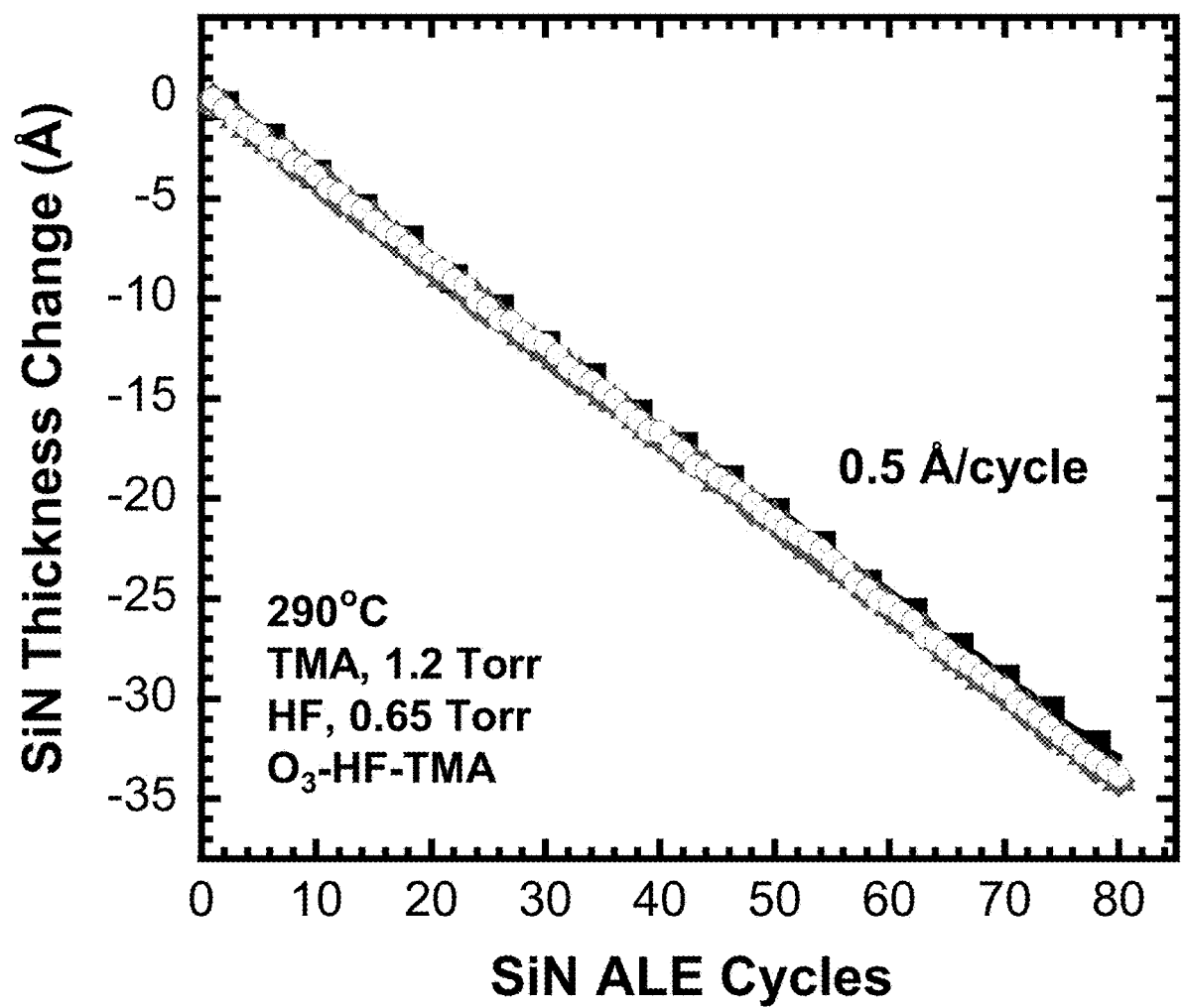

FIGS. 53A-53B are graphs showing SiO$_2$ thickness (FIG. 53A) and SiN thickness change (FIG. 53B) versus the number of SiN ALE cycles at various ozone pressures.

Figure 54A:
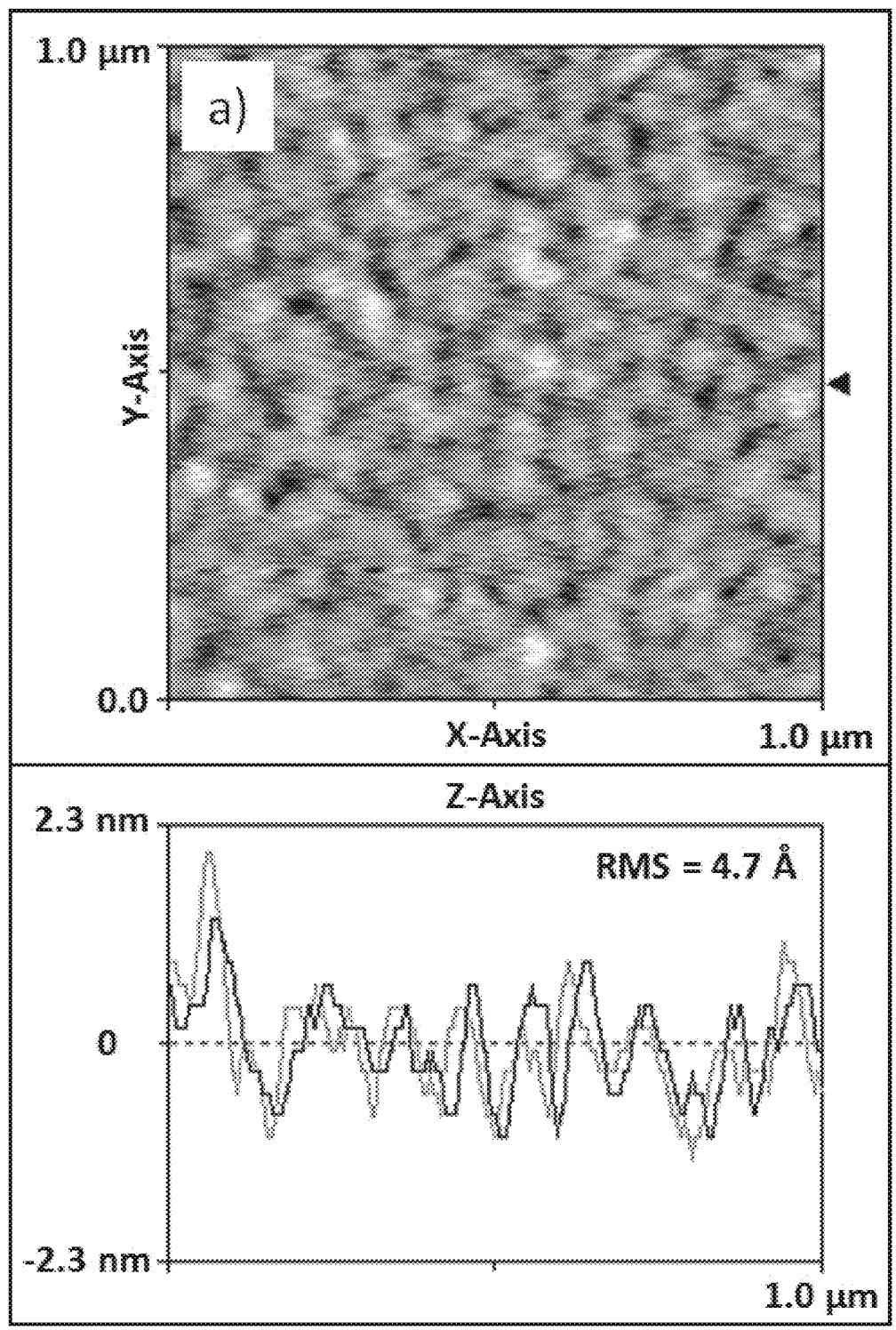
Figure 54B:
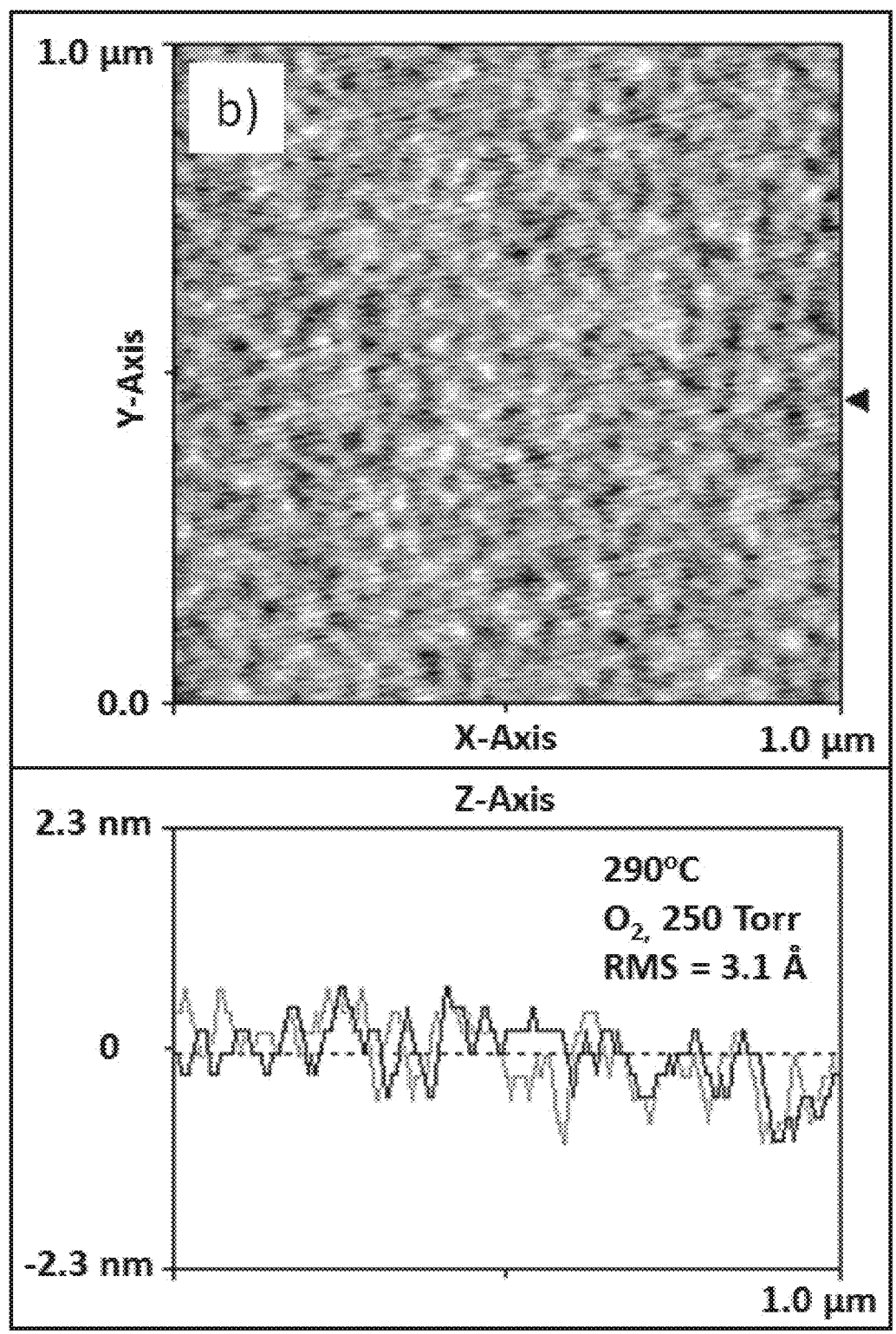

FIGS. 54A-54B are a set of AFM images and graphs of SiN wafers before (FIG. 54A) and after 80 cycles of SiN ALE (FIG. 54B) using the O$_2$—HF-TMA exposure sequence at 290° C. Static reactant pressures for O$_3$, HF and TMA were 250, 0.65 and 1.2 Torr, for 10, 5 and 5 s, respectively.

Figure 55:
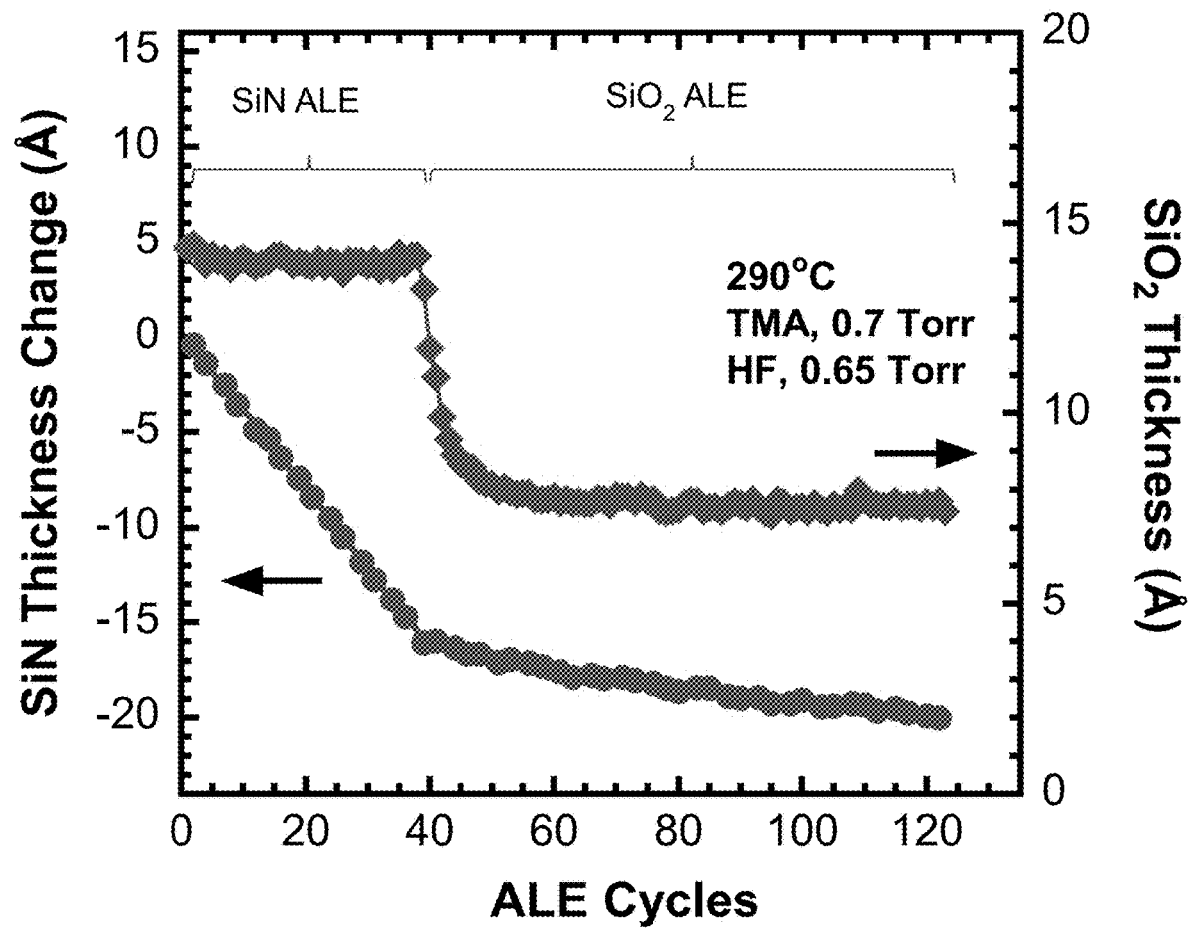

FIG. 55 is a graph showing the removal of a surface oxide layer from SiN using SiO$_2$ ALE at 290° C. with TMA and HF after 40 initial SiN ALE cycles using the O$_3$—HF-TMA exposure sequence at 290° C.

Figure 56:
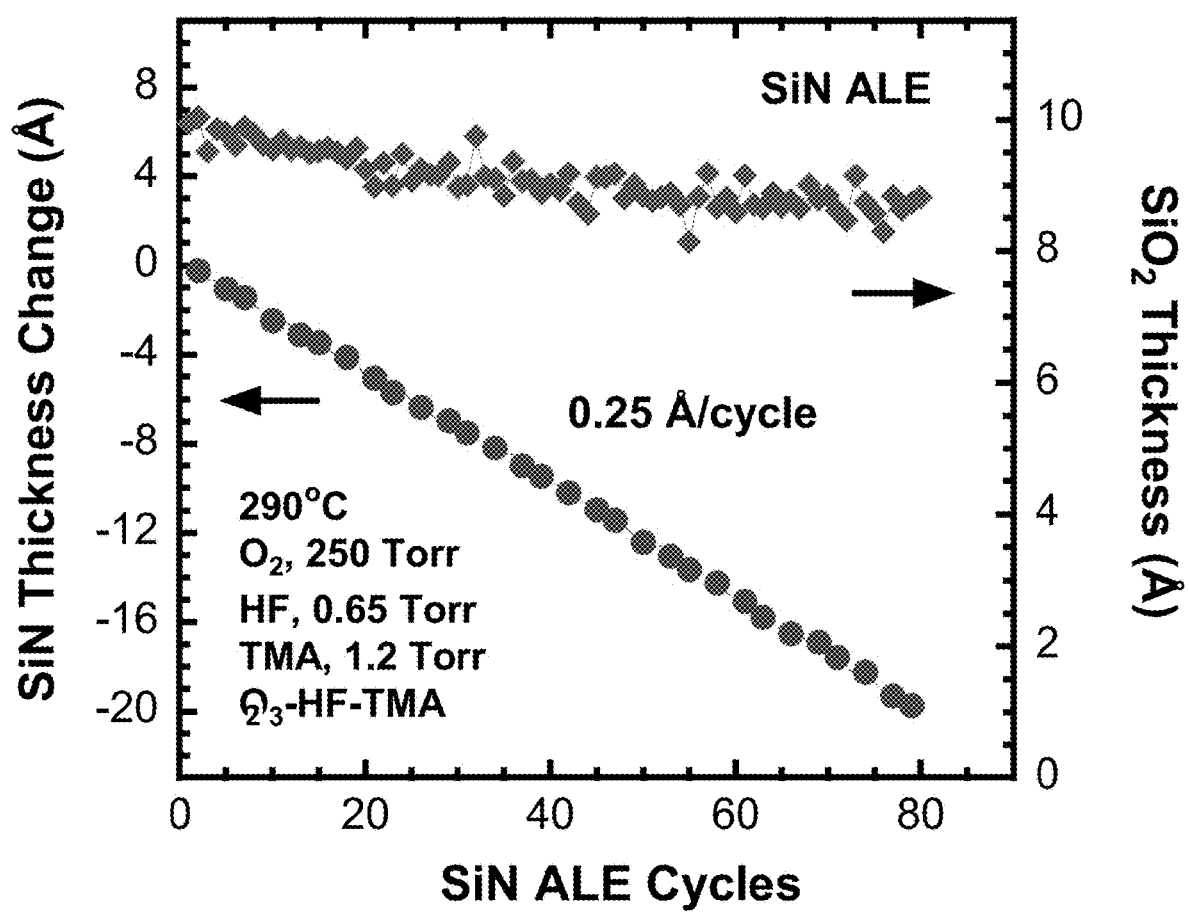

FIG. 56 is a graph showing SiO$_2$ thickness and SiN thickness change versus the number of SiN ALE cycles using a O$_2$—HF-TMA exposure sequence at 290° C. and an O$_2$ pressure of 250 Torr.

Figure 57:
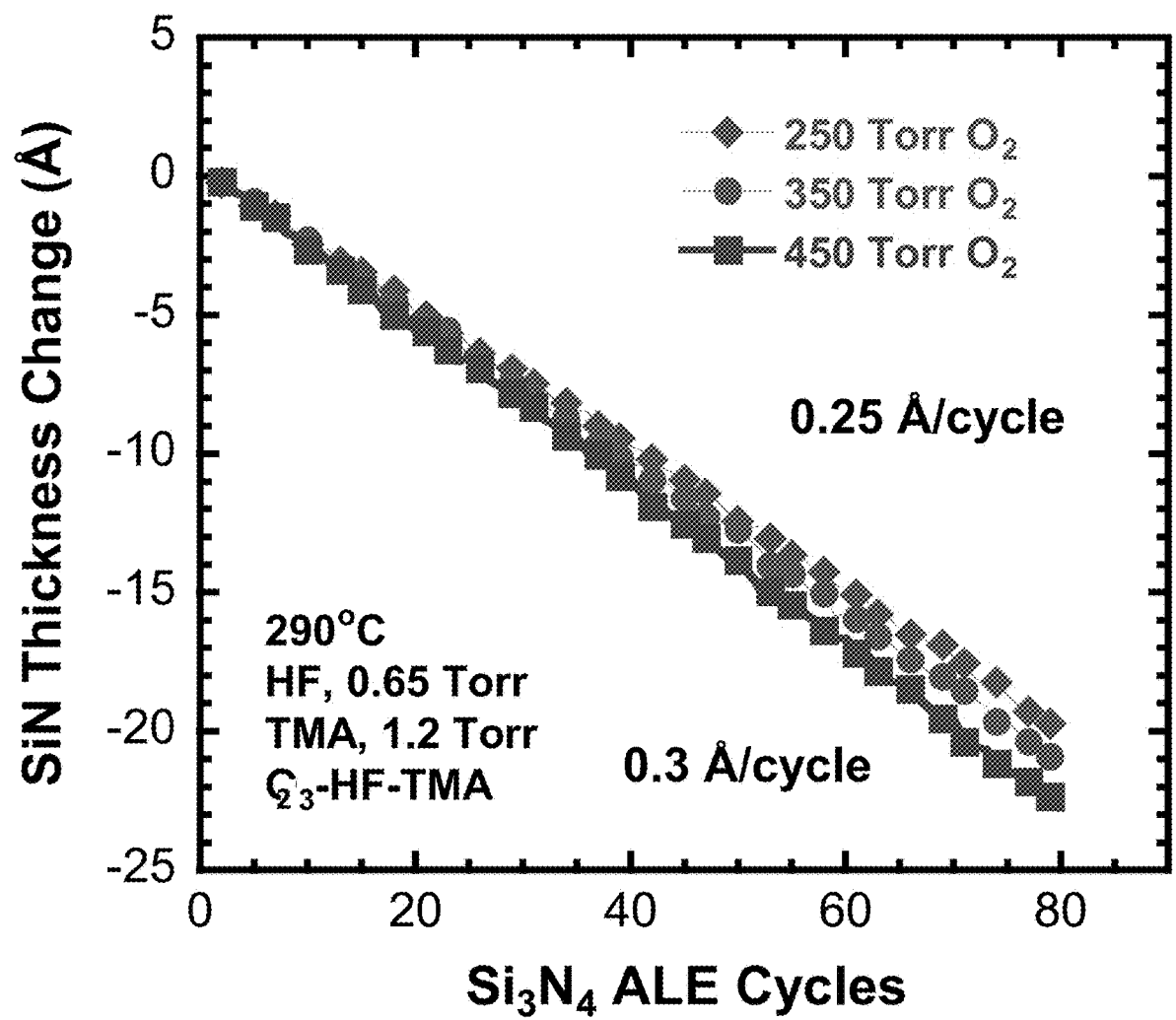

FIG. 57 is a graph showing SiN thickness change versus the number of SiN ALE cycles using a O$_2$—HF-TMA exposure sequence at 290° C. and a range of O$_2$ pressures.

Figure 58:
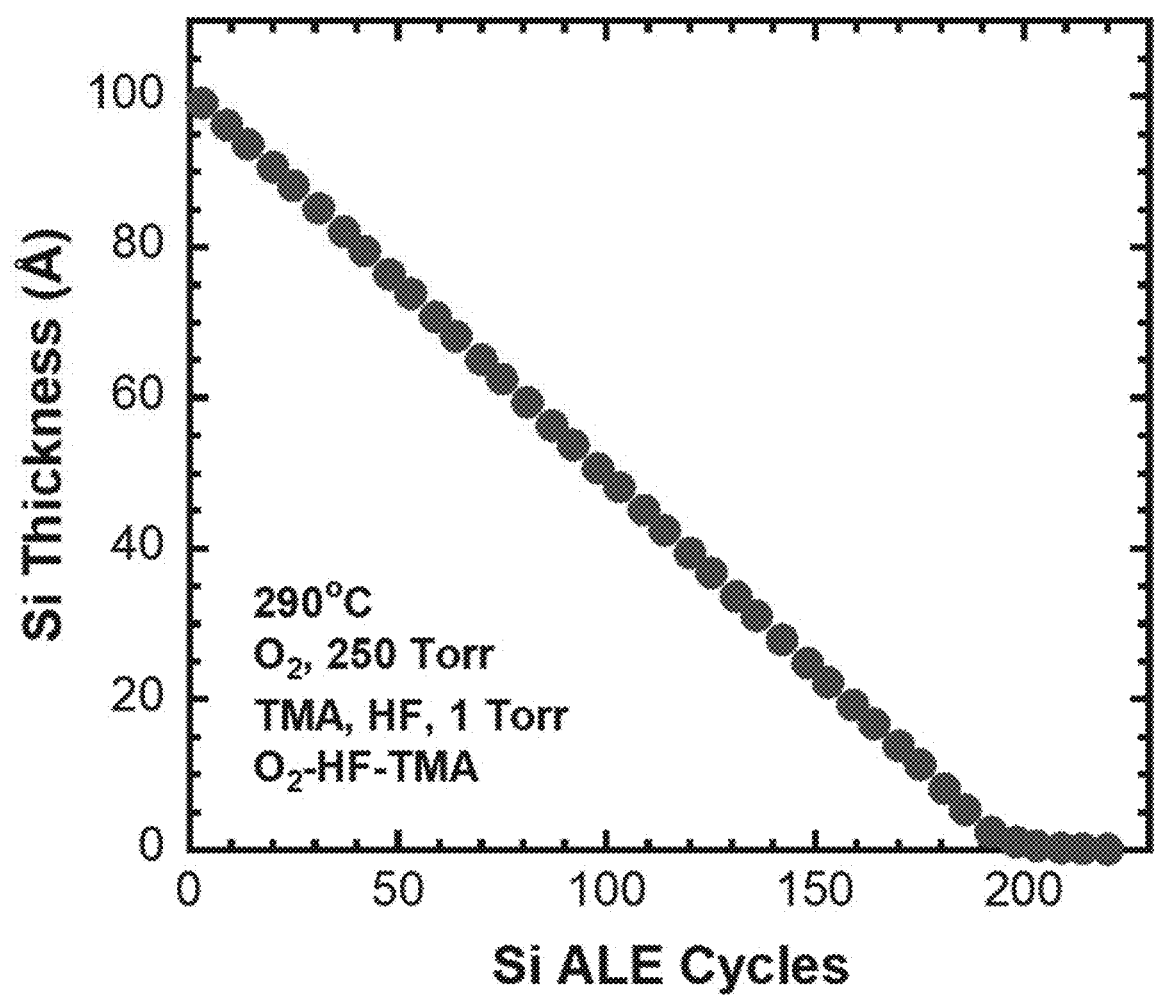

FIG. 58 is a graph showing Si thickness versus number of Si ALE cycles during Si ALE at 290° C. Si ALE was performed on an ultrathin silicon film with an initial thickness of 100 Å on the SiO$_2$ film of an SOI wafer.

Figure 59:
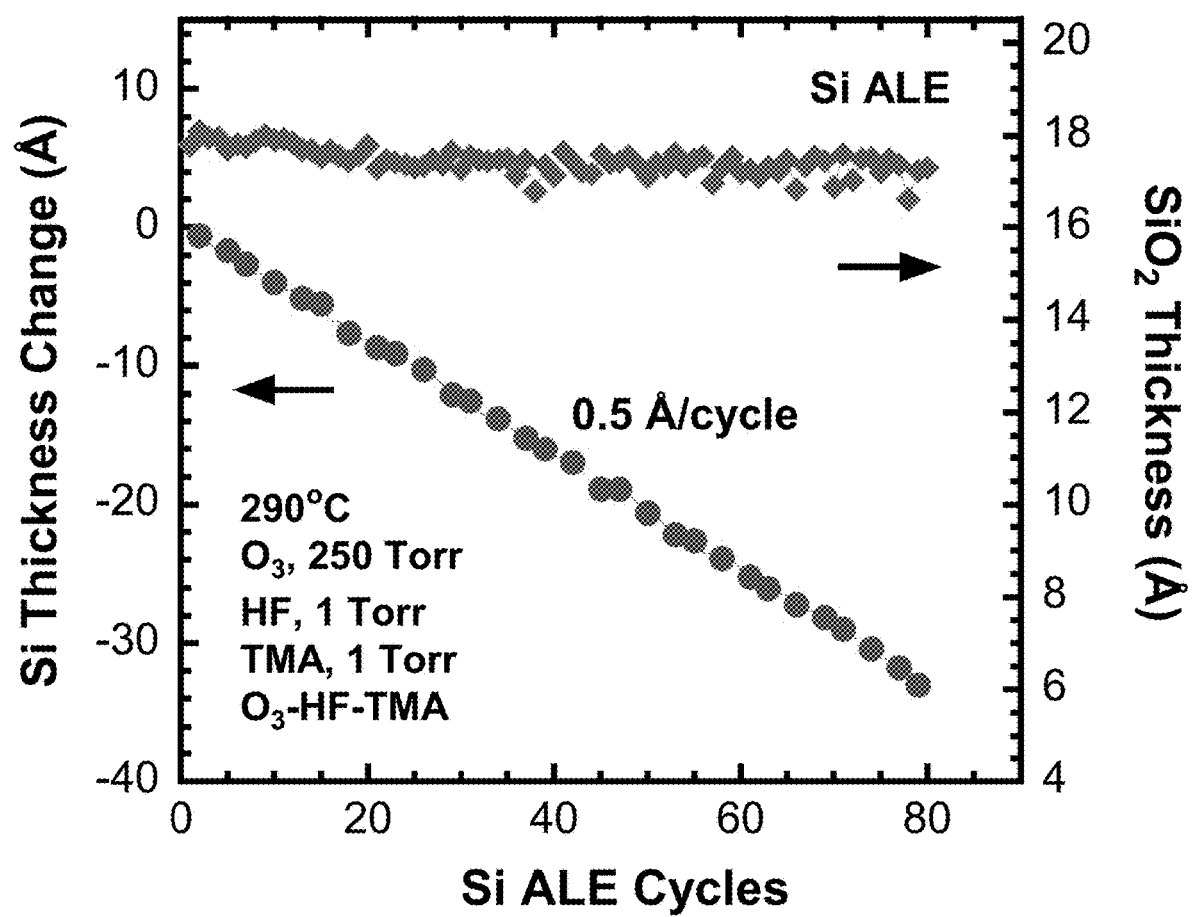

FIG. 59 is a graph of the change in Si thickness and SiO$_2$ film thickness versus number of Si ALE cycles during thermal Si ALE using sequential exposures of O$_3$, HF and TMA at 290° C.

Figure 60A:
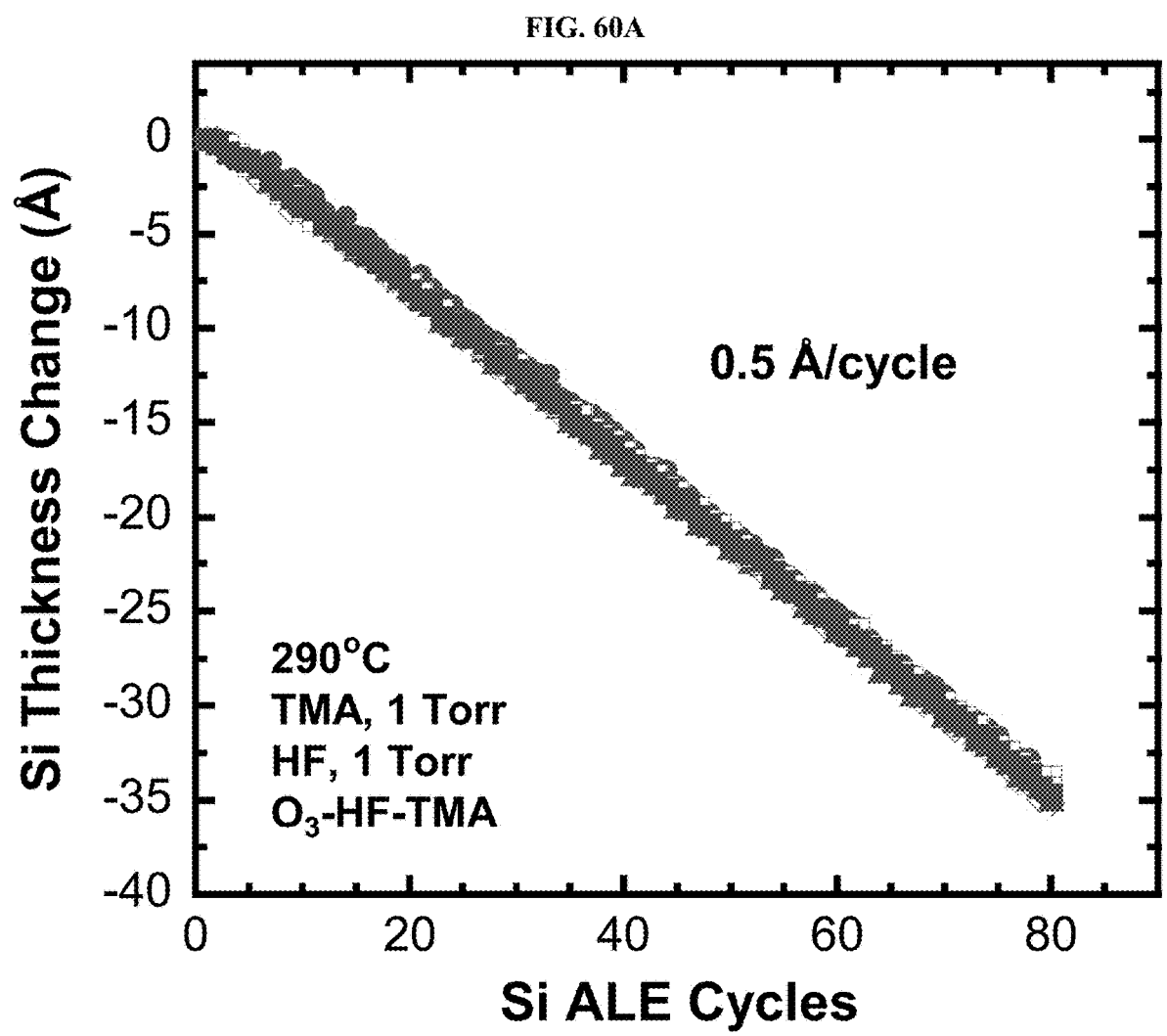
Figure 60B:
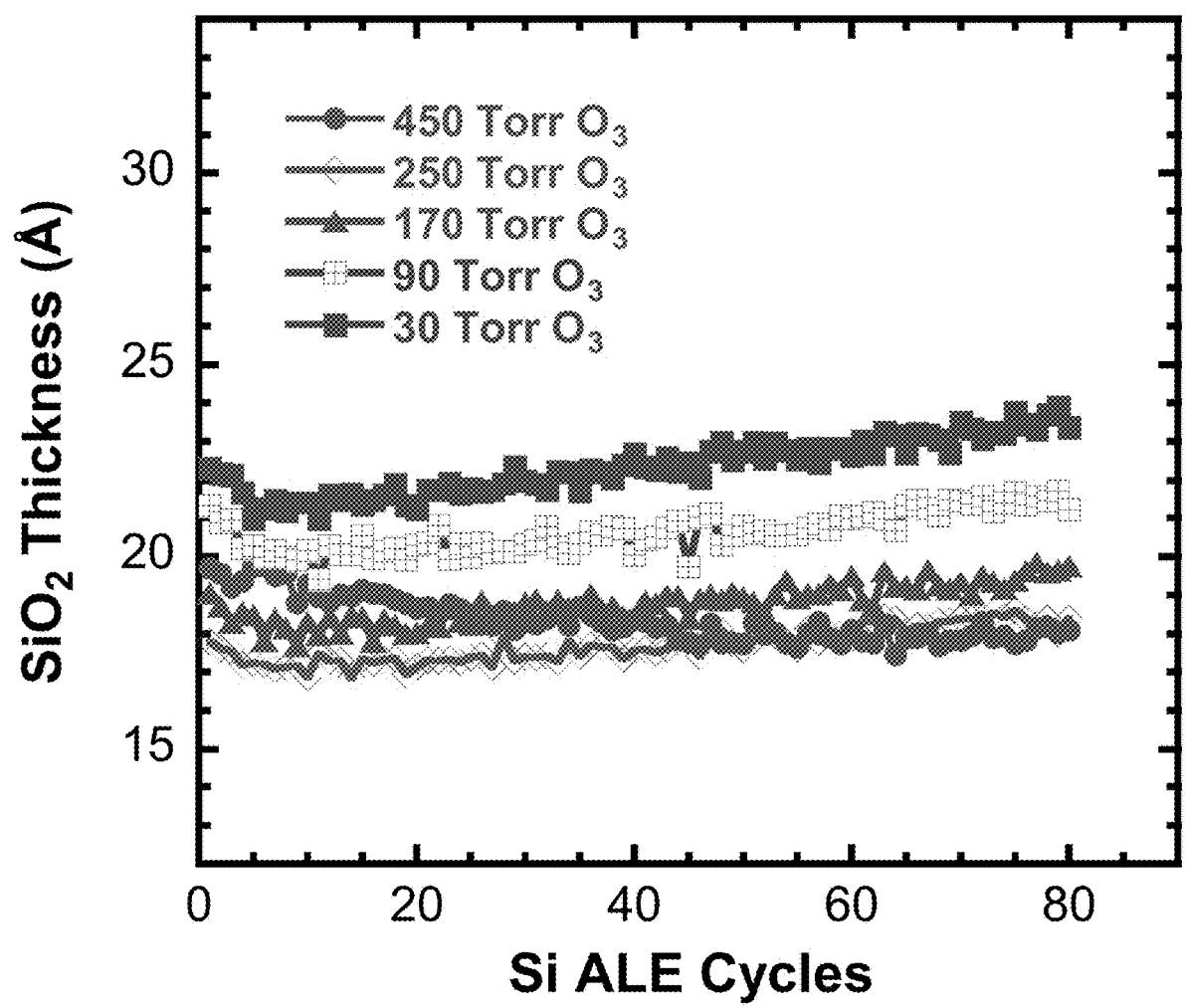

FIGS. 60A-60B are graphs showing Si thickness change (FIG. 60A) and SiO$_2$ thickness (FIG. 60B) versus the number of Si ALE cycles for various O$_3$ pressures during Si ALE at 290° C., using the O$_3$—HF-TMA exposure sequence.

Figure 61:
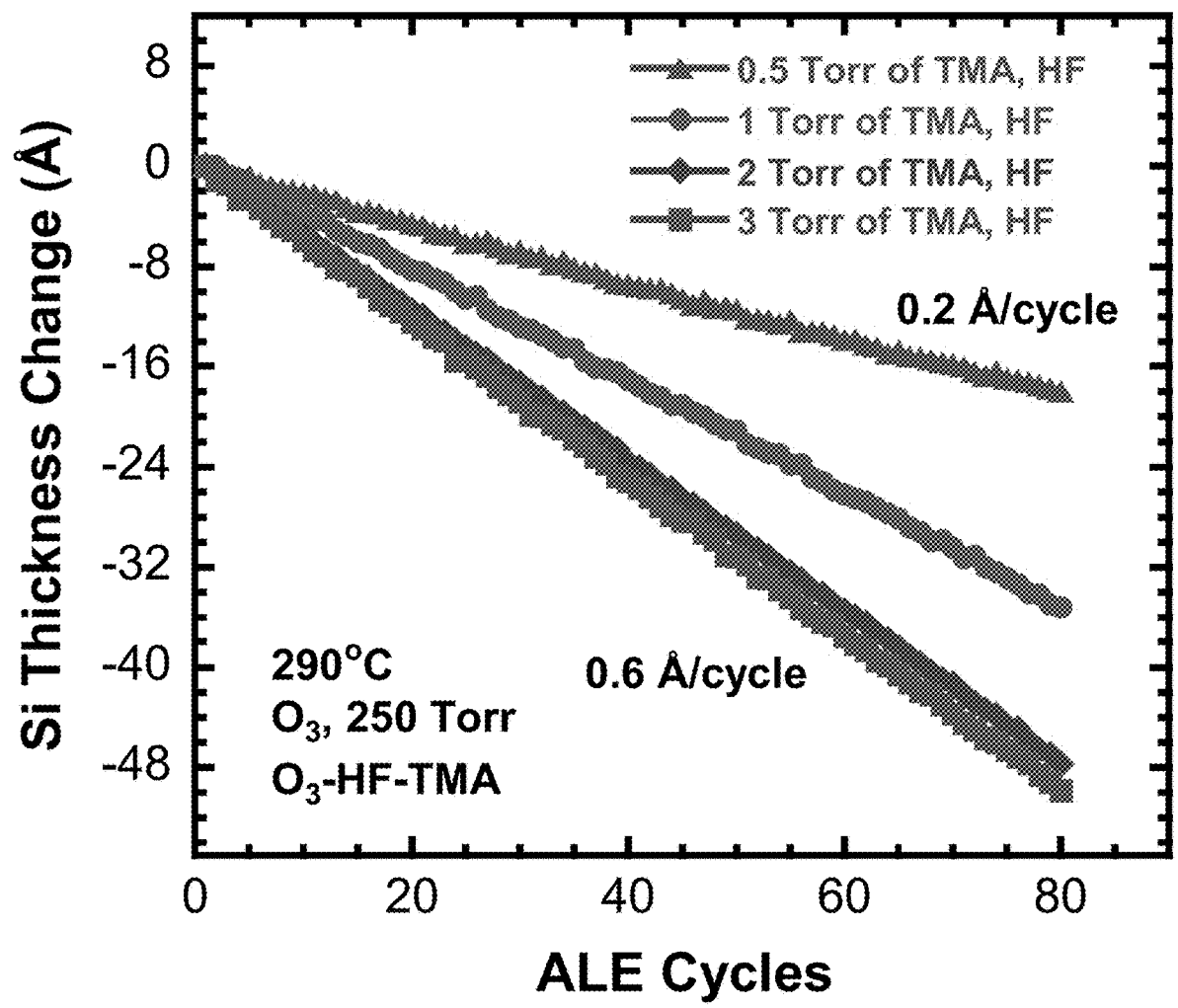

FIG. 61 is a graph showing the change in Si thickness versus number of Si ALE cycles for various TMA and HF pressures during Si ALE at 290° C., using the O$_3$—HF-TMA exposure sequence.

Figure 62:
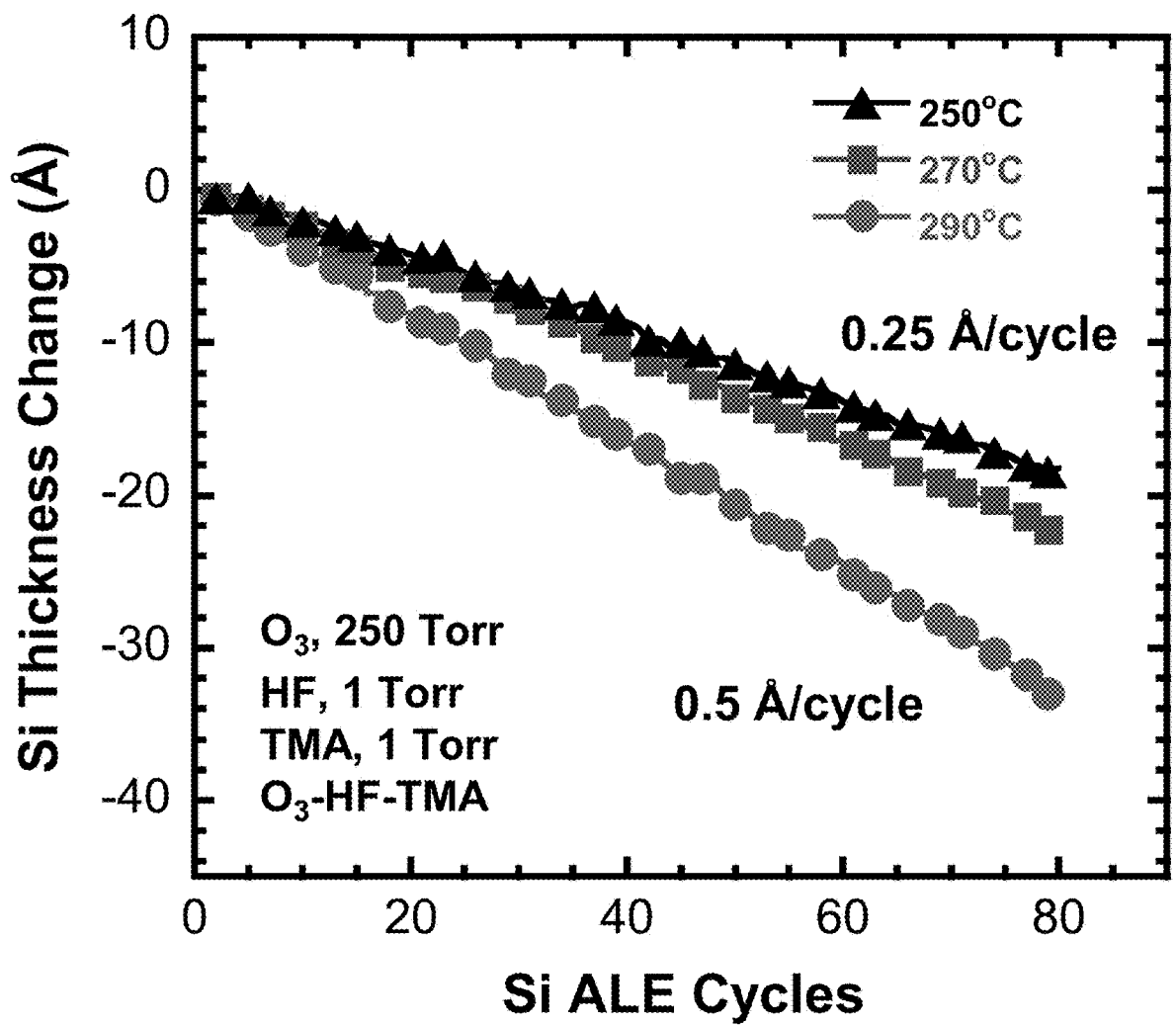

FIG. 62 is a graph showing the change in Si thickness versus the number of Si ALE cycles during Si ALE at 290, 270, and 250° C. Si ALE was performed using the O$_3$—HF-TMA exposure sequence.

Figure 63A:
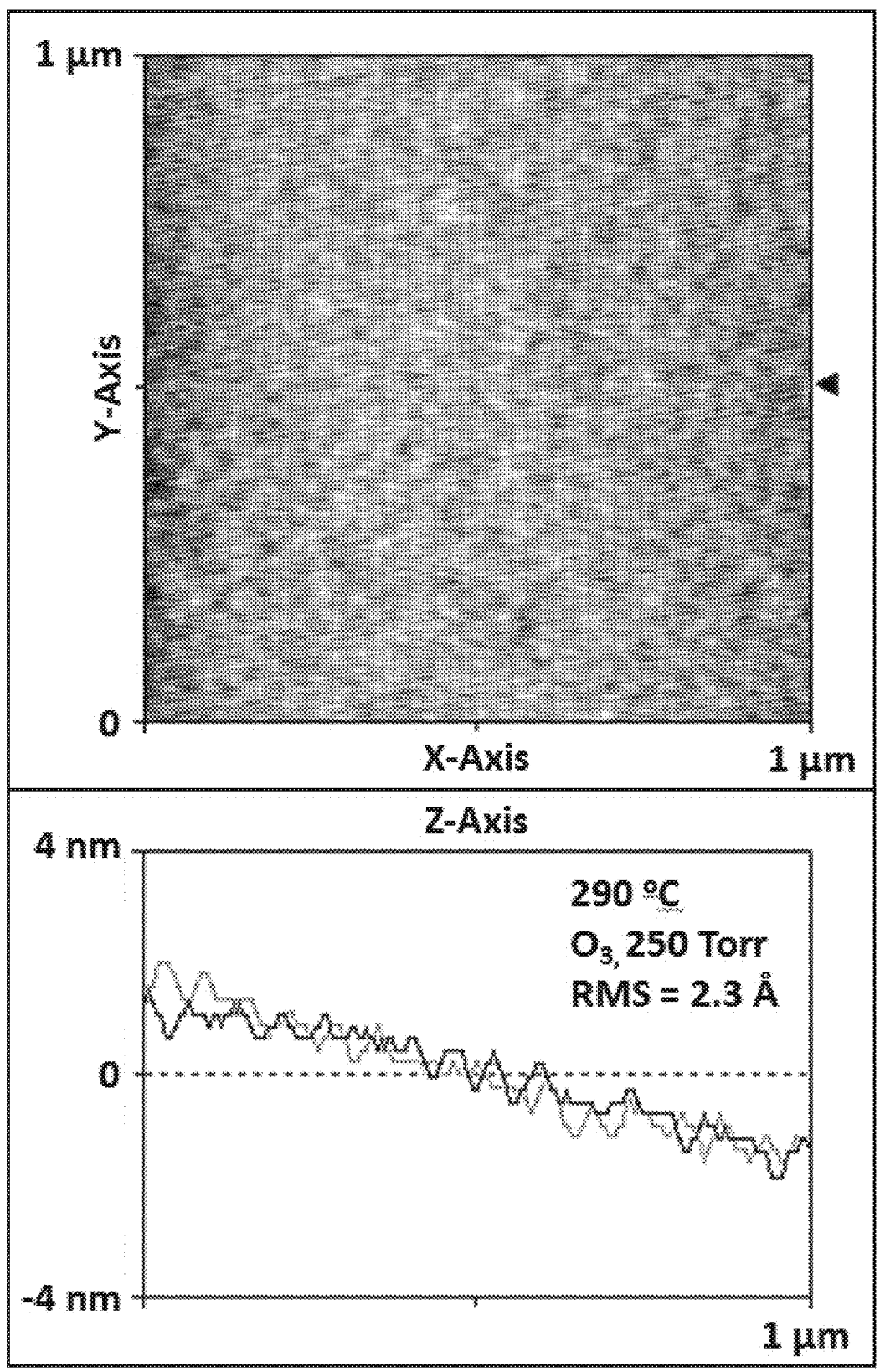
Figure 63B:
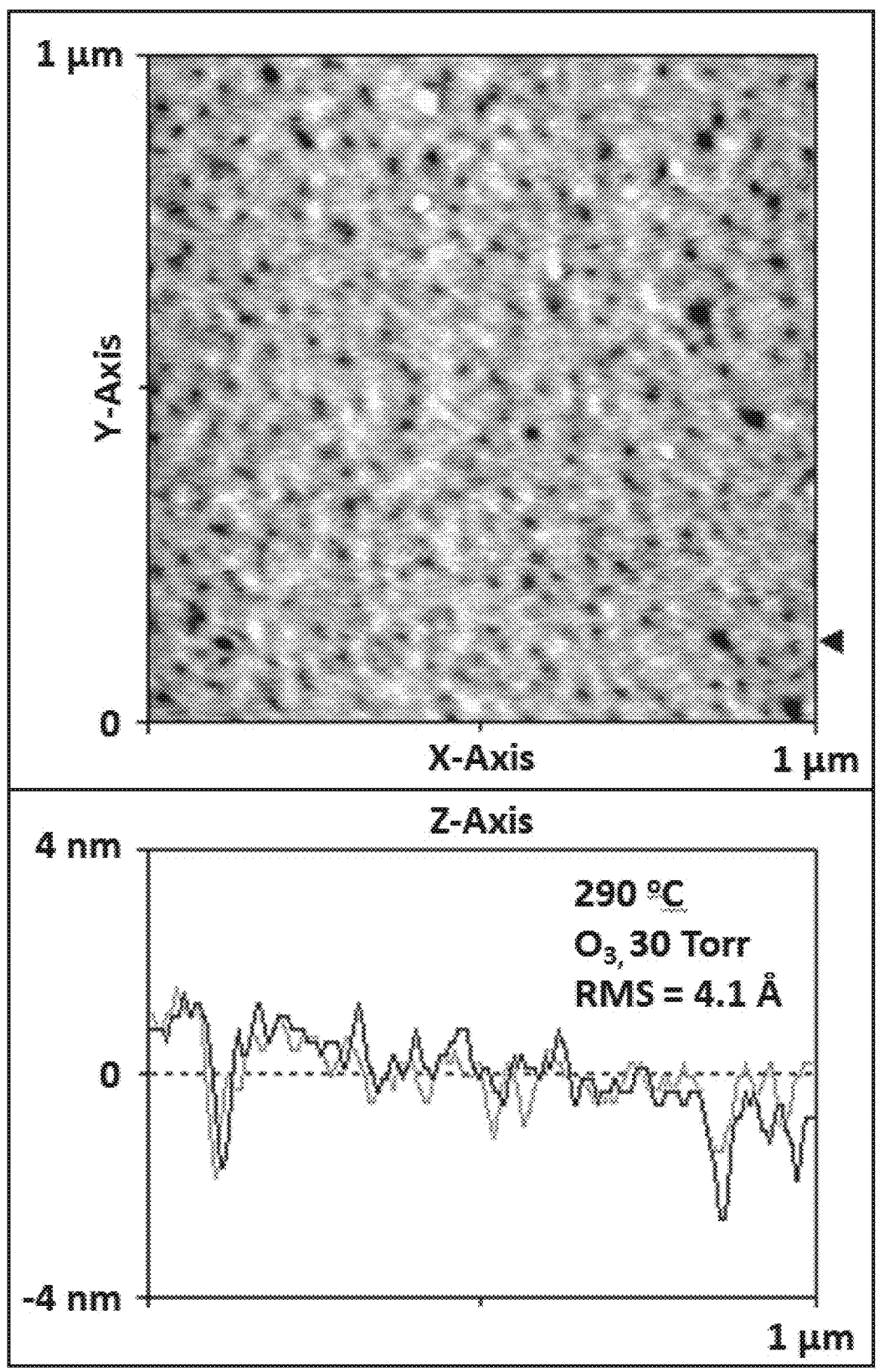

FIGS. 63A-63B are a set of AFM images and graphs of SOI wafers after 100 cycles of Si ALE using the O$_3$—HF-TMA exposure sequence at 290° C. with O$_3$ pressures at 250 Torr (FIG. 63A) and O$_3$ pressures at 30 Torr (FIG. 63B). RMS surface roughness was 2.0 Å with O$_3$ pressure at 250 Torr and 8.6 Å with O$_3$ pressure at 30 Torr.

Figure 64:
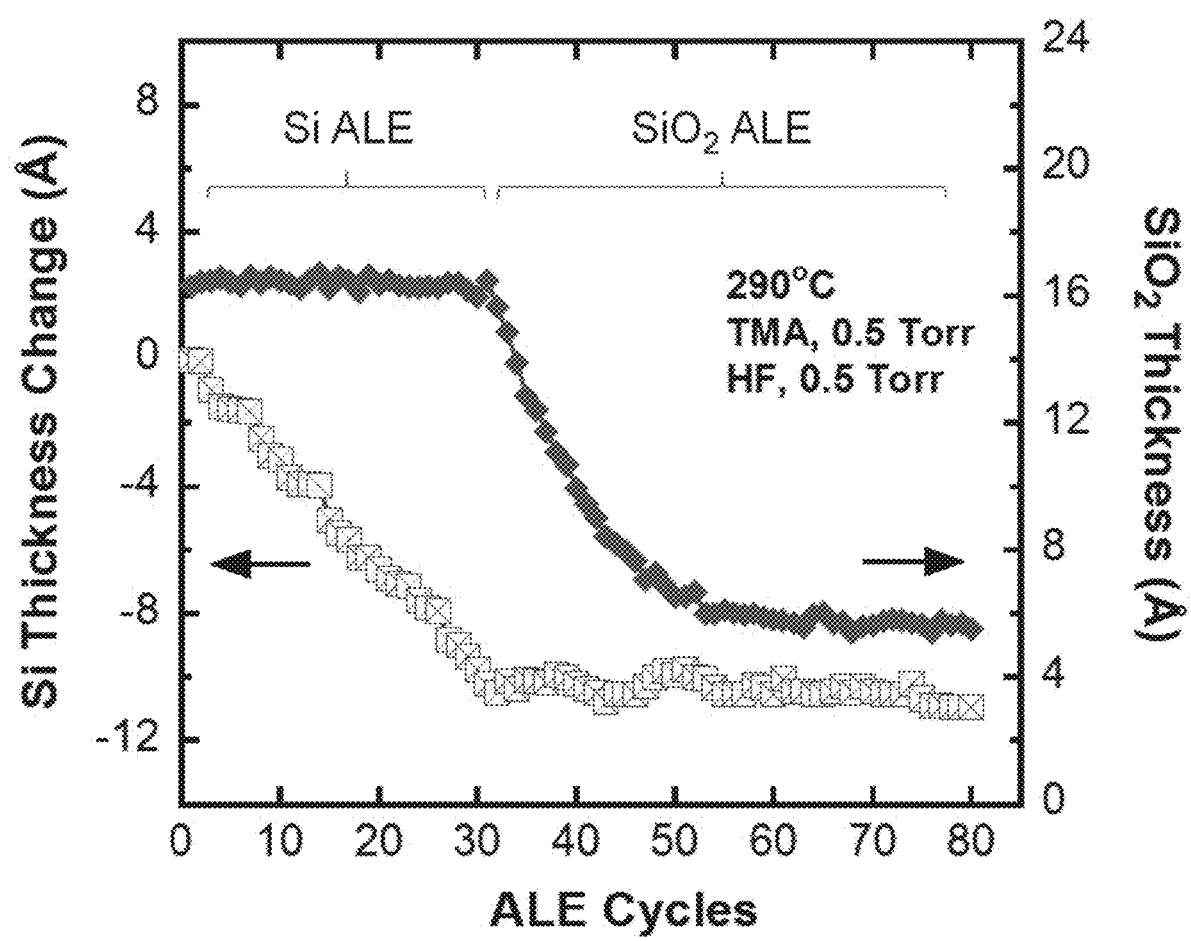

FIG. 64 is a graph showing the removal of the surface oxide from Si using SiO$_2$ ALE at 290° C. with TMA and HF as the precursors after 35 initial Si ALE cycles using the O$_3$—HF-TMA exposure sequence at 290° C.

Figure 65:
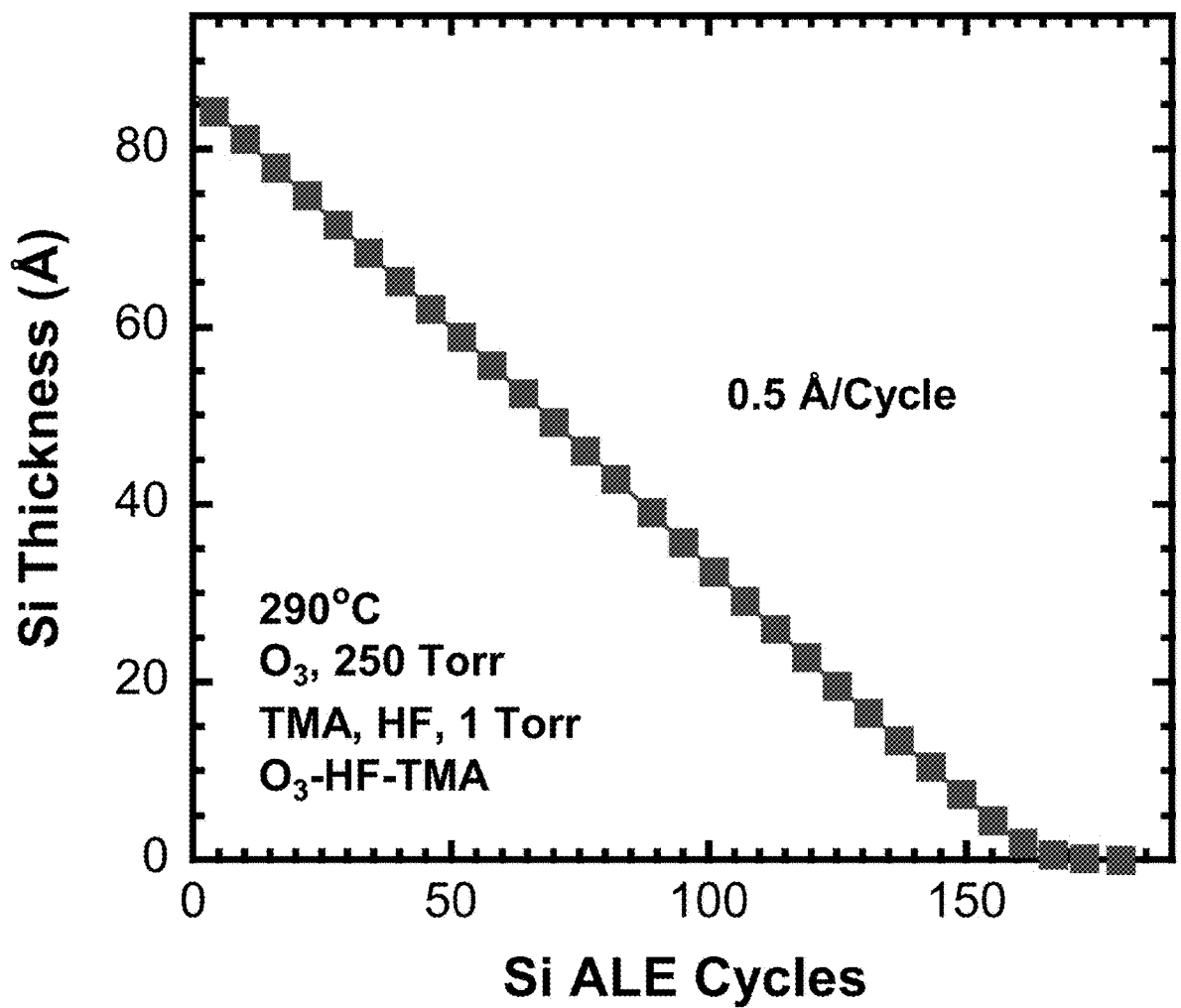

FIG. 65 is a graph showing Si thickness versus number of Si ALE cycles during Si ALE at 290° C. Si ALE was performed on an ultrathin silicon film with an initial thickness of 85 Å on the SiO$_2$ film of an SOI wafer.

DETAILED DESCRIPTION OF THE INVENTION

The present invention relates to the unexpected discovery of novel methods of promoting and/or enhancing atomic layer etching (ALE) of a surface using sequential, self-limiting thermal reactions with a metal precursor (which comprises a metal-ligand complex, such as, but not limited to, a metal monodentate ligand complex and/or a metal chelate, such as but not limited to a metal β-diketonate) and a halogen-containing gas.

In certain embodiments, species comprising one or more ligands that had been previously part of the metal precursor remain bound to and/or adsorbed onto the surface during the ALE process, reducing the overall etching rate. In other embodiments, treating the surface with certain agents, such as but not limited to radicals, ions, photons and/or electrons, removes at least a portion of these residual ligand-containing species from the surface, enhancing the overall etching rate.

In certain embodiments, the sequential reactions are self-limiting. In other embodiments, the etch rates increase with temperature. In yet other embodiments, the etch rates are constant over several cycles. In yet other embodiments, the resulting etched surfaces are smooth.

As described herein in a non-limiting aspect (see, for example, Example 1), evaluation of an AlF$_3$ ALE reaction using Sn(acac)$_2$ and HF as the reactants indicated that the acac ligand was responsible for limiting the etching of the AlF$_3$ substrate. Therefore, removal of at least a fraction of the acac-containing species on the surface during the ALE process can increase the overall rate of the ALE process.

As described herein in a non-limiting aspect (see, for example, Example 2), evaluation of an Al$_2$O$_3$ ALE reaction using Sn(acac)$_2$ and HF as the reactants indicated that temperature dependence of the etching had an inverse correlation with the acac coverage on the surface. Thus, removal of at least a fraction of the residual acac (or a corresponding acac-containing species) that covers the surface during the ALE process should increase the overall rate of the ALE process.

In certain embodiments, the present invention allows for enhanced etch rates and/or lower operational temperatures for thermal ALE sequential reaction cycle(s). In other embodiments, the present invention allows for anisotropic etching.

Agents that are useful for removing residual surface-bound ligand(s) and/or ligand-containing species include, but are not limited to, radicals, ions, photons, electrons, catalysts and/or other molecular adsorbates.

In certain aspects, thermal ALE comprises two sequential, self-limiting surface reactions, which can be represented as an ABABAB . . . sequence. In certain embodiments, the agents useful for removing residual surface-bound and/or surface-adsorbed ligand(s) can be used within individual steps of the ABABAB . . . sequence. In other embodiments, the agents useful for removing residual surface-bound and/or surface-adsorbed ligand(s) can be used as a third separate step, C, in an ABCABC . . . sequence, for example.

In certain embodiments, the agent comprises a hydrogen, oxygen and/or nitrogen atom radical. Further examples of radicals comprise a sulfur, phosphorous, carbon, silicon, boron, fluoride, arsenide, telluride and/or selenide-containing radical. Non-limiting embodiments relating to this agent are illustrated in Example 3 recited elsewhere herein.

In certain embodiments, the agent comprises a photon. Non-limiting embodiments relating to this agent are illustrated in Example 4 recited elsewhere herein. In certain non-limiting embodiments, the surface is exposed to a plasma, such as a Ar plasma. The Ar plasma is not a source of radicals, but rather of $Ar^+$ and/or $Ar^{2+}$ Ions. In other non-limiting embodiments, the Ar plasma provides a photon (light) output, which helps remove residual surface-bound and/or surface-adsorbed ligand.

In certain embodiments, the agent comprises an ion. Non-limiting embodiments relating to this agent are illustrated in Example 3 recited elsewhere herein. In certain embodiments, an ion promotes anisotropic thermal ALE. In other embodiments, use of anisotropy within isotropic thermal ALE allow for making 3D nanostructures.

In certain embodiments, the agent comprises an electron. In other embodiments, low energy electrons are used to desorb species from surfaces through electron-stimulated desorption (ESD), which facilitates the growth of thin films at low temperature. In yet other embodiments, ESD enhances thermal ALE by removing surface species that may be limiting the thermal ALE.

In certain embodiments, the agent comprises a catalyst, such as but not limited to the non-limiting embodiments recited in Example 9 elsewhere herein. In certain embodiments, deposition of alkali metals or alkaline earth metals on the surface can increase thermal $Al_2O_3$ ALE rates. Without wishing to be limited by any theory, the enhanced etching rates are caused by electron donation from the alkali or alkaline-earth metals to the surface materials.

In certain embodiments, the agent comprises a molecular adsorbate. In other embodiments, the adsorption of molecular adsorbates can displace other surface-adsorbed species. Without wishing to be limited by any theory, the enhanced etching rates are caused by molecular adsorbates, such as $Al(CH_3)_3$, that can sweep away surface species, such as acac-containing surface species, and facilitate the fluorination and ligand-exchange reactions during thermal ALE.

Figure 13:
FIG. 13 is a schematic representation of a growth/etch back experiment for thermal $SiO_2$ ALE as described in Example 5.
Figure 13:
Figure 13:
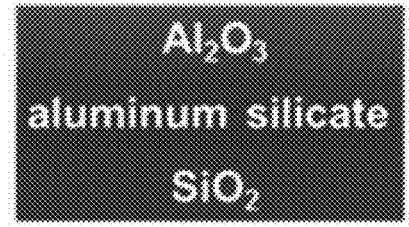
Figure 13:
Figure 13:
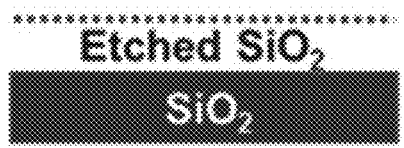

In certain aspects, the invention provides a "growth/etch back" modification strategy, such as but not limited to the non-limiting embodiments recited in Example 5 elsewhere herein. This "growth/etch back" modification allows one to modify a material that is not generally etched without such modification. In certain non-limiting embodiments, the "growth/etch back" modification strategy comprises depositing a film on at least a portion of the substrate that is targeted for etching. The deposited film contains an element and/or compound that can diffuse into the substrate and modify the underlying substrate. This modification then allows the substrate to be etched. In a non-limiting example, etching of $SiO_2$ is a challenging process, but may be achieved by growing $Al_2O_3$ ALD films on $SiO_2$ and then etching the $Al_2O_3$ using thermal ALE as illustrated in FIG. 13. Without wishing to be limited by any theory, the $Al_2O_3$ ALD on the $SiO_2$ allows Al to diffuse into the $SiO_2$ and form an aluminum silicate. This aluminum silicate is then much more readily etched than $SiO_2$ by itself.

In certain aspects, the invention provides other modification strategies, which allow one to modify a material that is not generally etched without such modification. In certain non-limiting embodiments, the "adsorption/etch" modification strategy comprises adsorbing a metal precursor on at least a portion of the substrate that is targeted for etching. The metal precursor contains an element that can diffuse into the substrate and modify the underlying substrate. This modification then allows the substrate to be etched.

In other certain non-limiting embodiments, the "conversion/etch" modification strategy comprises reacting a metal precursor on at least a portion of the substrate that is targeted for etching. The reaction of the metal precursor with the substrate converts a thin film on the substrate to another material that can be etched using thermal ALE. In a non-limiting example illustrated in Example 6, etching of $SiO_2$ may be achieved by adsorbing $Al(CH_3)_3$ on $SiO_2$ and then etching the modified $SiO_2$ substrate using thermal ALE. Without wishing to be limited by any theory, the $Al(CH_3)_3$ adsorbs on $SiO_2$ and converts the $SiO_2$ to $Al_2O_3$ and aluminum silicate. The $Al_2O_3$ and aluminum silicate is then much more readily etched than $SiO_2$ by itself.

In another non-limiting example illustrated in Example 7, etching of $SiO_2$ may be achieved by reacting $SiO_2$ substrate with $BCl_3$ or $AlCl_3$, and then etching the $B_2O_3$ or $Al_2O_3$ film on the $SiO_2$ substrate using thermal ALE. Without wishing to be limited by any theory, the $BCl_3$ forms a $B_2O_3$ film on the $SiO_2$ substrate. This $B_2O_3$ is then much more readily etched than $SiO_2$.

In another non-limiting example of "conversion/etch" illustrated in Example 8, etching of ZnO may be achieved by adsorbing $Al(CH_3)_3$ on ZnO and then etching the modified ZnO substrate using thermal ALE. Without wishing to be limited by any theory, the $Al(CH_3)_3$ adsorbs on ZnO and converts the ZnO to $Al_2O_3$. The $Al_2O_3$ is then more readily etched than ZnO by itself.

In other non-limiting embodiments, the thermal ALE can be enhanced by using larger pressures of the fluorination reagent to form a thicker fluoride layer on the substrate. The thicker fluoride layer leads to more volatile reaction products and higher etching rates during the ligand-exchange reaction. In a non-limiting example illustrated in Example 10, the etching of $Al_2O_3$ is enhanced by larger HF reactant exposures. In another non-limiting example illustrated in Example 11, the etching of $SiO_2$ is enhanced by larger HF and TMA reactant exposures. In other certain non-limiting embodiments, the thermal ALE can be enhanced and allowed to occur at much lower temperatures than are possible without the enhancement. Lower temperatures are critical for the fabrication of nanodevices that require a very low thermal budget to maintain their integrity. In another non-limiting embodiment illustrated in Example 12, the thermal ALE can lead to very smooth ultrathin film using a "deposit/etch back" strategy that overcomes initial roughness resulting from nucleation difficulties.

In certain aspects, the invention also can be employed to control spontaneous etching by using surface-adsorbed species to limit the etching. As described herein in a non-limiting example in Example 1, studies of the $AlF_3$ ALE reaction using $Sn(acac)_2$ and HF as the reactants indicated that the acac ligand was responsible for limiting the etching of the $AlF_3$ substrate. This example indicates that surface-adsorbed species could be intentionally introduced to limit the etching of a system that would normally produce spontaneous etching.

Definitions

As used herein, each of the following terms has the meaning associated with it in this section.

As used herein, unless defined otherwise, all technical and scientific terms generally have the same meaning as commonly understood by one of ordinary skill in the art to which this invention belongs. Generally, the nomenclature used herein and the laboratory procedures in surface chemistry are those well-known and commonly employed in the art.

As used herein, the articles "a" and "an" refer to one or to more than one (i.e. to at least one) of the grammatical object of the article. By way of example, "an element" means one element or more than one element.

As used herein, the term "about" will be understood by persons of ordinary skill in the art and will vary to some extent on the context in which it is used. As used herein, "about" when referring to a measurable value such as an amount, a temporal duration, and the like, is meant to encompass variations of ±20%, ±10%, ±5%, ±1%, or ±0.1% from the specified value, as such variations are appropriate to perform the disclosed methods.

As used herein, the term "acac" refers to acetylacetonate.

As used herein, the term "ALD" refers to atomic layer deposition.

As used herein, the term "ALE" refers to atomic layer etching.

As used herein, the term "BOX" refers to buried oxide.

As used herein, the term "CVD" refers to chemical vapor deposition.

As used herein, the term "CVE" refers to chemical vapor etching.

As used herein, the term "FTIR" refers to Fourier Transform Infrared Spectroscopy.

As used herein, the term "instructional material" includes a publication, a recording, a diagram, or any other medium of expression that may be used to communicate the usefulness of the compositions and/or methods of the invention. In certain embodiments, the instructional material may be part of a kit useful for generating a composition and/or performing the method of the invention. The instructional material of the kit may, for example, be affixed to a container that contains the compositions of the invention or be shipped together with a container that contains the compositions. Alternatively, the instructional material may be shipped separately from the container with the intention that the recipient uses the instructional material and the compositions cooperatively. For example, the instructional material is for use of a kit; instructions for use of the compositions; or instructions for use of the compositions.

As used herein, the term "metal chelate" refers to a compound formed between a metal and at least one chelating (or polydentate) ligand. In certain embodiments, the chelating ligand is at least one selected from the group consisting of β-diketonate, thio-β-diketonate, amidinate, acetamidinate, β-diketiminate and (substituted or non-substituted) cyclopentadienyl. In other embodiments, all the chelating ligands in the metal chelate complex are identical (e.g., all groups are β-diketonates). In other embodiments, at least two distinct chelating ligands are present in the chelate.

As used herein, the term "metal precursor" refers to a metal chelate, a metal monodentate complex and any combinations thereof.

As used herein, the term "metal monodentate complex" refers to a compound formed between a metal and at least one monodentate ligand. In certain embodiments, the monodentate ligand is at least one selected from the group consisting of alkyl, hydride, carbonyl (carbon monoxide), halide, alkoxide, alkylamide and silylamide. In other embodiments, all the monodentate ligands in the metal monodentate complex are identical (e.g., all alkyl groups are methyl). In other embodiments, at least two distinct monodentate ligands are present in the monodentate complex (e.g., the alkyl groups comprise methyl and ethyl).

As used herein, the term "MCPC" refers to mass change per cycle.

As used herein, the term "PID" refers to proportional-integral-derivative.

As used herein, the term "QCM" refers to quartz crystal microbalance.

As used herein, the term "SE" refers to spectroscopic ellipsometry.

As used herein, the term "SOI" refers to silicon-on-insulator

As used herein, the term "TDMAG" refers to trisdimethylamido gallium.

As used herein, the term "TDMAH" refers to tetrakisdimethylamido hafnium.

As used herein, the term "TMA" refers to trimethylaluminum.

As used herein, the term "XRR" refers to X-ray reflectivity.

Throughout this disclosure, various aspects of the invention may be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range and, when appropriate, partial integers of the numerical values within ranges. For example, description of a range such as from 1 to 6 should be considered to have specifically disclosed sub-ranges such as from 1 to 3, from 1 to 4, from 1 to 5, from 2 to 4, from 2 to 6, from 3 to 6, and so on, as well as individual numbers within that range, for example, 1, 2, 2.7, 3, 4, 5, 5.3, and 6. This applies regardless of the breadth of the range.

Compositions

The invention provides a solid substrate obtained according to the methods of the invention. The invention further provides a cleaned substrate (i.e., a substrate from which impurities are at least partially removed) obtained according to the methods of the invention. The invention further provides a porous substrate or high-aspect-ratio structure obtained according to the methods of the invention. The invention further provides a 3D structure with reduced feature sizes obtained according to the methods of the invention. The invention further provides a patterned solid substrate obtained according to the methods of the invention. The invention further provides a smoothened solid substrate obtained according to the methods of the invention.

Methods

The invention provides a method of promoting atomic layer etching on a solid substrate comprising a first metal compound.

The invention further provides a method of cleaning a solid substrate, wherein a portion of the surface of the solid substrate has exposed first metal compound.

The invention further provides a method of patterning a solid substrate, wherein a portion of the surface of the solid substrate has exposed first metal compound.

The invention further provides a method of selectively removing a portion of a solid substrate, wherein the solid substrate comprises a first metal compound.

The invention further provides a method of forming and/or enlarging pores in a porous substrate, wherein the porous substrate comprises a first metal compound.

The invention further provides a method of smoothing the surface of a solid substrate, wherein the solid substrate comprises a first metal compound. Smoothing of surfaces is of interest in the semiconductor industry. Smoothing may be used to obtain damage-free layers. Sputtering can be used to remove some materials, but can leave a rough, damaged surface. ALE can be used to remove the damaged layer and smooth the surface to produce a "damage-free surface."

Surface smoothing can also be used to obtain very high quality ultrathin films. For example, high quality ultrathin films can be produced by a "deposit/etch back" strategy by depositing a thicker film and then etching back to a thinner film. In a non-limiting embodiment, nucleation effects can lead to roughness in the ultrathin deposited film; once a continuous and pinhole-free thicker film is formed, ALE can etch this film back and obtain a smoother surface than would have been produced by growing to this ultrathin thickness.

In certain embodiments, the method comprises (a) contacting the solid substrate with a gaseous second metal precursor, wherein the precursor comprises at least one selected from the group consisting of monodentate ligands, chelates and any combinations thereof, whereby a first metal reaction product is formed. In other embodiments, the method further comprises (b) contacting the solid substrate formed in step (a) with a halogen-containing gas, whereby first metal halide is formed as a product on the surface. In yet other embodiments, the method further comprises optionally repeating steps (a) and (b) one or more times. In yet other embodiments, in at least one time point selected from the group consisting of: during step (a), inbetween step (a) and step (b), during step (b), and inbetween step (b) and the step (a) of the following iteration, the surface is treated with an agent that promotes removal of at least a fraction of any ligand, or any other residual surface species that result from the surface reaction(s), that is bound to and/or adsorbed onto the solid substrate.

In certain embodiments, the method comprises contacting the solid substrate with a halogen-containing gas before step (a), thereby forming a first metal halide before forming the first metal product. In certain embodiments, ALE can be used to reduce the feature size of 3D architectures. The gas phase, isotropic and/or anisotropic etching obtained using thermal ALE or enhanced thermal ALE can reduce feature sizes and mass conformally with atomic level precision versus the number of ALE reaction cycles. Applications include reducing the width of FinFET channels in MOSFET structures and reducing the diameter and mass of nanowires and quantum dots.

In certain embodiments, the method comprises (a) contacting the porous or high-aspect-ratio substrate with a gaseous precursor of a second metal, whereby a first metal reaction product is formed. In other embodiments, the method further comprises (b) contacting the porous or high aspect-ratio substrate formed in step (a) with a halogen-containing gas, whereby a first metal halide is formed. In yet other embodiments, the method further comprises optionally repeating steps (a) and (b) one or more times.

In certain embodiments, in at least one time point selected from the group consisting of: during step (a), inbetween step (a) and step (b), during step (b), and inbetween step (b) and the next step (a) of the following iteration, the surface is treated with an agent that promotes removal of at least a fraction of any ligand, or any other residual surface species that result from the surface reaction(s), that is bound to and/or adsorbed onto the porous or high aspect-ratio substrate.

In certain embodiments, the agent promotes significant enhancement of the etching of the solid substrate or lowers the required temperature for etching within the methods of the invention.

In certain embodiments, the agent is at least one selected from the group consisting of a radical, photon, ion, electron, alkali metal, alkaline earth metal, or molecular adsorbate. In other embodiments, the agent is generated by a plasma. In yet other embodiments, the agent comprises a radical and the plasma comprises a $H_2$ plasma. In yet other embodiments, the agent comprises a photon and the plasma comprises an Ar plasma. In yet other embodiments, the agent comprises an ion that is applied directionally to at least a fraction of the surface. In yet other embodiments, the ALE is at least partially anisotropic. In yet other embodiments, the agent comprises an alkali metal molecular precursor. In yet other embodiments, the agent comprises a molecular adsorbate that adsorbs on the solid substrate and displaces other surface-adsorbed species.

In certain embodiments, the agent comprises larger absolute pressures during exposure of the halogen-containing gas reactant or the second metal precursor gas reactant. Without wishing to be limited by any theory, fluorination is self-limiting at a given pressure, and increasing the fluorination pressure leads to self-limiting behavior at a higher fluoride layer thickness. The higher fluoride layer thickness leads to higher etching rates. Without wishing to be limited by any theory, the reaction with the second metal precursor is self-limiting at a given pressure, and increasing the second metal precursor pressure may lead to higher etching rates.

In certain embodiments, before the substrate is submitted to ALE, an ALD film of a third metal compound is grown over at least a fraction of the substrate surface, wherein the ALE etches the substrate surface covered by the ALD film at a higher rate than the first metal compound. In other embodiments, the third metal compound reacts at least partially with the first metal compound. In yet other embodiments, the third metal compound comprises $Al_2O_3$ and the first metal compound comprises $SiO_2$.

In certain embodiments, before the substrate is submitted to ALE, a third metal precursor is adsorbed over and coats at least a fraction of the substrate surface, wherein the ALE etches the substrate surface coated by the third metal precursor at a higher rate than the first metal compound. In other embodiments, the metal element present in the third metal precursor diffuses into the first metal compound. In yet other embodiments, the third metal precursor comprises $Al(CH_3)_3$ and the first metal compound comprises $SiO_2$.

In certain embodiments, before the substrate is submitted to ALE, a third metal precursor is reacted with at least a fraction of the substrate surface, wherein a new metal compound is formed by conversion of the first metal compound. The ALE then etches the new metal compound resulting from reaction of the first metal compound with the third metal precursor at a higher rate than the first metal compound. In other embodiments, the third metal precursor comprises $BCl_3$, the reaction product comprises $B_2O_3$ and the first metal compound comprises $SiO_2$. In yet other embodiments, the third metal precursor comprises $AlCl_3$, the reaction product comprises $Al_2O_3$ and the first metal compound comprises $SiO_2$.

In certain embodiments, ALE can be performed, whereby spontaneous etching is controlled by using surface-adsorbed species to restrict the etching. Some films can be etched spontaneously by fluorination agents. To prevent the spontaneous etching, the surface-adsorbed species can be intentionally introduced to limit the etching. These surface-adsorbed species define a new type of ALE by restraining spontaneous etching.

In certain embodiments, the monodentate ligand comprises at least one selected from the group consisting of alkyl, hydride, carbonyl, halide, alkoxide, alkylamide and silylamide.

In certain embodiments, the alkyl group comprises at least one selected from the group consisting of methyl, ethyl, n-propyl, and isopropyl.

In certain embodiments, the chelate comprises at least one selected from the group consisting of β-diketonate, amidinate, acetamidinate, β-diketiminate, diamino alkoxide (such as, but not limited to, 1-dimethylamino-2-methyl-2-propanolate or dmamp), and metallocene (such as, but not limited to, cyclopentadienyl or Cp).

In certain embodiments, the ligands on the metal precursor may be combinations of monodentate ligands, combinations of chelate ligands or combinations of monodentate and chelate ligands.

In certain embodiments, the solid substrate is contained in a single system and is sequentially contacted with the gaseous compound of the second metal in step (a) and the halogen-containing gas in step (b). In other embodiments, the solid substrate is purged with an inert gas after step (a) and/or step (b). In yet other embodiments, the inert gas comprises $N_2$ and/or Ar. In yet other embodiments, step (a) and/or step (b) is/are run at a temperature that is equal to or greater than a value ranging from about 25° C. to about 450° C.

In certain embodiments, the gaseous compound of the second metal in step (a) and the halogen-containing gas in step (b) are positioned at separate locations. The two reactants are separated in space rather than time (i.e., spatial ALE). The solid substrate is physically moved from one reactant location to another reactant location.

In certain embodiments, the first metal compound comprises at least one selected from the group consisting of metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material (such as, but not limited to, metalcones, such as alucone, Lee et al., 2013, Adv. Funct. Mater. 23:532).

In certain embodiments, the solid substrate is first submitted to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material. In yet other embodiments, the first metal comprises at least one selected from the group consisting of Al, Hf, Zr, Fe, Ni, Co, Mn, Mg, Rh, Ru, Cr, Si, Ti, Sc, Ga, In, Zn, Pb, Ge, Ta, Cu, W, Mo, Pt, Cd and Sn.

In certain embodiments, the solid substrate comprises at least one selected from the group consisting of Si, SiN, $SiN_xO_y$, $Si_xGe_y$, SiC, $SiB_3$, SiP, SiAs, SiSe, and SiTe, wherein x is an integer from 1 to 6 and y is an integer from 1 to 6. In other embodiments, the solid substrate comprises at least one selected from the group consisting of RuSi, $Ti_xSi_y$, $V_xSi_y$, $Nb_xSi_y$, $Mo_xSi_y$, $Ta_xSi_y$, $Re_xSi_y$, and $W_xSi_y$, wherein x is an integer from 1 to 6 and y is an integer from 1 to 6.

In certain embodiments, the method further comprises (x) submitting the solid substrate to a chemical treatment that results in the formation, on at least a portion of the surface of the solid substrate, of a metal compound selected from the group consisting of a first metal oxide, first metal nitride, first metal phosphide, first metal sulfide, first metal arsenide, first metal fluoride, first metal silicide, first metal boride, first metal carbide, first metal selenide, first metal telluride, elemental first metal, first metal alloy, and hybrid organic-inorganic material. In other embodiments, step (x) is conducted at one time point selected from the group consisting of: before step (x), inbetween step (a) and step (b), inbetween step (b) and step (a), inbetween step (b) and the step (a) of the following iteration and inbetween step (a) and step (b) of the following iteration. In certain embodiments, the chemical treatment is oxidation. In other embodiments, the oxidation is conducted by contacting the solid substrate with at least one oxidant. In yet other embodiments, the at least one oxidant is selected from the group consisting of oxygen ($O_2$), ozone ($O_3$), hydrogen peroxide ($H_2O_2$), water ($H_2O$), and an oxygen-containing plasma. In yet other embodiments, the oxidation is conducted at a temperature of about 30° C. to about 400° C. In yet other embodiments, the oxidation is conducted at a temperature of about 200° C. to about 300° C. In yet other embodiments, the oxidation is conducted at an oxidizing gas pressure of about 20 Torr to about 400 Torr. In yet other embodiments, the oxidation is conducted at an oxidizing gas pressure of about 250 Torr.

In certain embodiments, the metal compound is an elemental metal that is directly fluorinated to form a metal fluoride.

In certain embodiments, the first metal compound is deposited on an inert substrate. In other embodiments, the inert substrate comprises Si. In yet other embodiments, the inert substrate comprises a Si wafer.

In certain embodiments, the second metal comprises at least one selected from the group consisting of Sn, Ge, Al, B, Ga, In, Zn, Ni, Pb, Si, P, S, Hf, Zr and Ti. In other embodiments, the β-diketonate comprises acac (acetylacetonate), hfac (hexafluoro acetylacetonate), tfac (trifluroacetylacetonate), and tmhd (tetramethylheptanedionate).

In certain embodiments, the halogen-containing gas comprises a hydrogen halide. In other embodiments, the hydrogen halide comprises HF. In yet other embodiments, the halogen-containing gas comprises at least one selected from the group consisting of $F_2$, $ClF_3$, $NF_3$, $SF_6$, $SF_4$, $XeF_2$, $Cl_2$, $Br_2$, $BCl_3$, $I_2$, $SOCl_2$ and $SOF_2$. In yet other embodiments, the hydrogen halide comprises HCl, HBr or HI. In yet other embodiments, the halogen-containing gas may be ionized in a plasma to produce halogen radicals or ions.

In certain embodiments, the solid substrate is pretreated by sequential contacting with a gaseous compound of a second metal, and a halogen-containing gas. In other embodiments, the first metal compound is formed using atomic layer deposition. In yet other embodiments, each cycle of step (a) and step (b) is self-limiting. In yet other embodiments, each cycle of step (a) and step (b) allows for about the same etch rate and/or mass loss of the solid substrate. In yet other embodiments, the resulting etched solid substrate has about the same or lower surface roughness as the starting solid substrate. In yet other embodiments, the density of the etched solid substrate is about the same as of the starting solid substrate. In yet other embodiments, the refractive index of the etched solid substrate is about the same as of the initial solid substrate. In yet other embodiments, the solid substrate comprises a carbon composite.

In certain embodiments, the surface of the starting solid substrate is at least partially masked, whereby only a portion of the surface of the solid substrate is exposed. In other embodiments, the surface of the starting solid substrate is at least partially masked with a photoresist. In yet other embodiments, the solid substrate is further patterned using a technique selected from the group consisting of monolayer self-assembling, nano-imprint and stamping.

In certain embodiments, the method comprises (x) submitting the solid substrate to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material. In other embodiments, the method comprises (a) contacting the solid substrate formed in step (x) with a gaseous second metal precursor, wherein the precursor comprises at least one selected from the group consisting of monodentate ligands, chelates and any combinations thereof, whereby a first metal reaction product is formed. In yet other embodiments, the method comprises (b) contacting the solid substrate formed in step (a) with a halogen-containing gas, whereby first metal halide is formed as a product on the surface. In yet other embodiments, the method comprises (c) optionally repeating steps (x), (a) and (b) one or more times.

In certain embodiments, the method comprises (x) submitting the solid substrate to a chemical treatment that results in the formation, on at least a portion of the surface of the solid substrate, of a metal compound selected from the group consisting of a metal oxide, metal nitride, metal phosphide, metal sulfide, metal arsenide, metal fluoride, metal silicide, metal boride, metal carbide, metal selenide, metal telluride, elemental metal, metal alloy, and hybrid organic-inorganic material. In other embodiments, the method comprises (b) contacting the solid substrate formed in step (x) with a halogen-containing gas, whereby first metal halide is formed as a product on the surface. In yet other embodiments, the method comprises (a) contacting the solid substrate formed in step (b) with a gaseous second metal precursor, wherein the precursor comprises at least one selected from the group consisting of monodentate ligands, chelates and any combinations thereof, whereby a first metal reaction product is formed. In yet other embodiments, the method comprises (c) optionally repeating steps (x), (b) and (a) one or more times.

In other embodiments, the method further comprises treating the solid substrate with an agent that promotes removal of at least a fraction of any ligand, or any other residual surface species that result from the surface reaction(s), that is bound to and/or adsorbed onto the solid substrate, wherein the treatment takes place in at least one time point selected from the group consisting of: during step (x), inbetween step (x) and step (b), during step (b), inbetween step (b) and step (a), during step (a), and inbetween step (a) and the step (x) of the following iteration. In yet other embodiments the agent is any agent recited elsewhere herein.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomer and/or enantiomer of the compound described individual or in any combination. Although the description herein contains many embodiments, these should not be construed as limiting the scope of the invention but as merely providing illustrations of some of the presently preferred embodiments of the invention.

Those skilled in the art will recognize, or be able to ascertain using no more than routine experimentation, numerous equivalents to the specific procedures, embodiments, claims, and examples described herein. Such equivalents are considered to be within the scope of this invention and covered by the claims appended hereto. For example, it should be understood, that modifications in reaction conditions, including but not limited to reaction times, reaction temperature and pressure, reaction size/volume, and experimental reagents with art-recognized alternatives and using no more than routine experimentation, are within the scope of the present application. In general the terms and phrases used herein have their art-recognized meaning, which can be found by reference to standard texts, journal references and contexts known to those skilled in the art. Any preceding definitions are provided to clarify their specific use in the context of the invention.

The following examples further illustrate aspects of the present invention. However, they are in no way a limitation of the teachings or disclosure of the present invention as set forth herein.

EXAMPLES

The invention is now described with reference to the following Examples. These Examples are provided for the purpose of illustration only, and the invention is not limited to these Examples, but rather encompasses all variations that are evident as a result of the teachings provided herein.

Example 1: $AlF_3$ ALE Reactions Showing Limiting Effect by Acac-Containing Surface Species An $AlF_3$ ALE reaction was performed using $Sn(acac)_2$ and HF as the reactants, as described in International Application No. PCT/US2015/066789, which is incorporated herein in its entirety by reference.

Methods

The ALE reactions were conducted in a viscous flow ALD reactor, with the reaction temperatures varying from 150-250° C. A proportional-integral-derivative (PID) temperature controller (2604, Eurotherm) held the temperature constant to within ±0.04° C. The reactor pressure was measured using a capacitance manometer (Baratron 121A, MKS).

The ALD reactor was outfitted with an in situ QCM. An RC-cut quartz crystal (gold coated and polished, 6 MHz, Colnatec) was positioned in a sensor head (BSH-150, Inficon). The sensor head was then sealed with a high temperature epoxy (Epo-Tek H21D, Epoxy technology). A thin film deposition monitor (Maxtek TM-400, Inficon) was employed to record the QCM measurements.

Sequential exposure of tin(II) acetylacetonate ($Sn(acac)_2$, 37-38% Sn, Gelest) and HF-pyridine (70 wt % HF, Sigma-Aldrich) were employed for the $AlF_3$ ALE reactions. Gaseous HF from HF-pyridine is a much safer source of anhydrous HF than HF from a gas cylinder. HF-pyridine exists as a liquid at room temperature and is in equilibrium with gaseous HF. At room temperature, the HF pressure above HF-pyridine is 90-100 Torr.

HF-pyridine and Sn(acac)$_2$ were both transferred to stainless steel bubblers using a dry N$_2$-filled glove bag. The Sn(acac)$_2$ precursor was held at 100° C. and produced a pressure transient of 20 mTorr during Sn(acac)$_2$ exposures. The HF-pyridine precursor was maintained at room temperature and produced a pressure transient of 80 mTorr during HF exposures. The AlF$_3$ films were grown by AlF$_3$ ALD using TMA (97%, Sigma-Aldrich) and HF derived from HF-pyridine. The TMA precursor was held at room temperature.

A mechanical pump (Pascal 2015 SD, Alcatel) was employed to pump the reactor. A constant total flow of 150 sccm of ultra-high purity (UHP) N$_2$ carrier gas into the reactor was delivered by three separate mass flow controllers (Type 1179A, MKS). Additional N$_2$ gas flow of 20 sccm was provided using a metering bellows-sealed valve (SS-4BMG, Swagelok) to prevent deposition on the backside of the QCM crystal. A base pressure of about 1 Torr in the reactor was produced by the total N$_2$ gas flow of 170 sccm.

Discussion

Figure 1A:
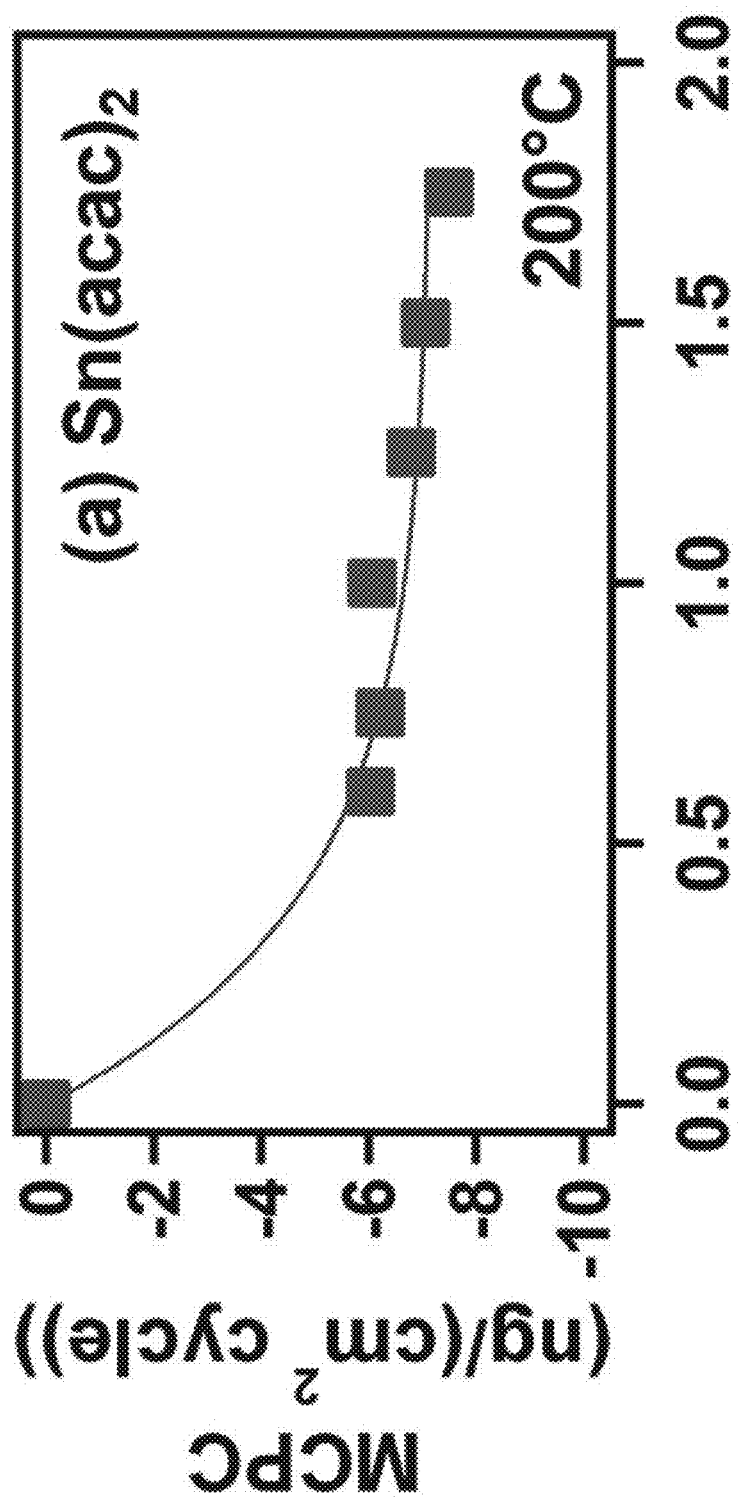
FIGS. 1A-1B illustrate the mass change per cycle (MCPC) versus exposure time for the $Sn(acac)_2$ and HF reactions during $AlF_3$ ALE, as recited in Example 1. Both $Sn(acac)_2$ and HF exposures reach MCPC values that saturate at larger exposures indicating self-limiting reactions.
Figure 1B:
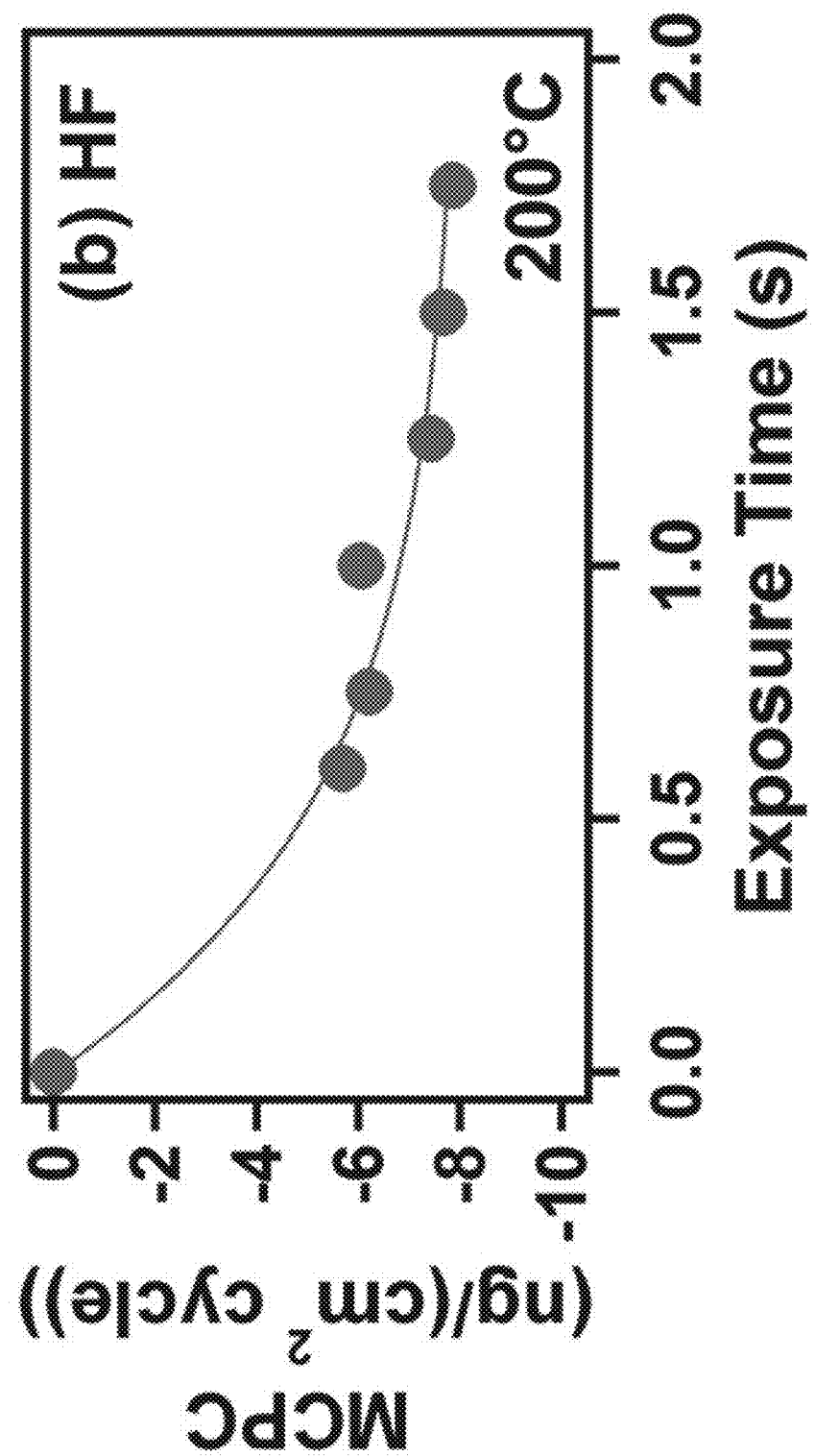

An AlF$_3$ film grown using AlF$_3$ ALD with Al(CH$_3$)$_3$ and HF was etched using Sn(acac)$_2$ and HF. The QCM measured mass changes for the Sn(acac)$_2$ and HF reactions. The mass change per cycle (MCPC) for AlF$_3$ ALE reached nearly constant values after longer exposure times (FIG. 1). This behavior indicates that both reactions are self-limiting. The self-limiting nature of the Sn(acac)$_2$ was surprising because Sn(acac)$_2$ should spontaneously etch AlF$_3$. Experiments using Al(CH$_3$)$_3$ (trimethylaluminum or TMA), instead of Sn(acac)$_2$, reveal that Al(CH$_3$)$_3$ can spontaneously etch AlF$_3$.

The results suggest that acac-containing species limit the etching of AlF$_3$ by Sn(acac)$_2$. Sn(acac)$_2$ etches AlF$_3$ and the acac species contained in Sn(acac)$_2$ also restrict the etching. Without wishing to be limited by any theory, the acac species adsorbed on the surface of the AlF$_3$ film can block or poison surface sites, and prevent surface reactions. The HF exposure is then needed to remove the acac-containing species to continue the etching process. This example illustrates the critical role that the acac-containing surface species play in controlling the AlF$_3$ etching by Sn(acac)$_2$ and HF.

Figure 2B:
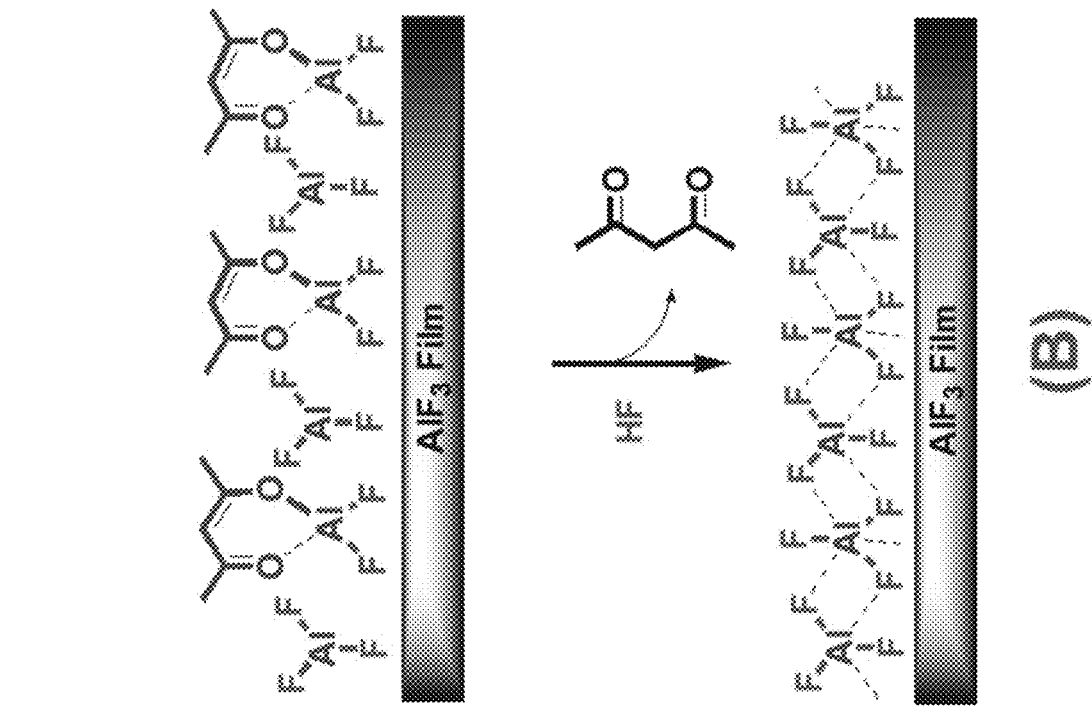
FIGS. 2A-2B are schematics showing the $Sn(acac)_2$ and HF reactions during $AlF_3$ ALE. Acac-containing species are left on the surface after the $Sn(acac)_2$ reaction and they limit the $Sn(acac)_2$ etching reaction. The HF exposure is not needed for fluorination because the $AlF_3$ film is already fluorinated. However, the HF exposure is needed to remove some of the acac-containing species.
Figure 2A:
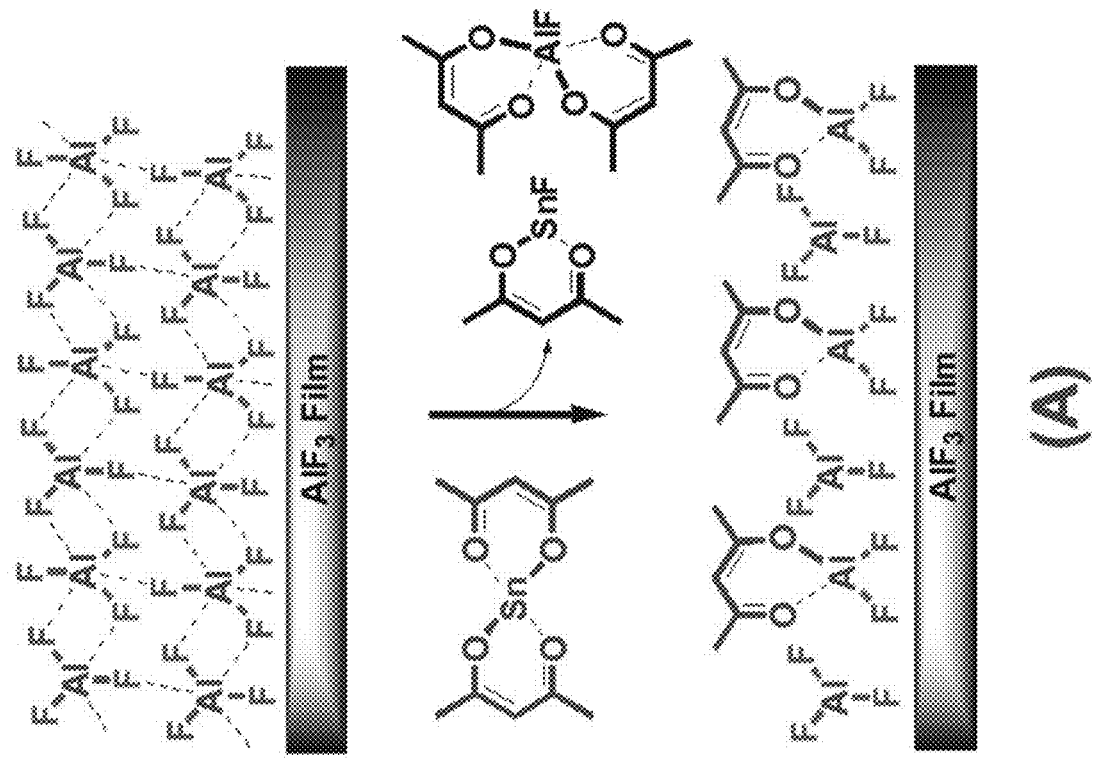

A schematic showing the Sn(acac)$_2$ and HF reactions during AlF$_3$ ALE is shown in FIG. 2. FIG. 2A illustrates that acac-containing species are left on the surface after the Sn(acac)$_2$ reaction. The HF exposure is not needed for fluorination because the AlF$_3$ film is already fluorinated. However, the HF exposure removes some of the acac-containing species as shown in FIG. 2B.

Example 2: Al$_2$O$_3$ ALE Reactions Showing Correlation Between Etching and Acac-Containing Surface Species An Al$_2$O$_3$ ALE reaction was performed using Sn(acac)$_2$ and HF as the reactants, as described in International Application No. PCT/US2015/066789, which is incorporated herein in its entirety by reference.

Methods

The ALE reactions at 150-300° C. were performed in a viscous flow ALD reactor (Elam, et al., 2002, Rev Sci Instrum 73:2981-2987). A proportional-integral-derivative (PID) temperature controller (2604, Eurotherm) stabilized the temperature in the reactor to within ±0.04° C. A capacitance manometer (Baratron 121A, MKS) measured the pressure in the reactor. The ALD reactor was equipped with an in situ quartz crystal microbalance (QCM) (Elam, et al., 2002, Rev Sci Instrum 73:2981-2987). The RC-cut quartz crystal (Riha, et al., 2012, Rev Sci Instrum 83) (gold coated and polished, 6 MHz, Colnatec) was placed in a sensor head (BSH-150, Inficon) and then sealed with high temperature epoxy (Epo-Tek H21D, Epoxy technology). All in situ QCM measurements were recorded by a thin film deposition monitor (Maxtek TM-400, Inficon).

The Al$_2$O$_3$ ALE reactions were performed using sequential exposure of tin(II) acetylacetonate (Sn(acac)$_2$, 37-38% Sn, Gelest) and HF-pyridine (70 wt % HF, Sigma-Aldrich). HF-pyridine is a liquid at room temperature and has an equilibrium with gaseous HF (Olah, et al., 1973, Synthesis-Stuttgart 779-780). Use of gaseous HF from HF-pyridine enables the safe handling of anhydrous HF.

Sn(acac)$_2$ and HF-pyridine were transferred to stainless steel bubblers in a dry N$_2$-filled glove bag. The stainless steel bubbler containing Sn(acac)$_2$ was held at 100° C. to produce a vapor pressure of 15-20 mTorr during dosing. The Al$_2$O$_3$ films were grown with Al$_2$O$_3$ ALD using TMA (97%, Sigma-Aldrich) and H$_2$O (Chromasolv for HPLC, Sigma-Aldrich).

The reactor was pumped using a mechanical pump (Pascal 2015SD, Alcatel). Three separate mass flow controllers (Type 1179A, MKS) delivered a constant total flow of 150 sccm of ultra-high purity (UHP) N$_2$ carrier gas into the reactor. Additional N$_2$ gas flow of 20 sccm using a metering bellows-sealed valve (SS-4BMG, Swagelok) prevented deposition on the backside of the QCM crystal (Elam, et al., 2002, Rev Sci Instrum 73:2981-2987). The total N$_2$ gas flow of 170 sccm produced a base pressure of about 1 Torr in the reactor.

Experiments were also performed in another reactor equipped with an FTIR spectrometer. The in situ transmission FTIR measurements were conducted on high surface area SiO$_2$ nanoparticles. The large surface area provided by the SiO$_2$ nanoparticles improved the signal-to-noise ratio for observing the infrared absorption by the surface species on the Al$_2$O$_3$ layer on the SiO$_2$ nanoparticles.

Discussion

The initial Al$_2$O$_3$ ALD film on the QCM surface was prepared by 100 cycles of Al$_2$O$_3$ ALD using TMA and H$_2$O at 200° C. in the viscous flow ALD reactor. One ALE cycle consisted of a Sn(acac)$_2$ dose of 1 s, an N$_2$ purge of 30 s, a HF dose of 1.0 s, and a second N$_2$ purge of 30 s. This reaction sequence is denoted as 1-30-1-30. Pressure transients during Sn(acac)$_2$ and HF doses were 20 mTorr and 80 mTorr, respectively.

Figure 3:
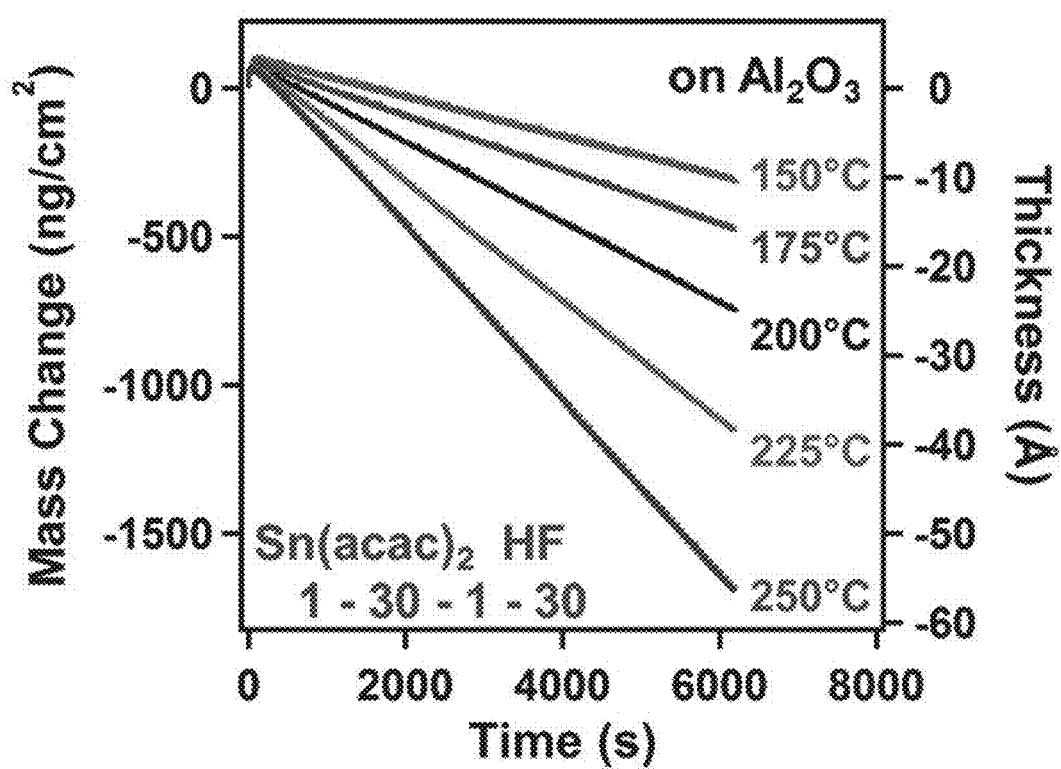
FIG. 3 illustrates the mass change versus time for sequential $Sn(acac)_2$ and HF exposures during $Al_2O_3$ ALE. The mass changes are larger at the higher temperatures.

The etching of the Al$_2$O$_3$ film under these conditions was linear and was larger at higher temperatures. FIG. 3 shows the mass change versus time at a variety of temperatures ranging from 150° C. to 250° C. The mass change per cycles (MCPCs) vary from −4.1 ng/(cm$^2$ cycle) at 150° C. to −18.3 ng/(cm$^2$ cycle) at 250° C. These MCPCs correspond to etch rates that vary from 0.14 Å/cycle at 150° C. to 0.61 Å/cycle at 250° C. based on the Al$_2$O$_3$ ALD film density of 3.0 g/cm$^3$ measured by XRR.

Additional experiments were conducted in a chamber equipped for FTIR vibrational spectroscopy studies. Absorbance features from the acac-containing species on the Al$_2$O$_3$ surface after the Sn(acac)$_2$ and HF exposures are displayed in FIG. 4. These acac-containing species were quantified by the infrared absorbance of their vibrational modes. FIG. 4 shows that the acac-containing species decrease progressively at high surface temperatures. The highest coverage of acac-containing surface species was present after the Sn(acac)$_2$ exposures at the lowest temperature of 200° C. The lowest coverage of acac-containing surface species was present after the HF exposures at the highest temperature of 300° C. There is a correlation between the coverage of acac-containing surface species and the Al$_2$O$_3$ etching rate; higher etching rates correspond with lower acac-containing surface coverages.

Figure 5:
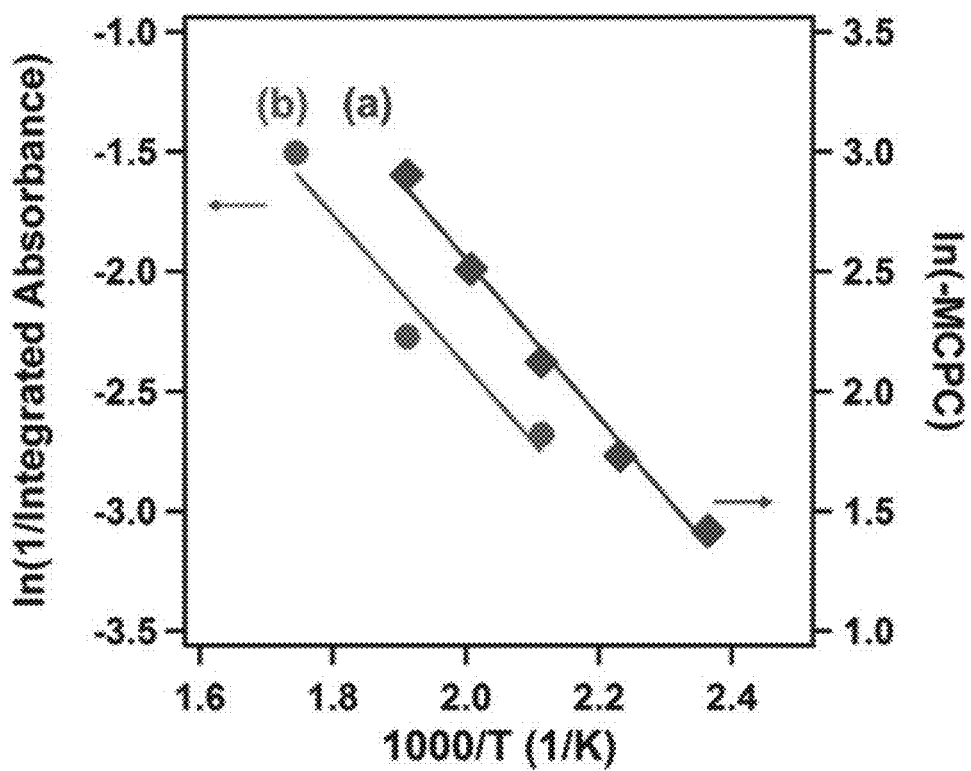
FIG. 5 comprises a set of graphs relating to experiments described in Example 2. Curve (a) illustrates the Arrhenius plot of the mass change per cycle (MCPC) for $Al_2O_3$ ALE in Example 2. The slope of the plot yielded an activation barrier of E=6.6 kcal/mol. Curve (b) illustrates the Arrhenius plot of 1/(integrated absorbance) for the acac vibrational features during $Al_2O_3$ ALE in Example 2. The slope of the plot yielded an activation barrier of E=6.2 kcal/mol.

To evaluate the correlation between the Al$_2$O$_3$ etching rates and the acac-containing surface coverage, the natural logarithm of the Al$_2$O$_3$ MCPC from the QCM experiments and the reciprocal of the integrated infrared absorbance for the acac-containing surface species from the FTIR experiments are shown as a function of inverse temperature in FIG. 5. The Arrhenius plot for the Al$_2$O$_3$ MCPC versus 1/T in FIG. 5A yields an activation barrier of 6.6±0.4 kcal/mol. FIG. 5 further indicates that the temperature dependence of the etching scales inversely with the acac coverage on the surface as measured by the integrated absorbance. The Arrhenius plot for the reciprocal of the acac coverage versus 1/T shown in FIG. 5B yields an activation barrier of 6.2±1.5 kcal/mol. This correlation between the Arrhenius plots in FIG. 5A and FIG. 5B indicates that the etching rate is inversely correlated with the acac surface coverage. It thus follows that reduction of acac surface coverage increases the overall etching rate.

Example 3: Thermal Atomic Layer Etching of Crystalline Aluminum Nitride Using Sequential, Self-Limiting HF and Sn(acac)$_2$ Reactions and Enhancement by H$_2$ and Ar Plasmas To extend the development of atomic layer processing methods, the thermal ALE of crystalline AlN (aluminum nitride) films was evaluated using sequential, self-limiting exposures of HF and Sn(acac)$_2$.

AlN samples were grown epitaxially on Si(111) wafers using a plasma vapor deposition of nanocolumns (PVDNC™) crystal growth process. The AlN films were in the wurtzite crystalline phase with the (0001) plane parallel to the surface. The initial AlN films had a thickness of about 500 Å. Etching of the AlN films was analyzed using in situ spectroscopic ellipsometry (SE) in a reaction chamber (Clancey, et al., 2015, J. Vac. Sci. Technol. A33:01A130; Cavanagh, et al., 2013, ECS Trans. 58(10):19). Each reactant was separately dosed into the chamber and held statically for 10 seconds. After each reactant exposure, the reaction chamber was purged with 80 sccm of ultra-high purity (UHP) nitrogen at a pressure of 840 mTorr for 130 seconds. The pressures in the reactor were measured using a capacitance manometer.

AlN films were analyzed with in situ SE to obtain the film thickness after each reaction cycle or after each individual fluorination and ligand-exchange reaction. The AlN samples were analyzed with a Sellmeier model using Complete Ease software (J. A. Woollam). Because of the large bandgap of AlN at about 6.2 eV, AlN behaves as a dielectric. AlN is not absorptive over the 0.73-5.18 eV spectral range of the SE analysis. Accurate thickness measurements can be obtained without a complex model accounting for light absorption. The fit of the Sellmeier model to the ψ and Δ ellipsometry parameters after removal of the AlO$_x$N$_y$ layer yielded refractive indices in the range of 2.13-2.17. These refractive indices are in agreement with previous measurements for crystalline AlN (Joo, et al., 1999, J. Vac. Sci. Technol. A17:862).

Figure 6:
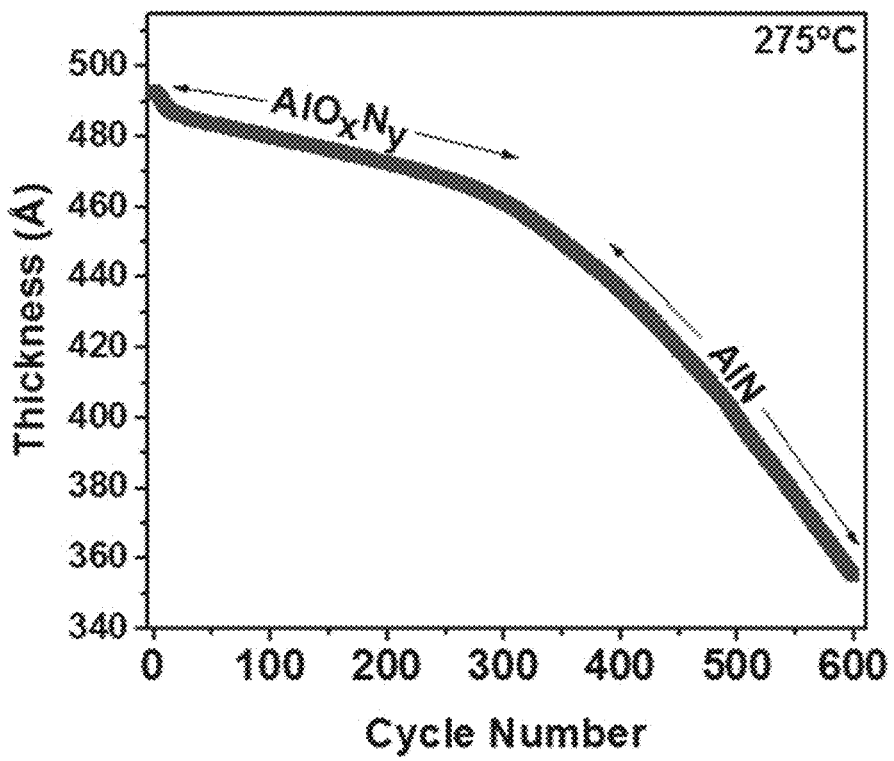
FIG. 6 is a graph illustrating film thickness measured by spectroscopic ellipsometry versus number of AlN ALE reaction cycles at 275° C. as described in Example 3. The etch rate increased after removing the $AlO_xN_y$ layer on the AlN film.

FIG. 6 illustrates the etching of a typical AlN sample for 600 reaction cycles at 275° C. under self-limiting reaction conditions with an HF exposure of 1270 mTorr·s and a Sn(acac)$_2$ exposure of 900 mTorr·s. The slow etch rate over the first 300 reaction cycles was attributed to an AlO$_x$N$_y$ layer on the surface of the AlN film. The etch rate in this AlO$_x$N$_y$ region was about 0.07 Å/cycle. After a thickness change of about 30 Å corresponding with about 300 ALE reaction cycles, there was an increase in the etch rate. This increase was attributed to reaching a purer AlN film with less oxidation. After a thickness change of about 50 Å corresponding with about 400 ALE reaction cycles, the etch rate increased to about 0.36 Å/cycle in the pure AlN region.

Figure 7:
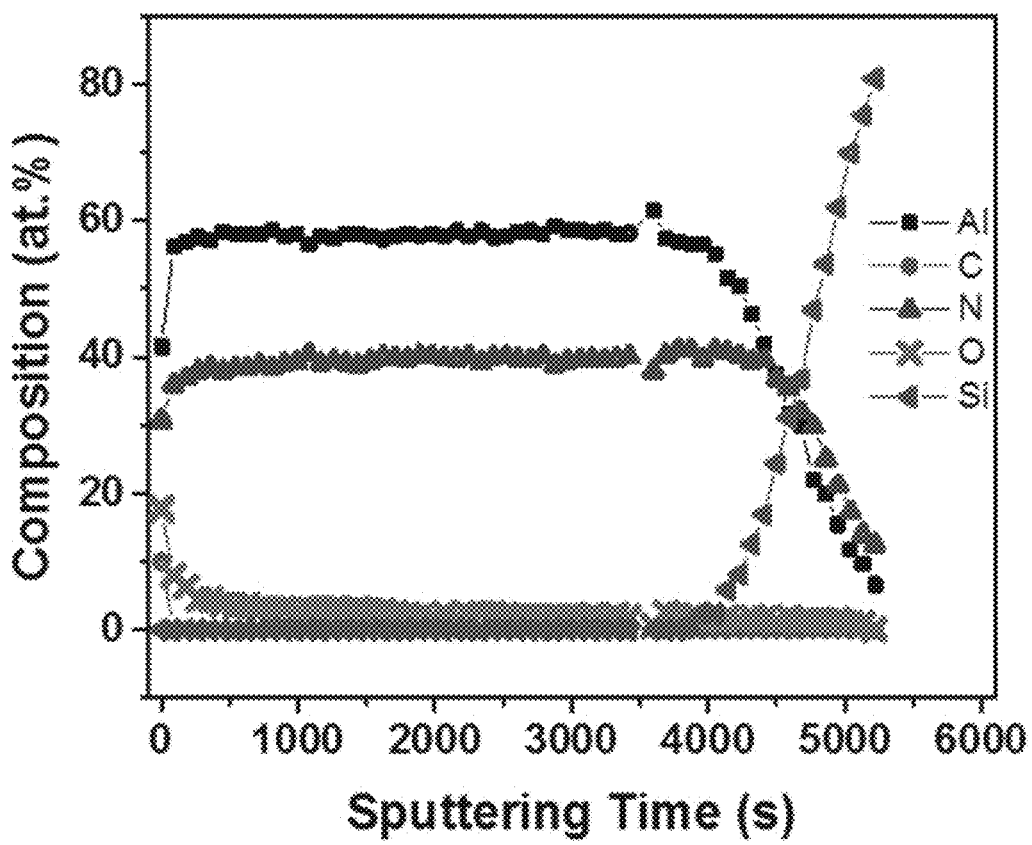
FIG. 7 is a graph illustrating film composition versus sputter time obtained by XPS depth-profiling analysis. The initial AlN film on a Si(111) wafer had a thickness of about 500 Å.

To confirm the presence of an AlO$_x$N$_y$ layer on the AlN film, the film composition was evaluated using x-ray photoelectron spectroscopy (XPS) employing a PHI 5600 x-ray photoelectron spectrometer. FIG. 7 displays the results of an XPS depth-profile experiment versus sputtering time, indicating that there was a large concentration of oxygen on the surface that decayed as a function of sputtering time. The oxygen concentration in the bulk of the AlN film was only about 1.5-2.0 at %. Using the sputtering time and the Si XPS signal as a marker for the sputter removal of the entire AlN film with an initial thickness of about 500 Å, the thickness of the AlO$_x$N$_y$ layer was estimated to be about 40 Å. This AlO$_x$N$_y$ layer thickness agrees with the etching results in FIG. 6. The AlO$_x$N$_y$ layer thickness was also consistent with x-ray reflectivity (XRR) experiments that yield an oxide thickness of about 44 Å on the AlN film. FIG. 7 also illustrates that the AlN films are Al-rich.

Figure 8A:
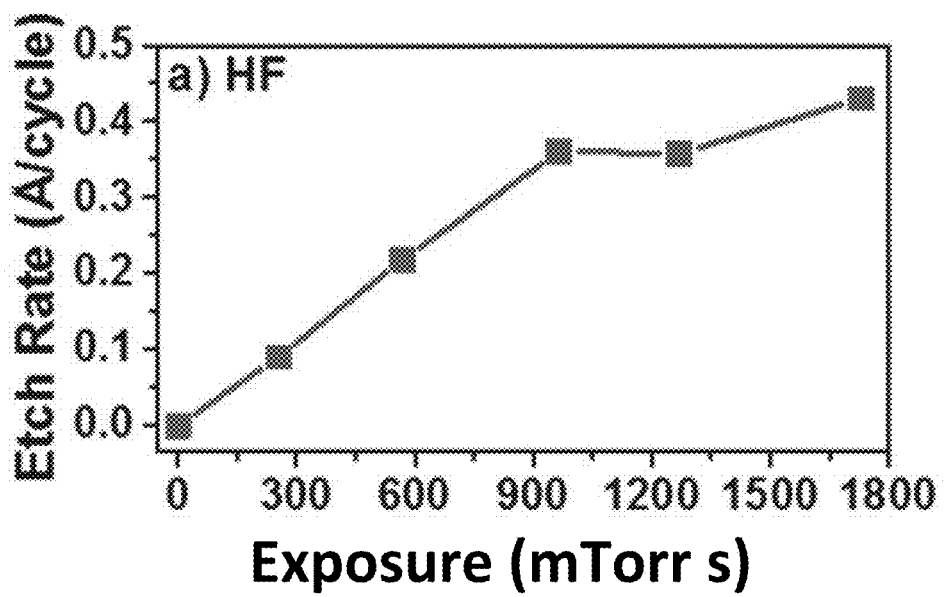
FIGS. 8A-8B are a set of graphs illustrating etch rate versus reactant exposure during AlN ALE at 275° C.
Figure 8B:
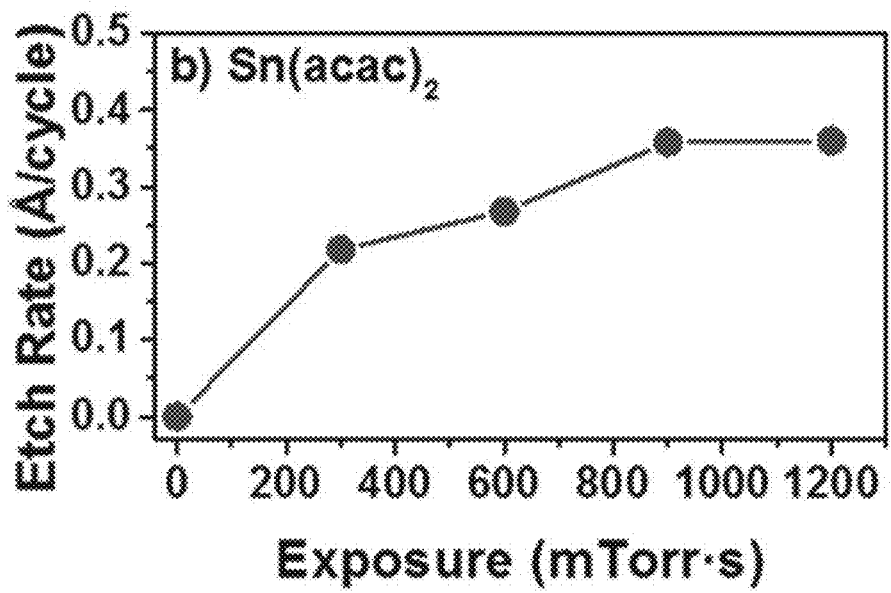

FIGS. 8A-8B investigate the self-limiting nature of the HF and Sn(acac)$_2$ reactions during the AlN ALE reactions at 275° C. Etch rates were determined by varying one reactant exposure while keeping the other reactant exposure constant. FIG. 8A depicts the self-limiting behavior of the HF reaction with a Sn(acac)$_2$ exposure of 900 mTorr·s defined by a Sn(acac)$_2$ exposure time of 10 s and a Sn(acac)$_2$ pressure of 90 mTorr. The HF exposures were changed from 254 to 1730 mTorr·s using an HF exposure time of 10 s and different HF pressures. The reaction chamber was purged with 80 sccm of UHP nitrogen at a pressure of 840 mTorr for 130 seconds after each reactant exposure.

FIG. 8A illustrates that smaller etch rates were observed for low HF exposures when the surface has not yet formed a saturated fluoride layer thickness. After an exposure of 966 mTorr·s, the fluorination by HF had reached self-limiting conditions and the etch rate was about 0.36 Å/cycle. Without wishing to be limited by any theory, the slight increase of the etch rate at an HF exposure of 1730 mTorr·s can be caused by chemical vapor etching (CVE). HF has a long residence time in the reaction chamber and purge times over 10 minutes are needed to remove HF completely from the reactor after large HF exposures.

Figure 4A:
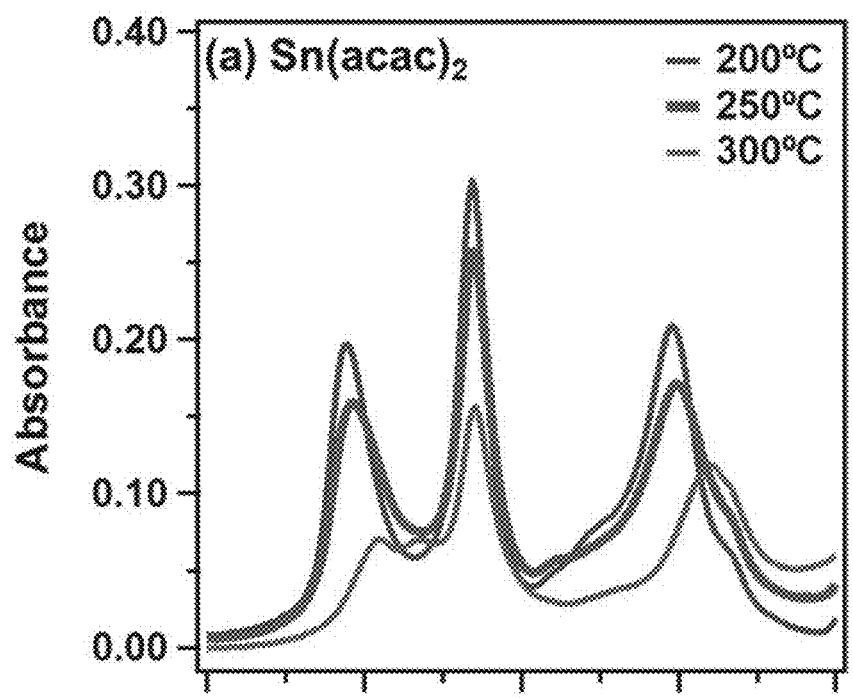
FIGS. 4A-4B illustrate the absorbance for the acetylacetonate (acac) vibrations at three different temperatures after either the (FIG. 4A) $Sn(acac)_2$ or (FIG. 4B) HF reactions. The absorbance for the acac features decreases progressively at higher temperatures and is higher after the $Sn(acac)_2$ exposures.
Figure 4B:
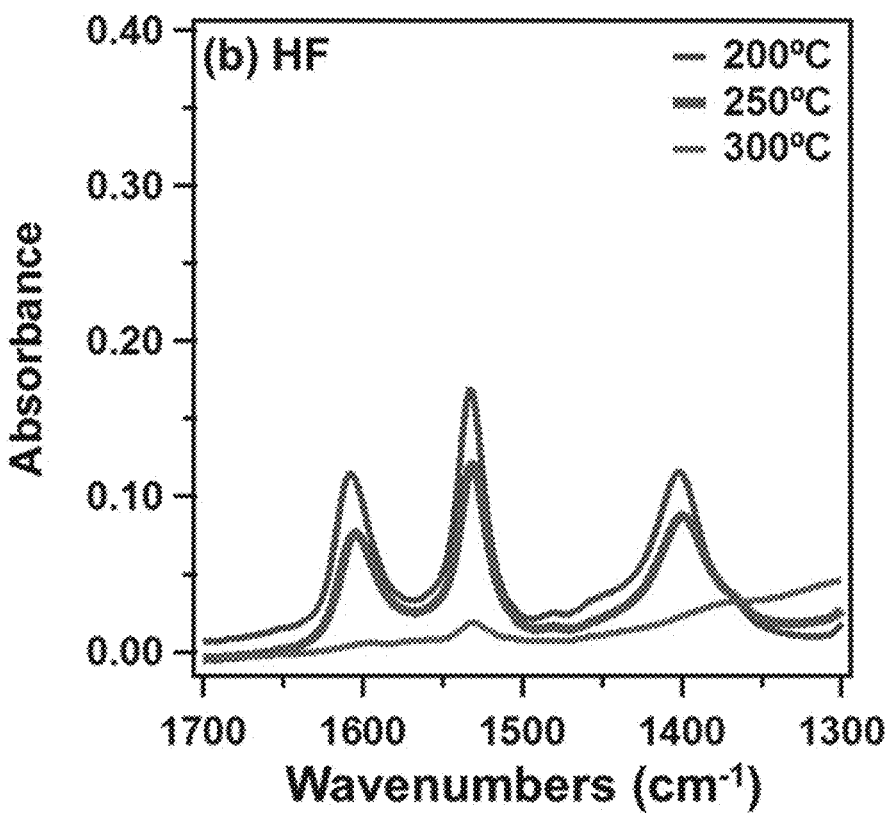

FIG. 8B demonstrates the self-limiting nature of the Sn(acac)$_2$ reaction. Sn(acac)$_2$ exposures were varied while HF exposures were held constant at an exposure of 1270 mTorr·s defined by a HF exposure time of 10 s and a HF pressure that varied between 140-110 mTorr. The Sn(acac)$_2$ exposures were varied from 300 to 1200 mTorr·s using an exposure time of 10 s and different Sn(acac)$_2$ pressures. The etch rate slowly increased with Sn(acac)$_2$ exposure until reaching an etch rate of about 0.36 Å/cycle at an Sn(acac)$_2$ exposure of 900 mTorr·s. At this point, the Sn(acac)$_2$ reaction was self-limiting. FIGS. 4A-4B illustrate self-limiting behavior with an AlN etch rate of about 0.36 Å/cycle.

Figure 9:
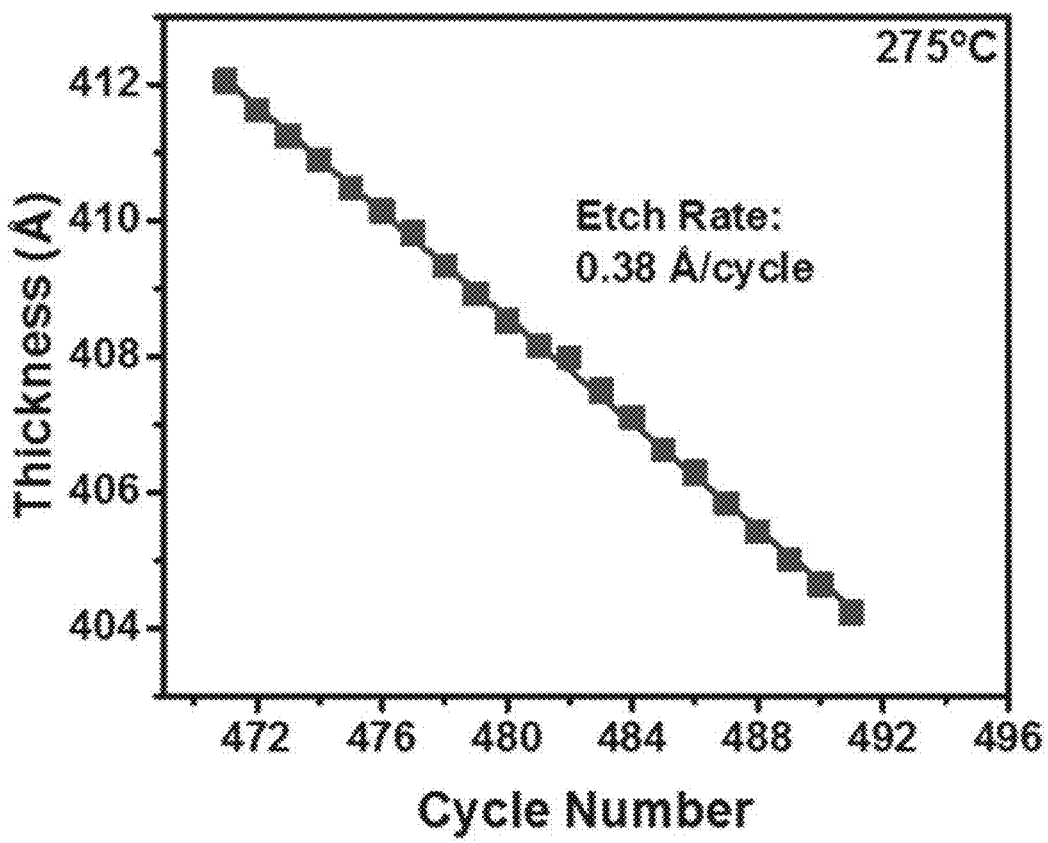
FIG. 9 is a graph illustrating film thickness versus number of AlN ALE reaction cycles at 275° C. in the pure AlN region of the AlN film. The change of thickness versus number of AlN ALE reaction cycles yields an etch rate of 0.38 Å/cycle.

FIG. 9 illustrates an expansion of a section of FIG. 6 for twenty-one AlN ALE reaction cycles corresponding to reaction cycles #471-491. The change in AlN thickness versus number of ALE reaction cycles was linear. The measured etch rate of 0.38 Å/cycle is consistent with the etch rate of about 0.36 Å/cycle determined by the self-limiting studies displayed in FIGS. 8A-8B. Experiments were performed for AlN ALE at 275° C.; the measured etch rates varied from 0.34 Å/cycle to 0.38 Å/cycle and the majority of the individual measurements yielded an etch rate of 0.36 Å/cycle.

Without wishing to be limited by any theory, a possible reaction mechanism for thermal AlN ALE is similar to the reaction mechanism proposed for $Al_2O_3$ ALE and $HfO_2$ ALE. During the HF exposure, the HF fluorinates the AlN film and produces an $AlF_3$ layer on the surface. $AlF_3$ is a very stable metal fluoride with a sublimation point at 1291° C. The metal precursor, $Sn(acac)_2$, then accepts fluorine from the $AlF_3$ layer and transfers an acac ligand to the $AlF_3$ layer in a ligand-exchange reaction. Without wishing to be limited by any theory, this ligand-exchange process can occur via a four-center transition state. For AlN ALE using HF and $Sn(acac)_2$, this four-center transition state would be defined by F and acac ligands bridging between the Sn and Al metal centers. The probable reaction products of the ligand-exchange process are SnF(acac) and either $AlF(acac)_2$ or $Al(acac)_3$ as volatile etch products.

The effect of $H_2$ plasma exposure on thermal AlN ALE was also examined using in situ SE analysis. During the $H_2$ plasma experiments, the reactant exposures and purge times were the same as the reactant exposures and purge times used for thermal ALE. The $H_2$ plasma exposure was added after each $Sn(acac)_2$ exposure. The $H_2$ plasma was an inductively coupled plasma (13.56 MHz) and was located approximately 3-4 cm above the AlN sample. The $H_2$ plasma with a power of 100 W was generated at a $H_2$ pressure of 40 mTorr and exposed to the surface for 15 seconds. After the $H_2$ plasma exposure, the chamber was purged for 60 seconds with the same conditions as used for the HF and $Sn(acac)_2$ reactants.

Figure 10:
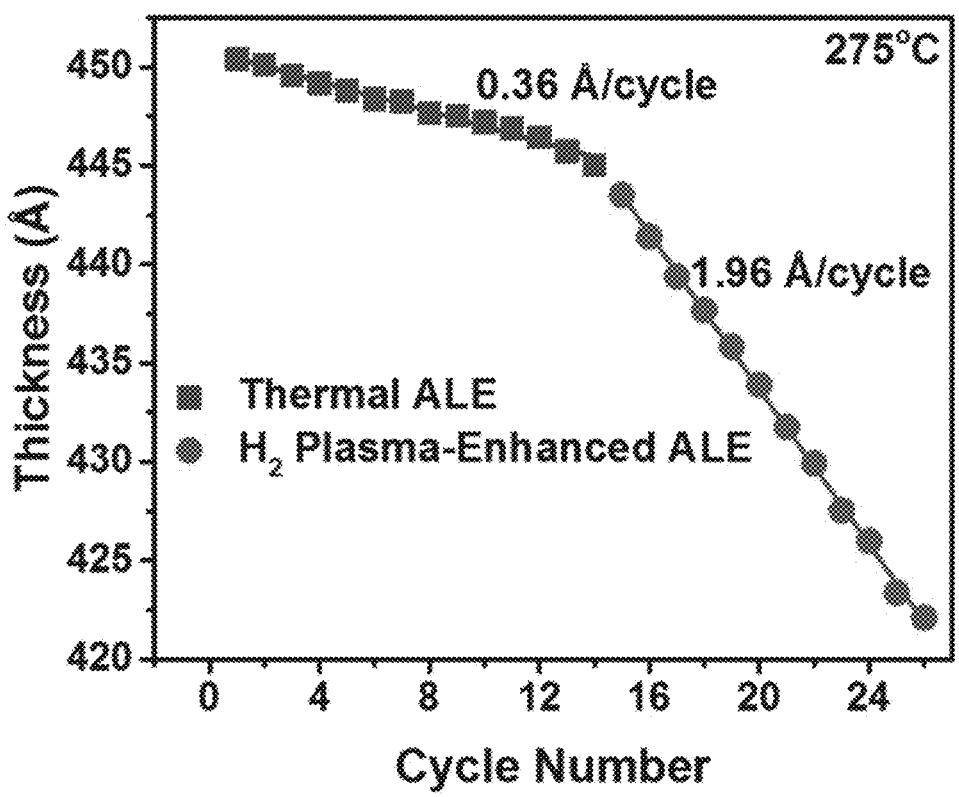
FIG. 10 is a graph illustrating film thickness versus number of AlN ALE reaction cycles at 275° C. in the pure AlN region of the AlN film showing the results for thermal AlN ALE and $H_2$ plasma-enhanced ALE. The $H_2$ plasma increased the AlN etch rate from 0.36 Å/cycle to 1.96 Å/cycle.

FIG. 10 illustrates the effect of adding the $H_2$ plasma exposure after the $Sn(acac)_2$ exposure during each thermal ALE reaction cycle. These thickness measurements were performed in the pure AlN region of the AlN film. The etch rate increased from 0.36 Å/cycle for thermal ALE to 1.96 Å/cycle for $H_2$ plasma-enhanced thermal ALE. Without wishing to be limited by any theory, this large increase in the etch rate can be attributed to the removal of acac surface species by H radicals from the $H_2$ plasma. Acac surface species may block surface sites during thermal ALE and limit the etching. Removal of these blocking species can allow for more HF to fluorinate the surface and, subsequently, for more ligand-exchange with $Sn(acac)_2$. Additionally, heat released by recombination of H radicals may facilitate desorption of the acac surface species. The $H_2$ plasma by itself did not etch the AlN film, unless the $H_2$ plasma was used in conjunction with the thermal ALE reaction cycles.

Figure 11:
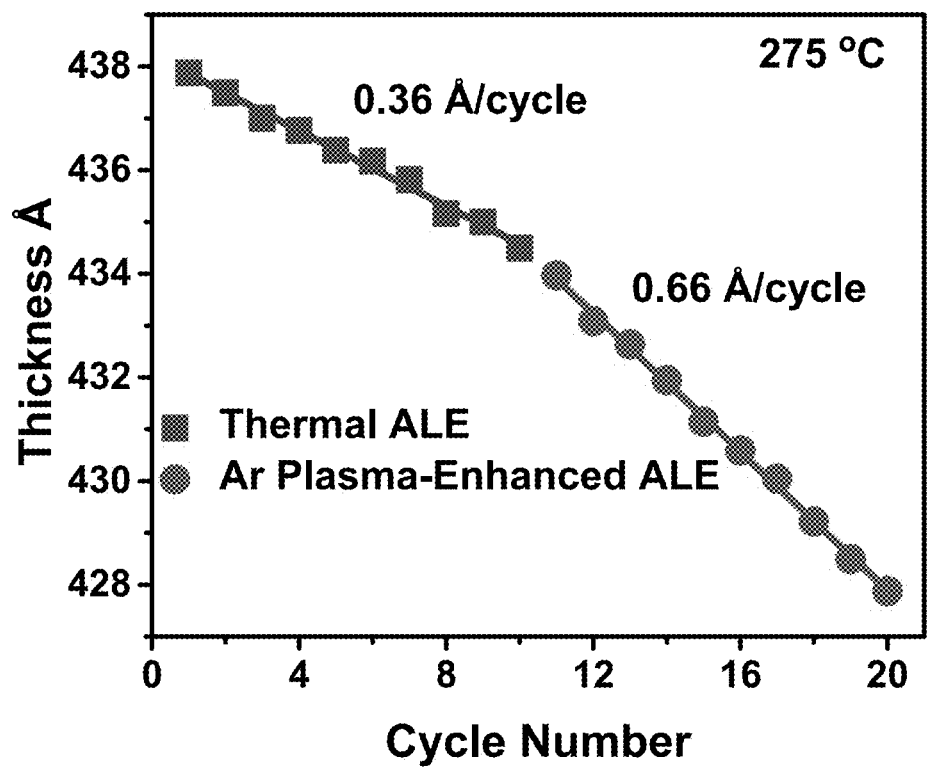
FIG. 11 is a graph illustrating film thickness versus number of AlN ALE reaction cycles at 275° C. in the pure AlN region of the AlN film showing the results for thermal AlN ALE and Ar plasma-enhanced ALE. The Ar plasma increased the AlN etch rate from 0.36 Å/cycle to 0.66 Å/cycle.

Similar experiments were performed using an argon plasma exposure instead of the $H_2$ plasma exposure. The Ar plasma with a power of 100 W was generated at an Ar pressure of 40 mTorr and exposed to the surface for 15 seconds. After the Ar plasma exposure, the chamber was purged for 60 seconds with the same conditions as used for the HF and $Sn(acac)_2$ reactants. The results for these experiments are shown in FIG. 11. In this case, the etch rate for AlN ALE increased from 0.36 Å/cycle for thermal ALE to 0.66 Å/cycle for the plasma-enhanced thermal ALE. Because the Ar plasma is not a source of reactive radicals, the increase in the etch rate for AlN ALE from the Ar plasma indicates that radiation or ions produced by the Ar plasma may be enhancing the AlN ALE. The Ar plasma did not change the AlN film thickness, unless the Ar plasma was employed together with the thermal ALE reaction cycles.

The enhancement of the etch rate for AlN ALE by the Ar plasma indicates that ions or radiation may be playing a role in the process. Without wishing to be limited by any theory, the ions from inductively coupled plasmas typically have energies <50 eV and, in certain embodiments, can desorb the acac surface species that may limit the etching. Ar plasmas also have a variety of optical emission lines at wavelengths <200 nm that have photon energies larger than the bandgap at about 6.2 eV. In certain embodiments, these photons can photodesorb acac surface species or excite electron/hole pairs by bandgap excitation that may lead to desorption. Optical emission from the $H_2$ plasma may also be adding to the effect of H radicals on thermal AlN ALE.

As demonstrated herein, the thermal ALE of crystalline AlN was performed using sequential, self-limiting HF and $Sn(acac)_2$ reactions. This is the first demonstration of the thermal ALE of a metal nitride, and the first report of the thermal ALE of a crystalline III-V material. At self-limiting reaction conditions, the etch rate for AlN ALE was 0.36 Å/cycle at 275° C. $H_2$ or Ar plasma exposures increased the AlN etch rate to 1.96 Å/cycle or 0.66 Å/cycle, respectively. In certain embodiments, other crystalline III-V metal nitrides, such as GaN and InN, can be etched using HF and $Sn(acac)_2$. In certain embodiments, thermal ALE and plasma-enhanced thermal ALE can be used to etch important materials for advanced semiconductor manufacturing.

Example 4: Anisotopic Etching and Enhanced Thermal ALE

Thermal ALE can be combined with low energy, directional ion, radical, photon or electron bombardment to obtain anisotropic etching. With hybrid etching approaches using thermal ALE and directional ion, radical, photon or electron bombardment, new processing procedures can be defined that exploit the advantages of both thermal ALE and ion, radical, photon or electron-induced surface processes. The ion energies during ion-enhanced ALE are typically 5-20 eV, which are below the threshold energy of about 25 eV that yields ion sputtering of silicon.

In the hybrid approach using ions, the ion energies may be <25 eV because the ions are not required to remove surface material. Much lower energy ions can be effective because these ions can desorb more weakly bound surface species that may be limiting the thermal ALE. For example, acac surface species are present during $Al_2O_3$ ALE after the HF and $Sn(acac)_2$ exposures. The etching rates vary inversely with the acac surface coverage. By desorbing the acac species with low energy ions, the etching rates can be increased substantially at lower temperatures at the highest acac surface coverages.

Figure 12:
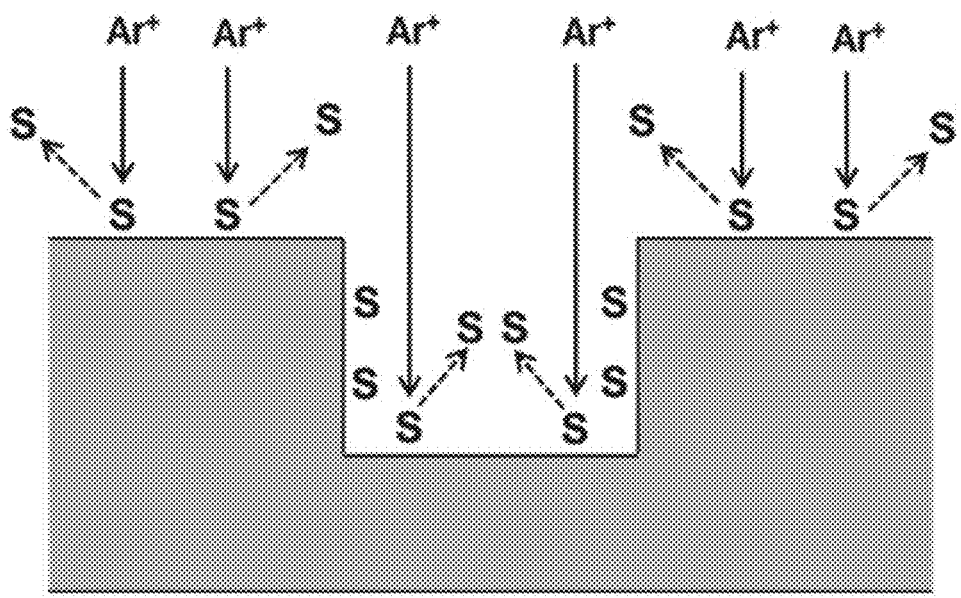
FIG. 12 illustrates directional ion removal of surface species, S, that act to limit the thermal ALE as described in Example 4. Surface species on the trench wall were not removed and produced anisotropy during thermal ALE.

FIG. 12 illustrates the ion desorption of surface species that can be impacted by directional ions. Surface species on the side walls of the high aspect ratio feature are not desorbed by the directional ions, but limit the thermal ALE and produce anisotropic etching. In certain embodiments, radicals, photons or electrons can also enhance thermal ALE. In other embodiments, radicals alter or remove surface species, such as acac, that are present during thermal ALE and limit the thermal etching rate. In yet other embodiments, radicals, photons or electrons provide a certain amount of anisotopic etching depending on their directionality.

Example 5: Growth/Etch Back Experiments for Thermal $SiO_2$ ALE

"Growth/etch" back experiments were performed for thermal $SiO_2$ ALE. These experiments studied the effect of growing and etching back an $Al_2O_3$ ALD film on a $SiO_2$ layer. A schematic illustrating these experiments is shown in FIG. 13. Without wishing to be limited by any theory, the $Al_2O_3$ ALD film on the $SiO_2$ layer can form an aluminum silicate interlayer, which etched much more easily than the $SiO_2$ layer by itself.

Etching experiments on $SiO_2$ films on silicon wafers were conducted in a hot wall, viscous flow reactor. Ellipsometer measurements were used to determine the $SiO_2$ film thickness versus number of growth/etch back cycles. $SiO_2$ films had an initial thickness of about 50 Å. One growth/etch back cycle consisted of 8 cycles of $Al_2O_3$ ALD followed by 10 cycles of ALE etching with TMA and HF.

The $Al_2O_3$ ALD was performed using TMA (97%, Sigma-Aldrich) and $H_2O$ at 300° C. ALE was performed using TMA (97%, Sigma-Aldrich) and HF-pyridine (70 wt % HF, Sigma-Aldrich) at 300° C. The following procedure was used for both reactants in ALD (TMA and $H_2O$) and ALE (TMA and HF). A 2 s "pseudo-static" reactant exposure was preceded by a 20 s static reactant exposure. "Pseudo-static" indicates that there was some pumping during this reactant exposure to remove most of the reaction products. After each reactant exposure, a 20-sec viscous purge with ultra-high purity $N_2$ gas (1.4 Torr) removed any excess reactants or reaction byproducts. Five $N_2$ purge cycles (2 s $N_2$ fill to 1.4 Torr followed by a 15 s purge) ensured the removal of excess reactant. The TMA pressure during ALD and ALE was 0.25-0.3 Torr and the TMA exposure was about 6 Torr s. The $H_2O$ pressure was about 0.75 Torr and the $H_2O$ exposure was about 11 Torr s. The HF pressure was about 0.4 Torr and the HF exposure was about 8.8 Torr s. Ellipsometer measurements were recorded after 3, 5, and 10 growth/etch back cycles.

Figure 14:
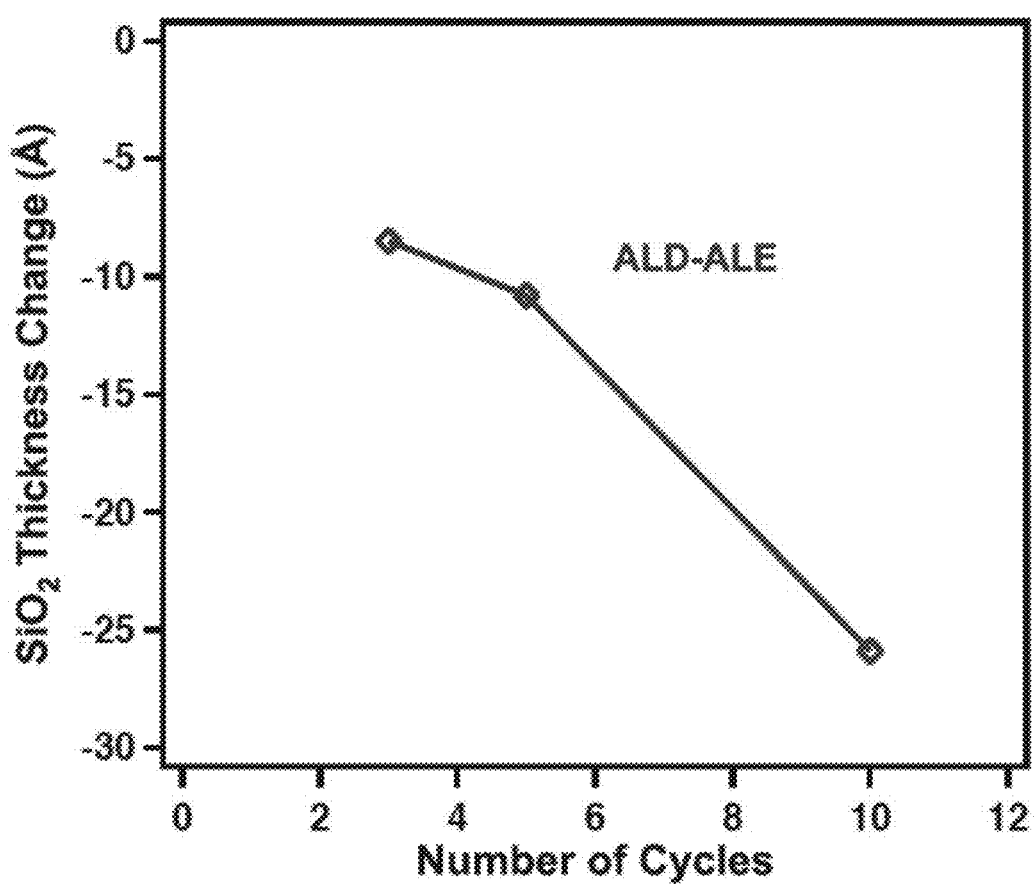
FIG. 14 shows the $SiO_2$ thickness change versus number of "growth/etch back cycles at 300° C. For each "growth/etch back" cycle, $Al_2O_3$ was deposited by 8 cycles of $Al_2O_3$ ALD using TMA and $H_2O$. The etching was then performed by 10 cycles of HF and TMA.

The results for these growth/etch back experiments are shown in FIG. 14. The $SiO_2$ film was progressively reduced from a starting thickness of 50 Å to thinner thicknesses. FIG. 14 illustrates the thickness difference from the starting thickness of 50 Å. Under these reaction conditions, the $SiO_2$ film was etched at a rate of −2.6 Å/cycle.

Experiments were also performed in another reactor equipped with an FTIR spectrometer. The in situ transmission FTIR measurements were conducted on high surface area Si nanoparticles that contained a $SiO_2$ layer on their surfaces. The large surface area provided by the Si nanoparticles improved the signal-to-noise ratio for observing the infrared absorption by the $SiO_2$ layer on the Si nanoparticles and the $Al_2O_3$ ALD film on the $SiO_2$ layer.

Figure 15B:
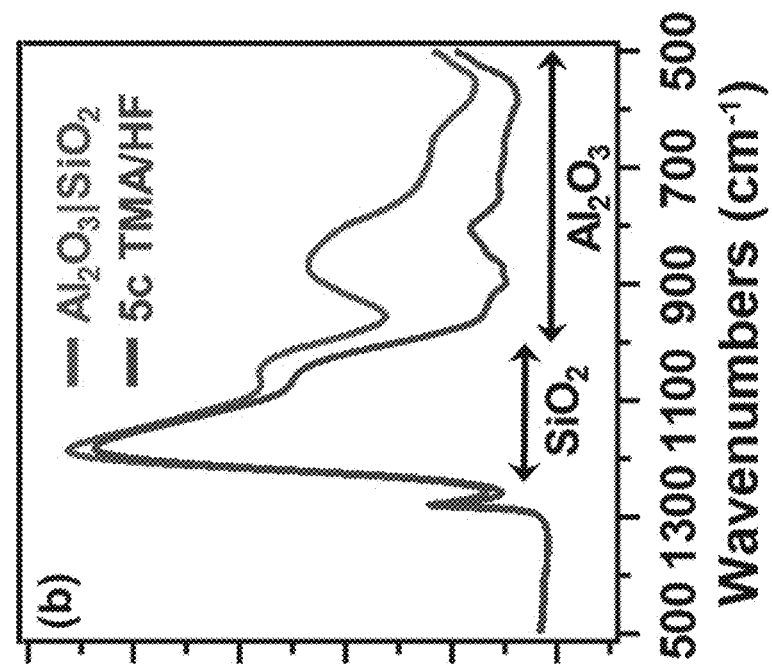
FIGS. 15A-15B comprise graphs illustrating IR absorbance for the experiments depicted in FIG. 13.
Figure 15A:
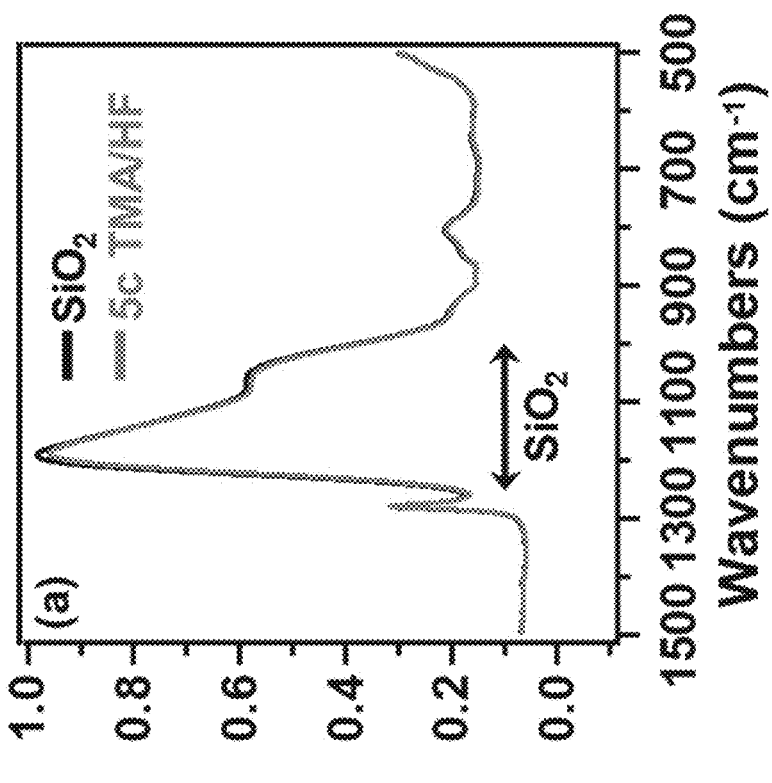

FIG. 15A shows the infrared absorbance after the TMA/HF ALE process on the Si|$SiO_2$ nanoparticles. The Si|$SiO_2$ nanoparticles were subjected to alternating exposures of TMA (97%, Sigma-Aldrich) and HF derived from HF-pyridine (70 wt % HF, Sigma-Aldrich) at 300° C. Both the TMA and HF exposures were about 1.0 Torr s with each exposure separated by a 240 s purge. The $SiO_2$ layer absorbed infrared radiation between 1000-1300 cm$^{-1}$. There was little loss of absorbance after 5 cycles of TMA/HF.

In a second set of experiments, 5 cycles of $Al_2O_3$ ALD were first grown on the $SiO_2$ nanoparticles. The $Al_2O_3$ ALD was performed using TMA (97%, Sigma-Aldrich) and $H_2O$ (Chromasolv for HPLC, Sigma-Aldrich) at 150° C. The TMA exposures were about 1.0 Torr s and the $H_2O$ exposures were 0.75 Torr s. Each exposure was separated by a 180 s purge to remove excess reactant and reaction byproducts from the chamber. A constant flow of 100 sccm of ultra-high purity (UHP) $N_2$ gas was delivered into the reactor during the $Al_2O_3$ ALD reactions. The infrared absorbance from the $Al_2O_3$ ALD film on the $SiO_2$ layer is illustrated in FIG. 15B. The deposited $Al_2O_3$ ALD layer absorbed infrared radiation between 500-1000 cm$^{-1}$.

The $Al_2O_3$ ALD layer grown on the Si|$SiO_2$ nanoparticles was subsequently subjected to alternating exposures of TMA and HF derived from HF-pyridine at 300° C. Both the TMA and HF exposures were about 1.0 Torr s with each exposure separated by a 240 s purge. FIG. 15B illustrates that the absorbance from the $Al_2O_3$ ALD layer was dramatically reduced after 5 cycles of TMA/HF. In addition, there was also a noticeable decrease in the absorbance from the $SiO_2$ layer after 5 cycles of TMA/HF.

Figure 16:
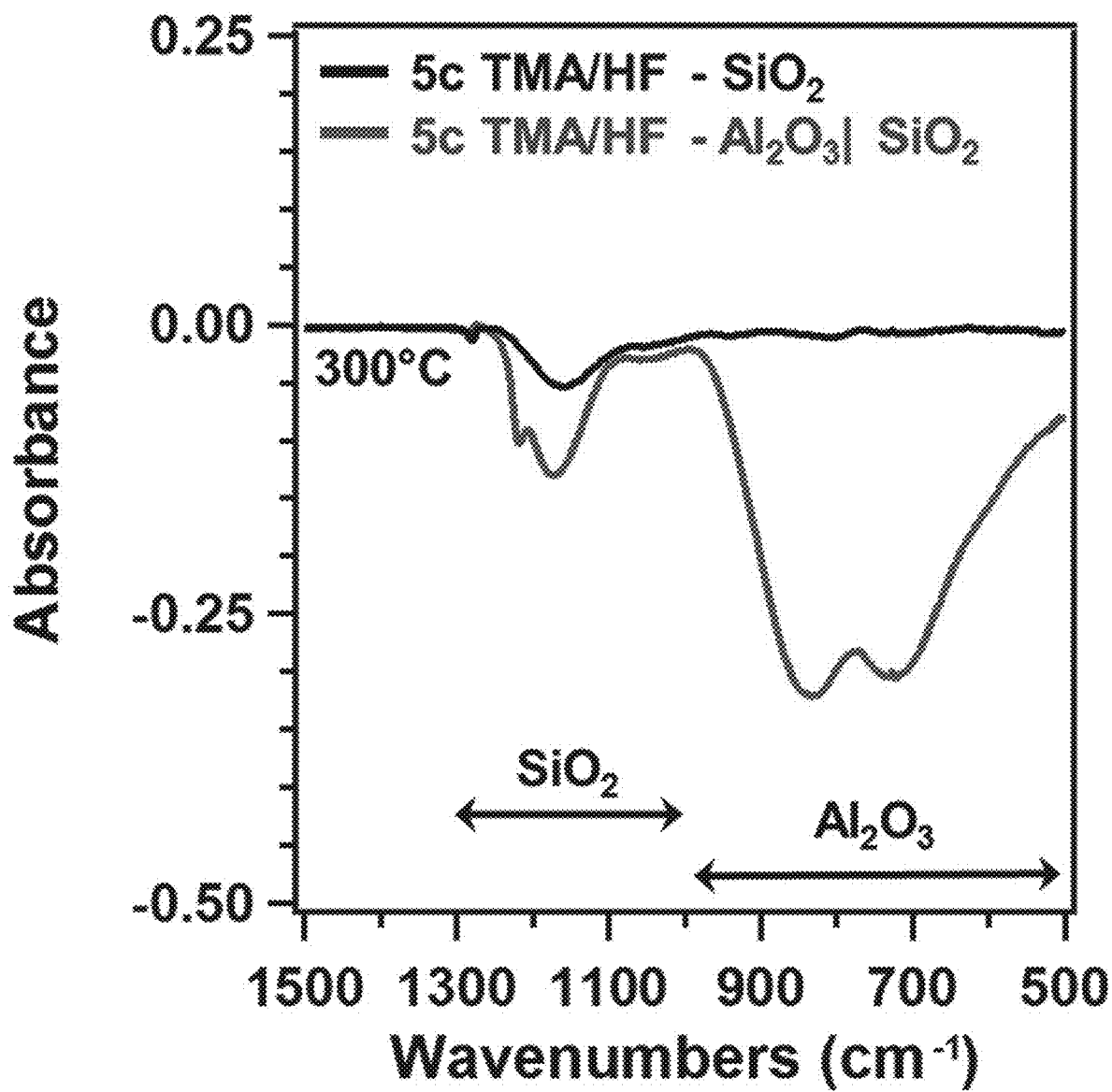
FIG. 16 comprises graphs illustrating difference spectra obtained from the spectra before and after the 5 cycles of TMA/HF, as illustrated in FIGS. 15A-15B.

To accentuate the differences between the TMA/HF exposures on the $SiO_2$ layer and the $Al_2O_3$ ALD film on the $SiO_2$ layer, difference spectra were obtained from the spectra before and after the 5 cycles of TMA/HF in FIGS. 15A-15B. FIG. 16 illustrates these difference spectra. The removal of the $Al_2O_3$ ALD film led to a large negative absorbance feature between 500-1000 cm$^{-1}$. In addition, there was a negative absorbance feature between 1000-1300 cm$^{-1}$ that is consistent with the removal of some of the $SiO_2$ layer.

The negative absorbance between 1000-1300 cm$^{-1}$ shows that the TMA/HF etching process can remove $SiO_2$ more effectively when the $Al_2O_3$ ALD film is initially present on the $SiO_2$ layer. In contrast, very little $SiO_2$ was etched without the initial $Al_2O_3$ ALD film. These results indicate that an aluminum silicate at the $Al_2O_3$|$SiO_2$ interface may enhance the etching of the $SiO_2$ layer. In certain embodiments, the aluminum silicate forms from diffusion of the $Al_2O_3$ ALD film into the underlying $SiO_2$ layer. In other embodiments, the aluminum silicate has a much higher etching rate than the $SiO_2$ layer by itself.

Example 6: Conversion/Etch Experiments for Thermal $SiO_2$ ALE

"Conversion/etch" experiments were also performed to demonstrate $SiO_2$ ALE. In these experiments, a film, such as $Al_2O_3$, is not deposited prior to etching. Instead, only one molecular precursor exposure is used to convert the surface of the substrate to a different material. The molecular precursor can be the second metal precursor or a different metal precursor. This conversion reaction facilitates the etching when used in conjunction with a fluorination precursor.

X-ray reflectivity and ellipsometry measurements were used to determine the $SiO_2$ film thickness versus number of conversion/etch cycles. In these experiments, the $SiO_2$ films had an initial thickness of 400 Å on Si(100) wafers. One conversion/etch cycle comprised one static TMA pulse followed by one static HF pulse, with $N_2$ gas purging in between the reactant exposures. ALE was performed using TMA (97%, Sigma-Aldrich) and HF-pyridine (70 wt % HF, Sigma-Aldrich) at 300° C.

The following conditions were used for the TMA and HF exposures during the conversion/etch cycle. A 2 s "pseudo-static" reactant exposure preceded a 20 s static reactant exposure. After the reactant exposure, a 120 s viscous purge with ultra-high purity $N_2$ gas (~2 Torr) removed any excess reactants or reaction byproducts. The TMA pressure during the conversion/etch was varied between 0.1-4.0 Torr. The HF pressure was also varied between 0.1-4.0 Torr. Ellipsometer measurements were recorded after various numbers of conversion/etch cycles.

Figure 17:
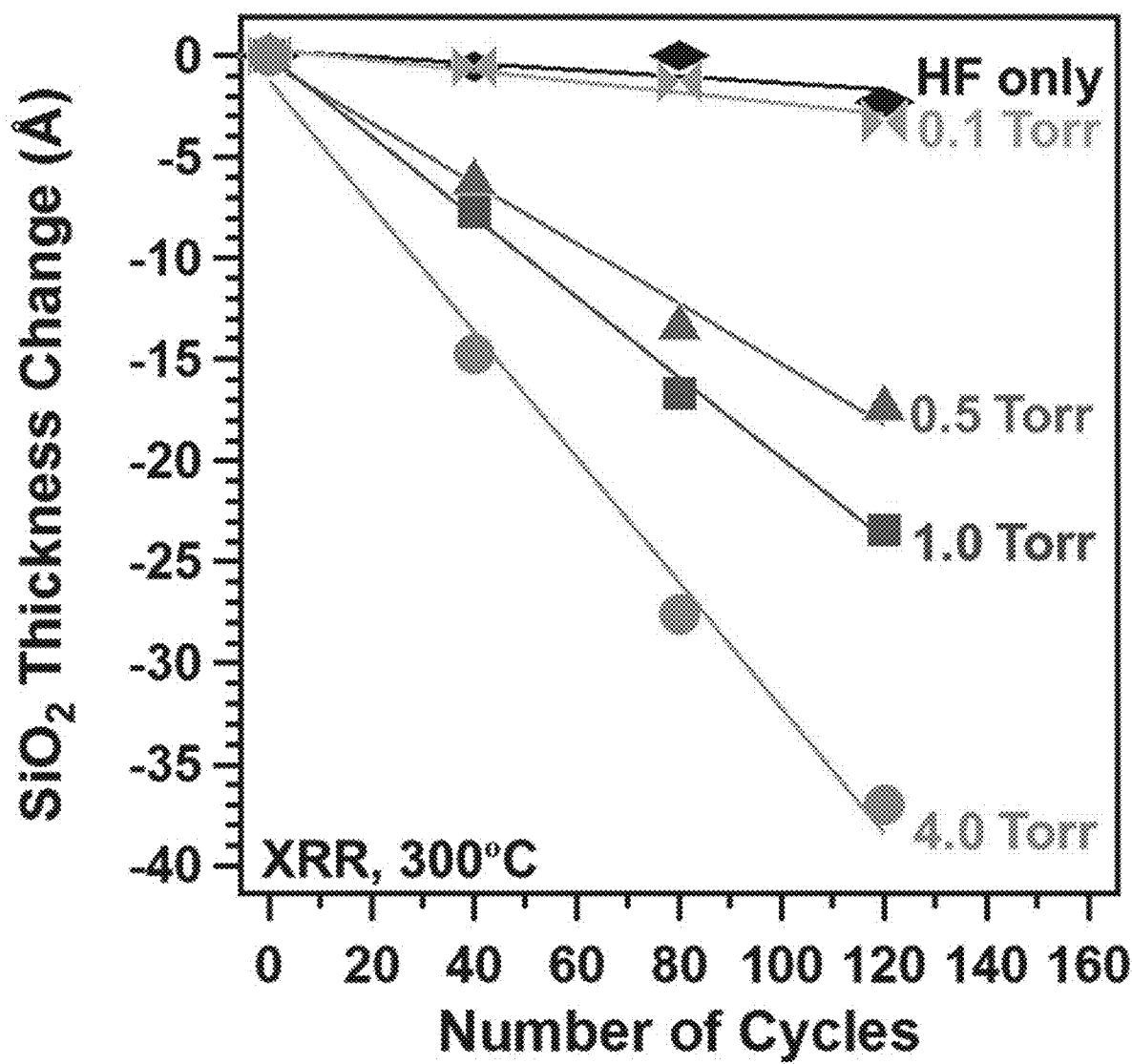
FIG. 17 illustrates results for an "conversion/etch" experiment as described in Example 6, and shows the $SiO_2$ thickness change versus number of $Al(CH_3)_3$ and HF cycles at 300° C. for reactant pressures of 0.1, 0.5, 1.0 and 4.0 Torr. Control experiments were also performed using HF by itself and sequential cycles of $H_2O$ and HF by themselves.

The results for these conversion/etch experiments measured using x-ray reflectivity measurements are shown in FIG. 17. Similar results were obtained using ellipsometry measurements. The $SiO_2$ film was progressively reduced versus number of conversion/etch cycles. FIG. 17 illustrates the thickness difference from the starting thickness of 400 Å. The etch rates increase with higher TMA and HF pressures. Under these reaction conditions, the $SiO_2$ film is etched at a rate of 0.027, 0.15, 0.20 and 0.31 Å/cycle for reactant pressures of 0.1, 0.5, 1.0 and 4.0 Torr, respectively.

FIG. 17 also illustrates control experiments using only HF exposures without the TMA exposures. X-ray reflectivity and ellipsometer measurements were again used to determine the $SiO_2$ film thickness versus number of HF-only exposures. Negligible etching was observed using only HF exposures. Additional control experiments were performed using HF and $H_2O$ exposures. Ellipsometer measurements were used to determine the $SiO_2$ film thickness versus number of reaction cycles. One $H_2O$—HF cycle consisted of one static $H_2O$ pulse followed by one static HF pulse, with $N_2$ gas purging in between reactant exposures. For $H_2O$ and HF pressures of ~1 Torr, negligible etching was observed by only HF and $H_2O$ exposures. Both the TMA and HF exposures were needed to obtain the $SiO_2$ ALE.

In situ FTIR measurements were also conducted in a reactor equipped with an FTIR spectrometer to study the effect trimethylaluminum (TMA) and hydrogen fluoride (HF) exposures on a $SiO_2$ substrate. The transmission FTIR measurements were again performed on high surface area Si nanoparticles with a native $SiO_2$ layer. The large surface area provided by the nanopowder substrate improved the signal-to-noise ratio for infrared absorption.

Figure 18:
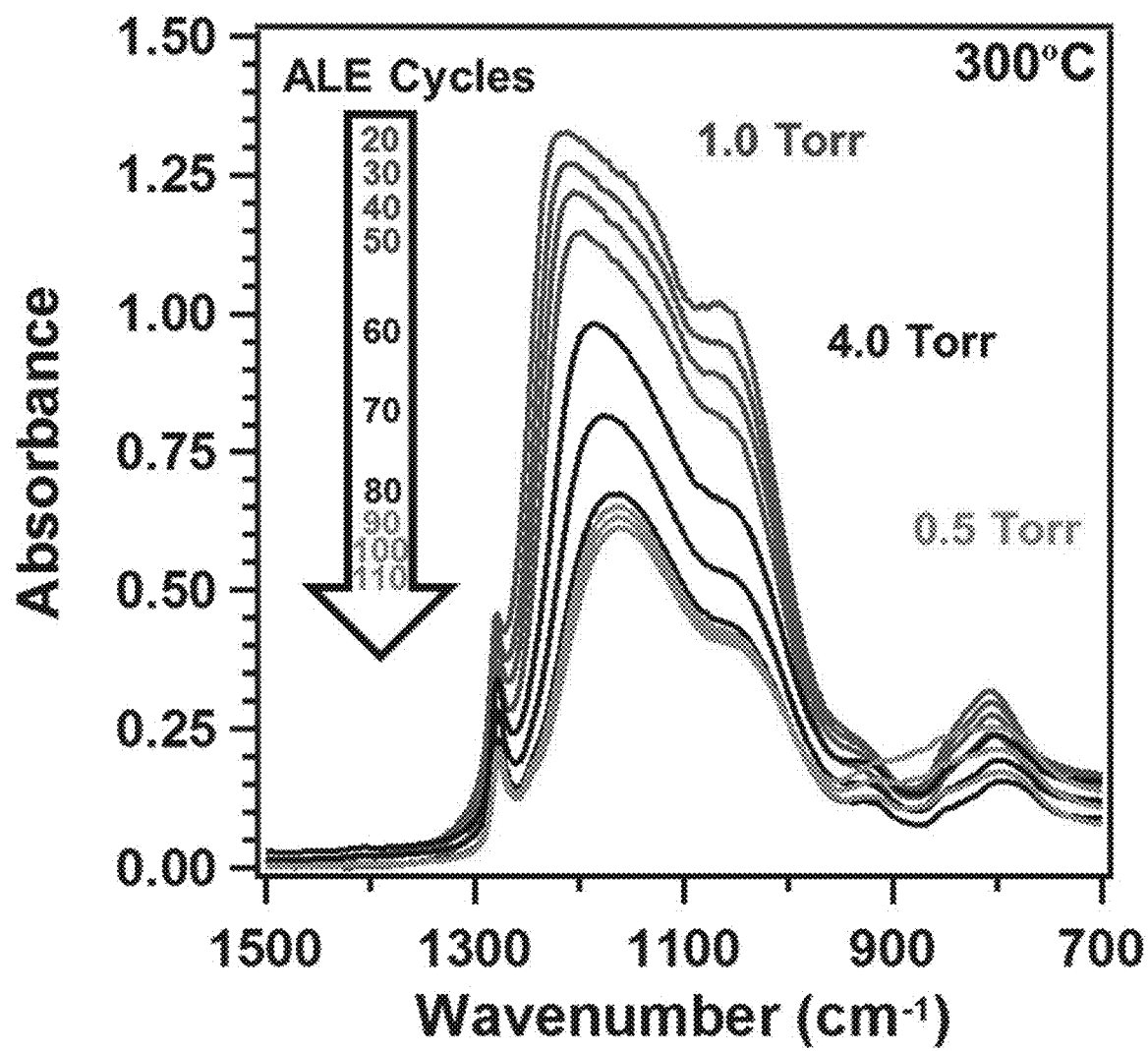
FIG. 18 illustrates loss of absorbance for the Si—O stretching vibration in a $SiO_2$ film versus number of $Al(CH_3)_3$ and HF cycles at 300° C. for reactant pressures of 0.5, 1.0 and 4.0 Torr.

The Si|$SiO_2$ nanoparticles were subjected to alternating static exposures of TMA (97%, Sigma-Aldrich) and HF derived from HF-pyridine (70 wt % HF, Sigma-Aldrich) at 300° C. Both the TMA and HF exposures were held for 30 s with each exposure separated by a 240 s purge of UHP nitrogen. FIG. 18 illustrates the effect of the TMA/HF ALE process on the Si|$SiO_2$ nanoparticles for reactant pressures of 0.5, 1.0 and 4.0 Torr. These absolute FTIR spectra were recorded after the TMA exposures. The $SiO_2$ layer absorbs infrared radiation between 1000 and 1300 $cm^{-1}$. The absorbance feature from the Si—O stretching vibrations decreases progressively with TMA/HF ALE cycles which is consistent with the etching of the $SiO_2$ layer. The $SiO_2$ etching is larger at the higher reactant exposures.

Figure 19:
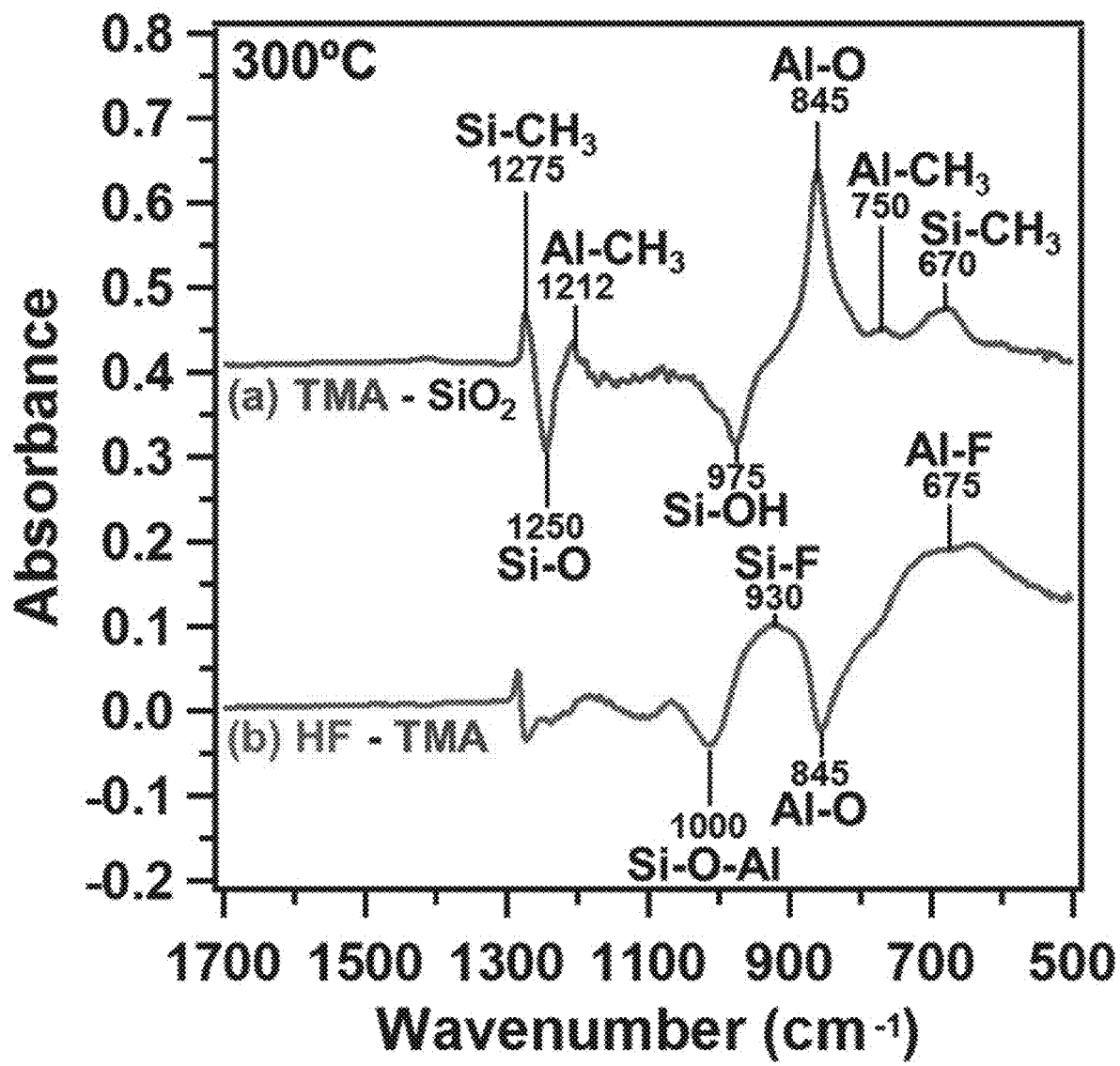
FIG. 19 illustrates difference infrared absorbance spectra from 500-1700 $cm^{-1}$ during the first TMA and HF exposures on $SiO_2$ at 300° C. (a) illustrates a spectrum after the first TMA exposure referenced to a spectrum for the initial $SiO_2$ layer on the silicon particles. (b) illustrates a spectrum after the first HF exposure referenced to a spectrum after the first TMA exposure.

Difference infrared spectra were also recorded to observe the changes on the surface during the TMA and HF exposures. FIG. 19A shows the difference spectra after the first TMA exposure. This difference spectra reveals the loss of Si—O absorbance features and growth of Al—O, Al—$CH_3$ and Si—$CH_3$ absorbance features. These changing absorbance features with TMA exposures indicate that the $SiO_2$ surface is converted to $Al_2O_3$ or an aluminasilicate by TMA. A possible conversion reaction with $Si(CH_3)_4$ as a reaction product is $3SiO_2+4Al(CH_3)_3 \rightarrow 2Al_2O_3+3Si(CH_3)_4$. FIG. 19B shows the difference spectra after the first HF exposure. This difference spectra reveals the growth of Al—F and Si—F absorbance features and loss of Al—O and Si—O—Al absorbance features. These changing absorbance features with HF exposure indicate that $Al_2O_3$ or aluminosilicate features are fluorinated by HF.

Figure 20:
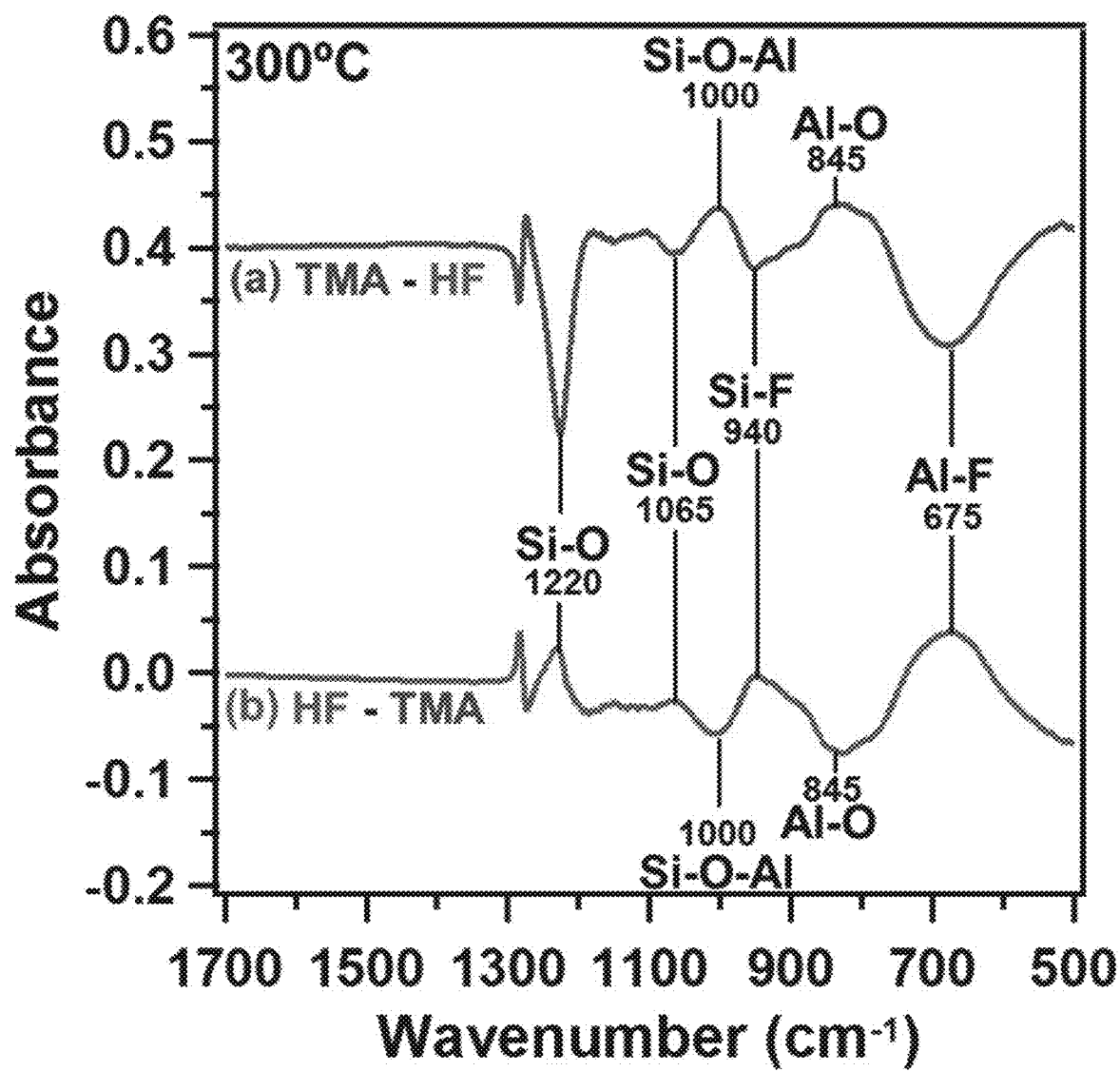
FIG. 20 illustrates difference infrared absorbance spectra from 500-1700 $cm^{-1}$ during the $6^{th}$ ALE cycle at 300° C. (a) illustrates a spectrum after the first $6^{th}$ TMA exposure referenced to the spectrum after the $5^{th}$ HF exposure. (b) illustrates a spectrum after the first $6^{th}$ HF exposure referenced to a spectrum after the $6^{th}$ HF exposure.
Figure 21:
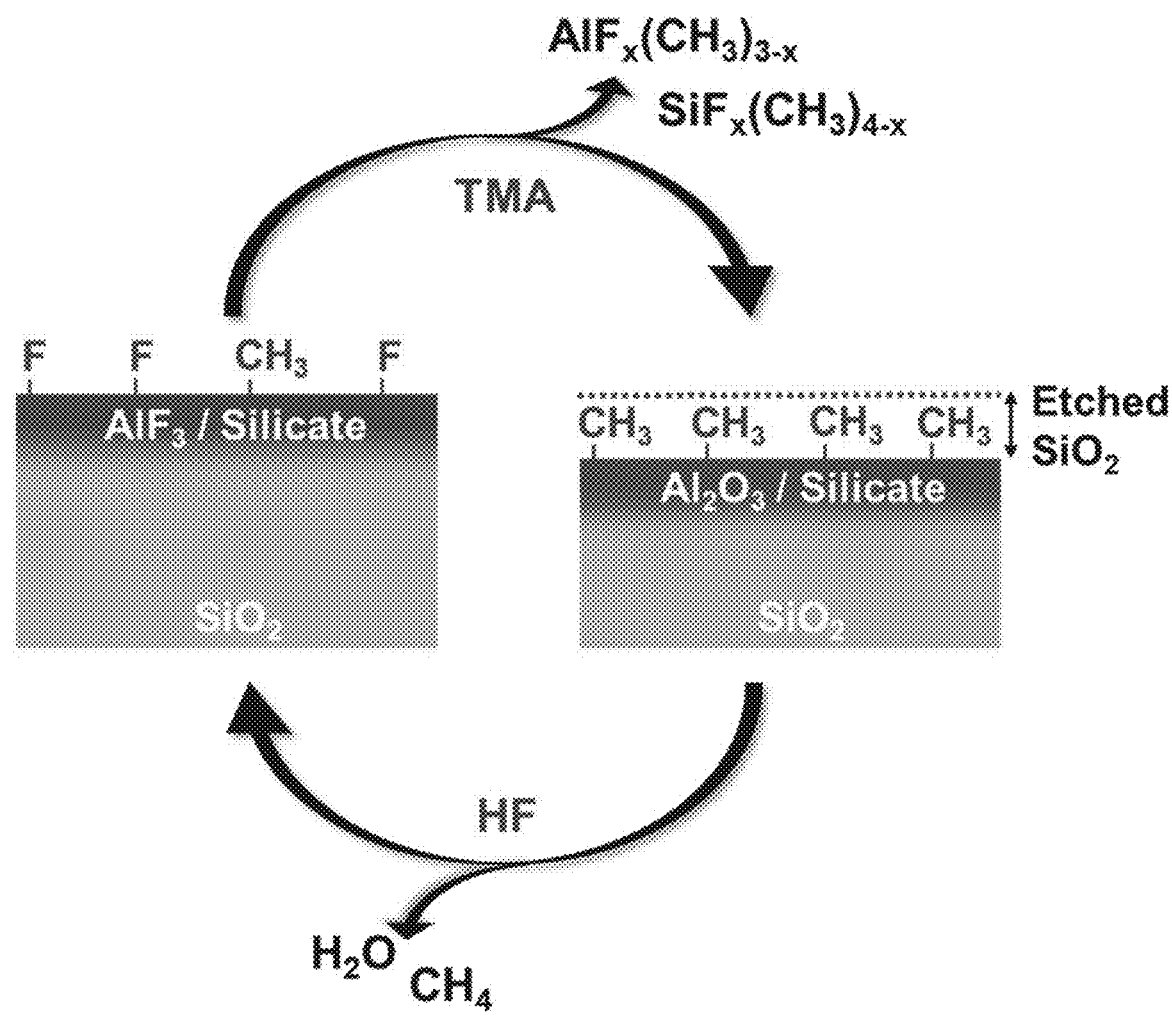
FIG. 21 displays the schematic of the proposed reaction mechanism for $SiO_2$ ALE showing the sequential TMA and HF reactions.

FIG. 20A shows the difference spectra after the sixth TMA exposure during $SiO_2$ ALE. This difference spectra reveals the loss of Si—O, Si—F and Al—F absorbance features and growth of Al—O and Si—O—Al absorbance features. The loss of the Al—F absorbance feature is consistent with the removal of $AlF_3$ by TMA via a ligand-exchange reaction. FIG. 20B shows the difference spectra after the sixth HF exposure. This difference spectra reveals the growth of Al—F and Si—F absorbance features and loss of Al—O and Si—O—Al absorbance features. These changing absorbance features with TMA and HF exposures indicate that the $SiO_2$ surface continues to be converted to $Al_2O_3$ or an aluminosilicate by TMA and then fluorinated by HF during $SiO_2$ ALE. A schematic illustrating the mechanism of $SiO_2$ ALE by TMA and HF is shown in FIG. 21.

Example 7: Alternative Conversion/Etch Experiments for Thermal $SiO_2$ ALE

Additional "conversion/etch" strategies can be used to perform $SiO_2$ ALE. These conversion/etch strategies again involve first converting the surface layer of $SiO_2$ to another metal oxide material. The new metal oxide material on the $SiO_2$ can then be etched using thermal ALE. These "conversion/etch" strategies may also be applicable to a wide range of other materials.

Figure 22:
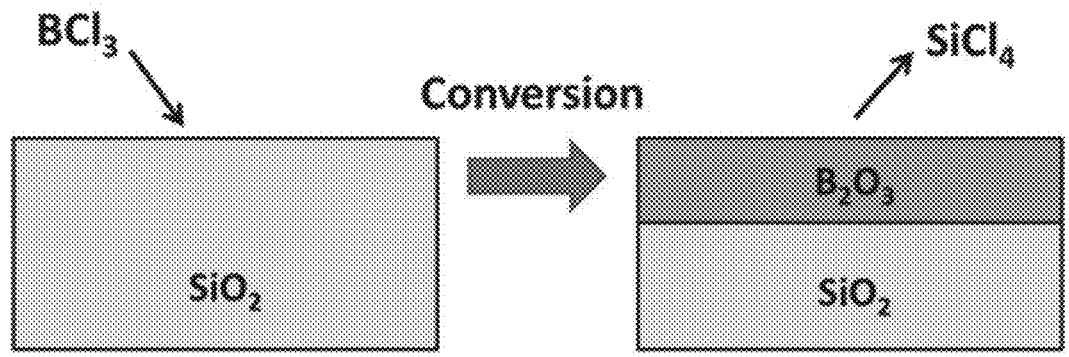
FIG. 22 illustrates a "conversion/etch" experiment on $SiO_2$, as described in Example 7, where $BCl_3$ first converts the surface of the $SiO_2$ to a $B_2O_3$ film and volatile $SiCl_4$. The HF then etches the $B_2O_3$ film on $SiO_2$ by producing volatile $BF_3$ and $H_2O$ products.
Figure 22:
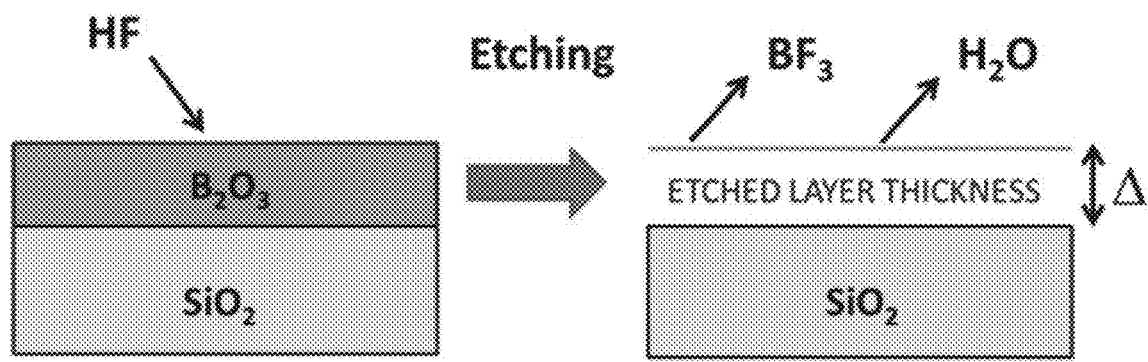

One example of an alternative "conversion/etch" strategy is shown in FIG. 22. In this example, a surface layer of $SiO_2$ is converted to $B_2O_3$ by $BCl_3$. The reaction is $1.5SiO_2+2BCl_3(g) \rightarrow B_2O_3+1.5SiCl_4(g)$. This reaction is thermochemically favorable with a Gibbs Free Energy change of $\Delta G=-12.3$ kcal at 200° C. The negative $\Delta G$ indicates that the reaction is spontaneous in the absence of any kinetic barriers.

The $BCl_3$ reaction can then be followed by the HF reaction. The HF can react with $B_2O_3$ and produce volatile $BF_3$ and $H_2O$ reaction products. The reaction is $B_2O_3+6HF(g) \rightarrow 2BF_3(g)+3H_2O(g)$. This reaction is thermochemically favorable with a Gibbs Free Energy change of $\Delta G=-17.3$ kcal at 200° C. The negative $\Delta G$ again indicates that this reaction is spontaneous in the absence of any kinetic barriers. Sequential $BCl_3$ and HF exposures can etch $SiO_2$ films with atomic layer control.

Example 8: Conversion/Etch Experiments for Thermal ZnO ALE

There are examples of "conversion/etch" for other materials in addition to $SiO_2$. For example, ZnO can be etched by a "conversion/etch" mechanism using TMA and HF. In this case, TMA converts ZnO to $Al_2O_3$ by the reaction $3ZnO+2Al(CH_3)_3 \rightarrow Al_2O_3+3Zn(CH_3)_2$. This conversion reaction is thermochemically favorable with a Gibbs free energy change of $\Delta G=-166.8$ kcal/mol at 265° C.

Figure 23:
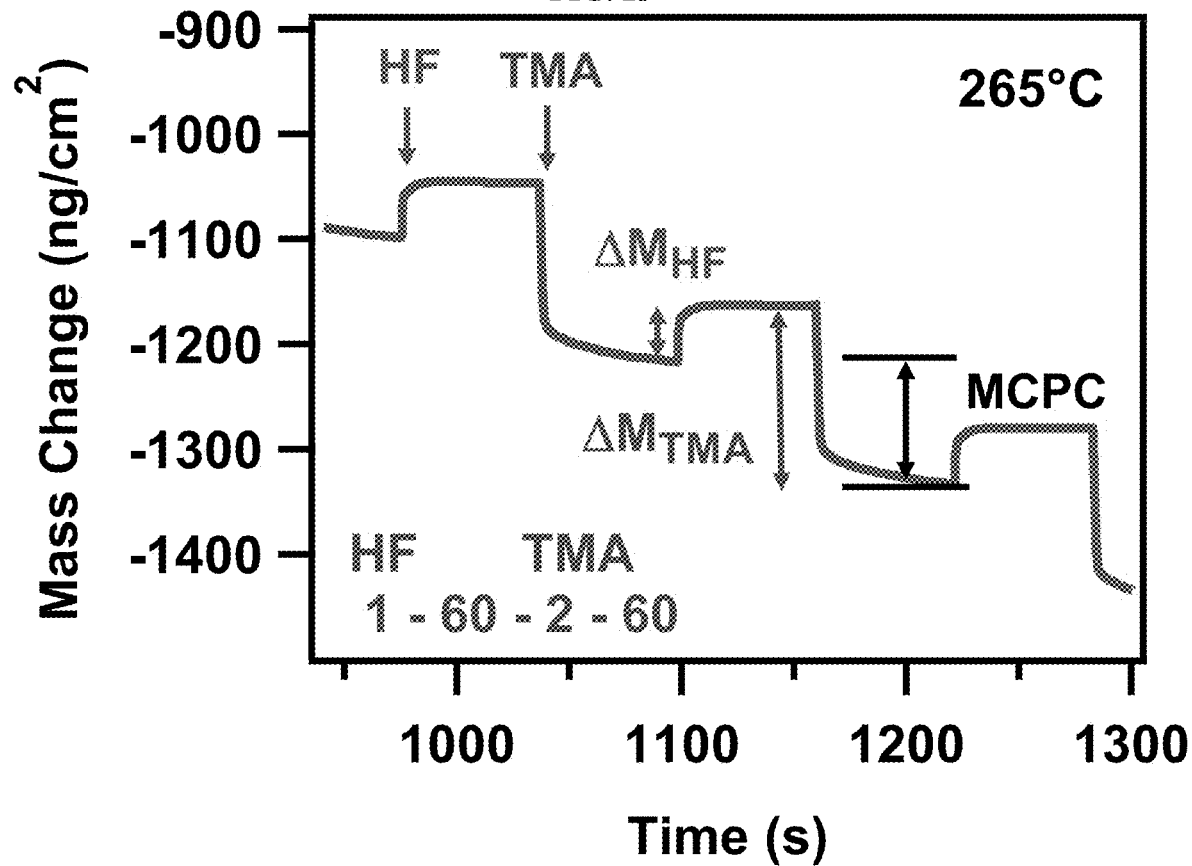
FIG. 23 shows mass changes during ZnO ALE using sequential exposures of HF and TMA at 265° C. as described in Example 8. The $\Delta M_{HF}$ and $\Delta M_{TMA}$ mass changes are associated with individual exposures of HF and TMA. The MCPC is the sum of $\Delta M_{HF}$ and $\Delta M_{TMA}$.
Figure 24:
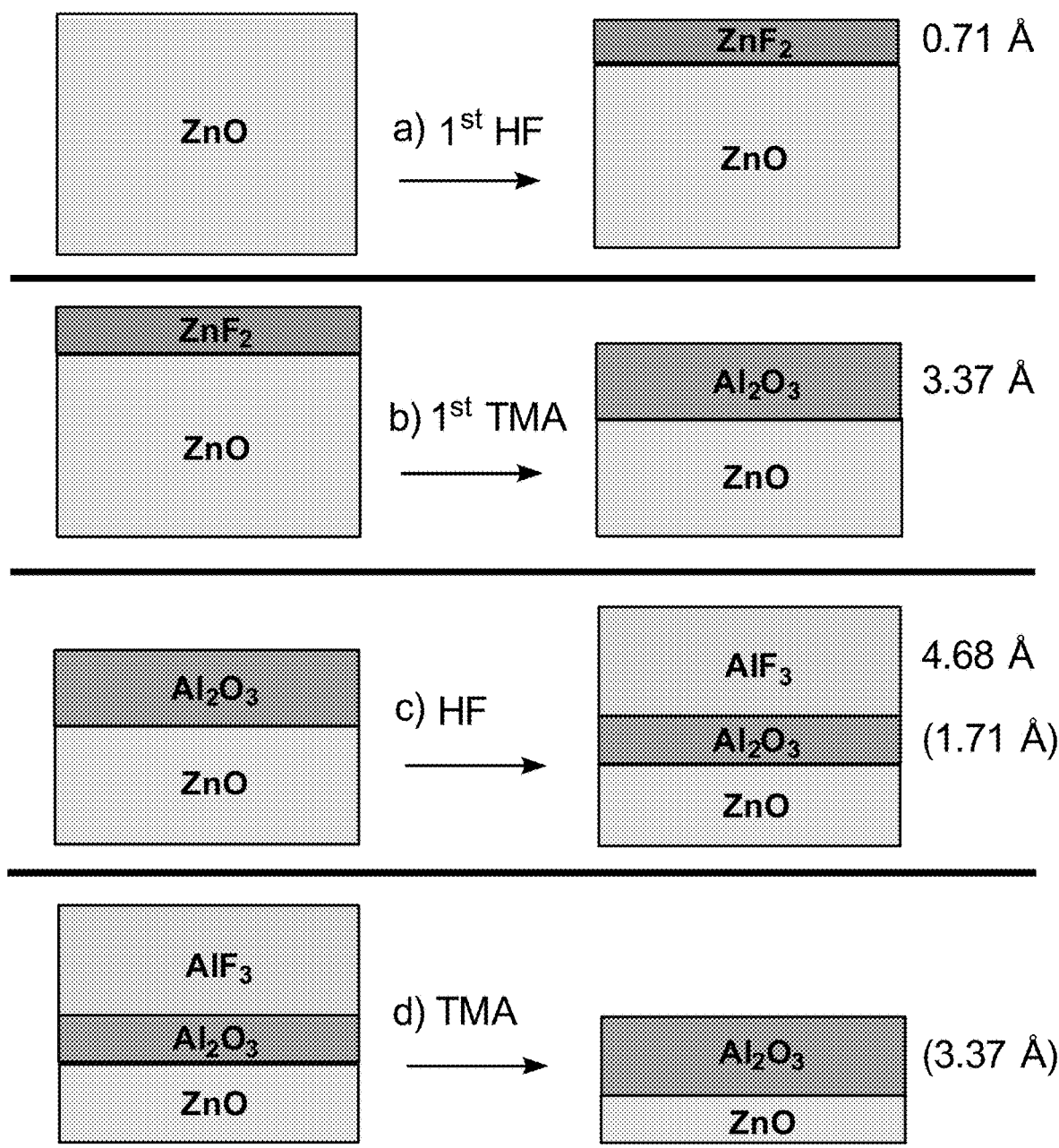
FIG. 24 displays the schematic of the surface layers and layer thicknesses resulting from the sequential HF and TMA exposures during the first ZnO ALE cycle and subsequent ZnO ALE cycles at 265° C.

Evidence for the "conversion/etch" reaction mechanism during ZnO ALE with TMA and HF is given by the quartz crystal microbalance (QCM) results in FIG. 23. A mass loss during the TMA exposure of $-172$ ng/$cm^2$ is much larger than would be expected by the removal of the fluoride layer by a ligand-exchange reaction. The ligand-exchange reaction with the fluoride layer would only produce a small mass loss of approximately $-35$ ng/$cm^2$. The additional conversion reaction of ZnO to $Al_2O_3$ is needed to explain the large mass loss of $-172$ ng/$cm^2$. A schematic of the surface layers and layer thicknesses resulting from the sequential HF and TMA exposures during the first ZnO ALE cycle and subsequent ZnO ALE cycles at 265° C. are given in FIG. 24. The first HF exposure on ZnO converts the ZnO surface layer to $ZnF_2$. The first TMA exposure then removes the $ZnF_2$ layer by ligand-exchange and then converts the underlying ZnO surface layer to $Al_2O_3$. Subsequent HF exposures then fluorinate the $Al_2O_3$ surface layer to form an $AlF_3$ surface layer. Subsequent TMA exposures then remove the $AlF_3$ surface layer and convert more ZnO to $Al_2O_3$.

Example 9: Effect of Catalysts on Thermal ALE

The fluorination and ligand-exchange reactions that define thermal ALE are dependent on individual surface reactions. These surface reactions can be influenced by the electron density of states at the surface. Adsorbates that add or remove electron density may change the etching rates. Na or Li can be preadsorbed on the $Al_2O_3$ surface by exposure to Na(hmds) and Li(hmds), wherein "hmds" is an abbreviation for hexamethyldisilazane. The preadsorbed Na or Li can promote $Al_2O_3$ ALE etching at much lower temperatures compared with thermal $Al_2O_3$ ALE without the preadsorbed Na or Li.

Figure 25:
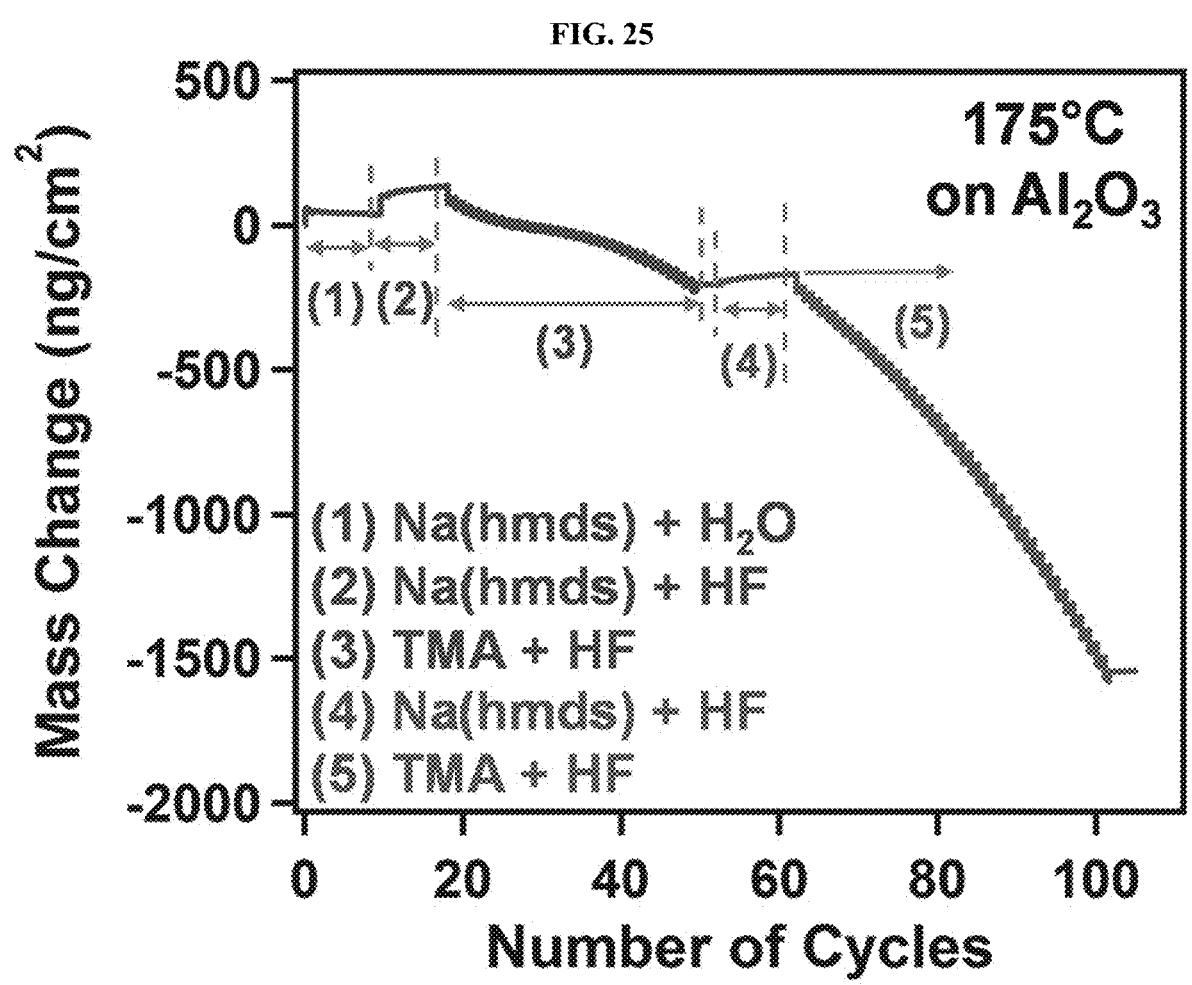
FIG. 25 illustrates $Al_2O_3$ mass change versus number of cycles for a number of sets of sequential reactions at 175° C. as described in Example 9: (1) Na(hmds)+$H_2O$; (2) Na(hmds)+HF; (3) TMA+HF; (4) Na(hmds)+HF; and (5) TMA+HF. $Al_2O_3$ etching only occurs during (3) and (5).

FIG. 25 shows QCM results for $Al_2O_3$ at 175° C. during the sequential reactions of Na(hmds) and $H_2O$, the sequential reactions of Na(hmds) and HF, the etching of $Al_2O_3$ using sequential TMA and HF exposures, the additional sequential reactions of Na(hmds) and HF, and the additional etching of $Al_2O_3$ using sequential TMA and HF exposures. The sequential reactions were performed using 1 s reactant exposures and 30 s $N_2$ purges and can be designated as 1-30-1-30. The pressure of the reactants was about 10 mTorr for Na(hmds), about 80 mTorr for HF, about 40 mTorr for TMA. FIG. 20 shows that mass changes resulting from $Al_2O_3$ ALE were observed at 175° C. Enhanced $Al_2O_3$ ALE was observed at 175° C. with additional Na adsorption.

Figure 26:
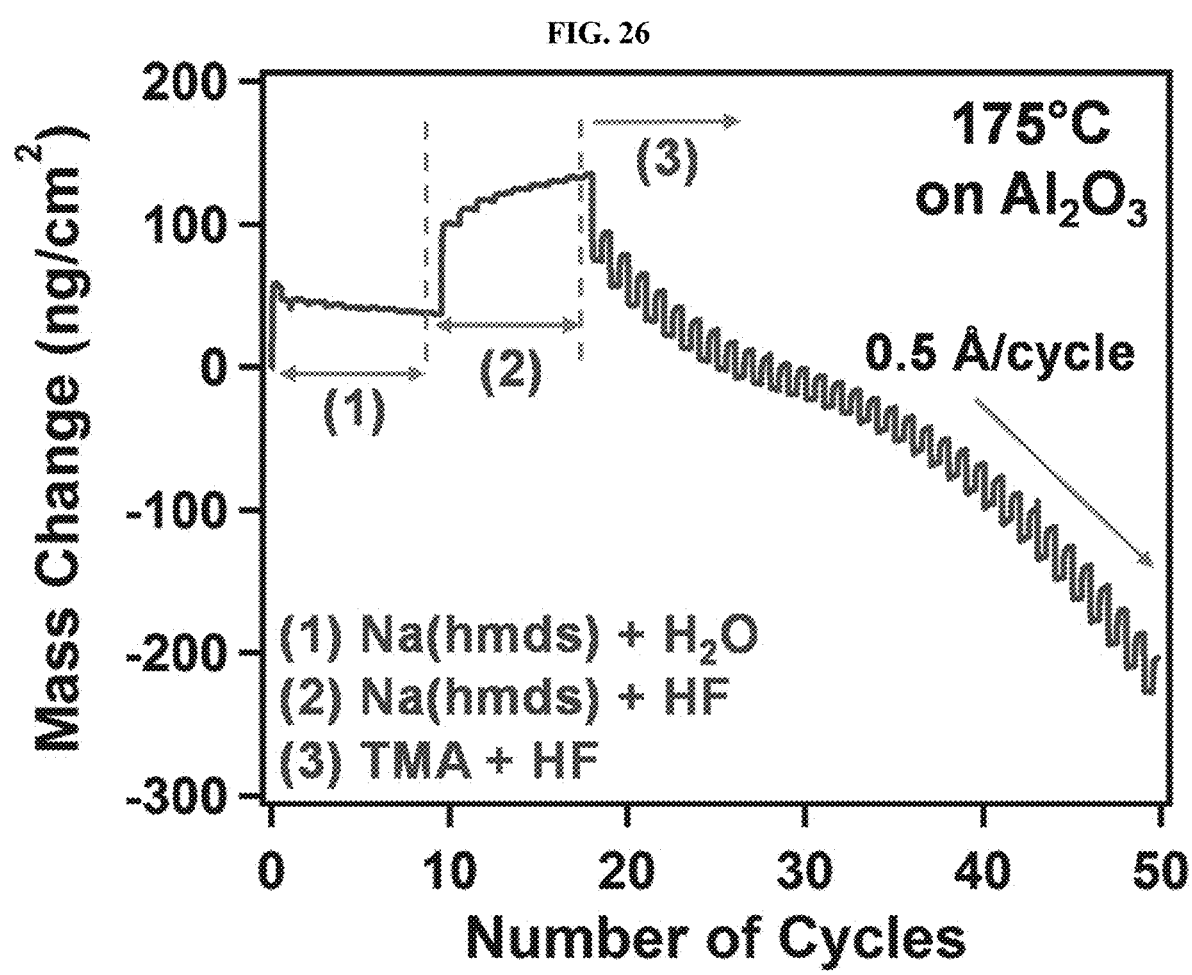
FIG. 26 is an expansion of the regions (1)-(3) in FIG. 25, showing the etching of $Al_2O_3$ during the first set of sequential TMA+HF exposures.
Figure 27:
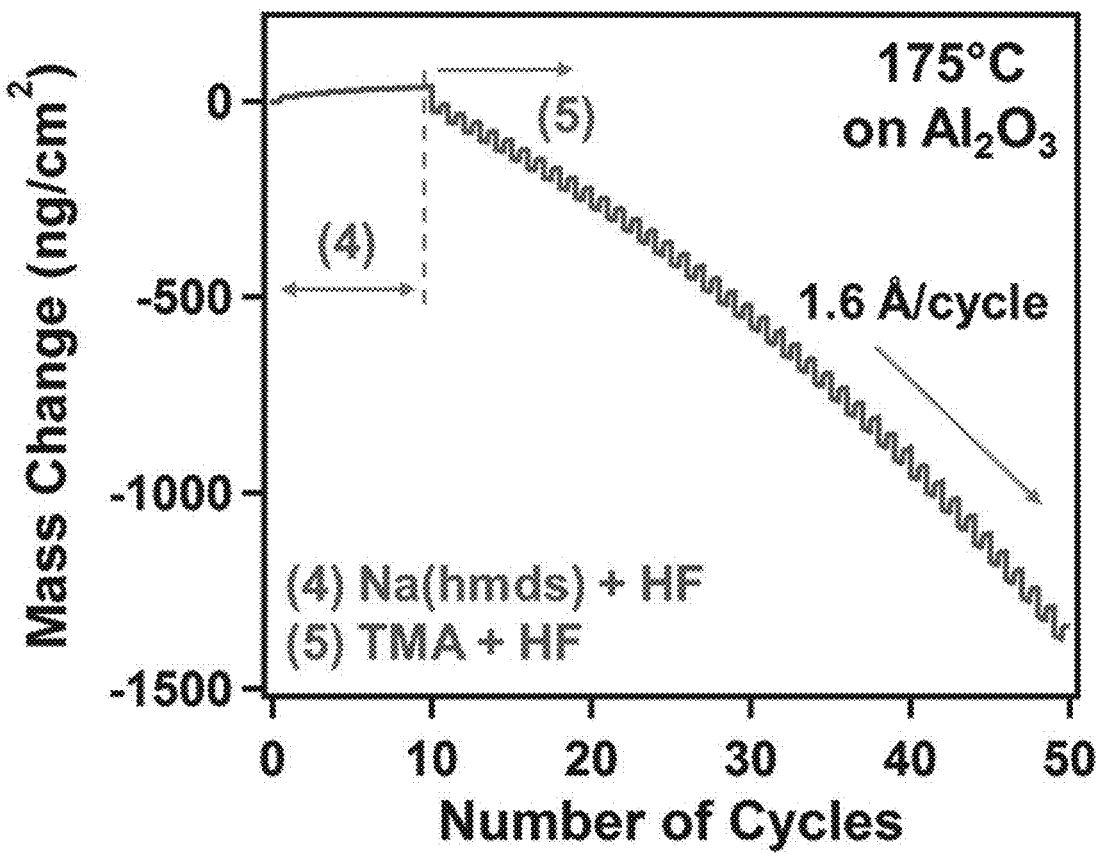
FIG. 27 is an expansion of the regions (4)-(5) in FIG. 25 showing the etching of $Al_2O_3$ during the second set of sequential TMA+HF exposures.

An enlargement of the etching of $Al_2O_3$ using TMA and HF after the first set of sequential Na(hmds) and $H_2O$ reactions and Na(hmds) and HF reactions is shown in FIG. 26. The $Al_2O_3$ was etched at a rate of about 0.5 Å/cycle at the end of the sequence of TMA and HF reactions. An enlargement of the etching of $Al_2O_3$ using TMA and HF after the second set of sequential Na(hmds) and HF reactions is shown in FIG. 27. The $Al_2O_3$ was etched at a rate of about 1.6 Å/cycle at the end of the sequence of TMA and HF reactions. This higher etch rate was attributed to a higher Na surface coverage. Similar $Al_2O_3$ ALE results were obtained by adsorbing Li using Li(hmds).

Figure 28:
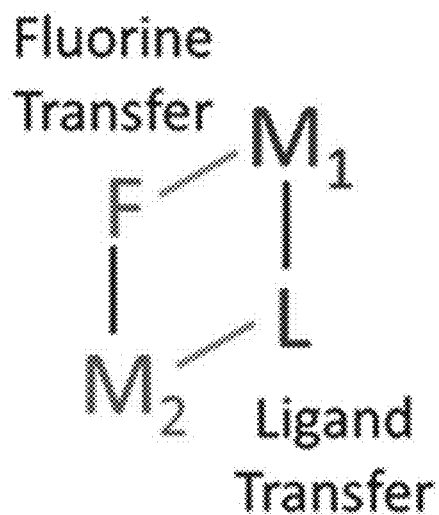
FIG. 28 illustrates a ligand-exchange transmetalation reaction.

Without wishing to be limited by any theory, the Na(hmds) and Li(hmds) molecular precursors can dissociatively adsorb to yield Na and Li on the $Al_2O_3$ surface. These alkali metals can then ionize to produce $Na^+$ and $Li^+$ and electrons. These electrons can subsequently affect the ligand-exchange transmetalation reactions. Without wishing to be limited by any theory, in certain embodiments, the transmetalation reaction involves a four-center transition state composed of the metal from the metal precursor ($M_1$), the metal from the metal fluoride ($M_2$), a ligand from the metal precursor (L) and fluorine from the metal fluoride (F). This proposed four-center transition state is illustrated in FIG. 28.

In certain embodiments, the electrons from alkali metal ionization allow the fluorine on the metal fluoride surface to become a stronger nucleophile and enhance the ligand-exchange reaction. The catalytic effect of Na on the $Al_2O_3$ ALE rates is larger at higher preadsorbed Na coverage. In certain embodiments, these Na and Li catalysts can lead to the formation of NaF or LiF films after the HF exposures. However, NaF and LiF are both stable salts with low volatility. These salts may persist on the $Al_2O_3$ surface during $Al_2O_3$ ALE, and can be active catalysts during the thermal $Al_2O_3$ ALE.

Example 10: Fluorination Pressure Enhanced Etch Rate for $Al_2O_3$ ALE

The fluorination process can also lead to enhanced thermal ALE. Fluorination using fluorination reactants such as HF and $F_2$ leads to passivating surface fluoride films on various materials. This passivating surface fluoride film protects the underlying material from further fluorination. Although the thickness of the fluoride film is self-limiting versus exposure of the fluorination reactant, the fluoride film thickness can increase at larger pressures during the exposure of the fluorination reactant. This larger fluoride film thickness can lead to higher thermal ALE rates.

The fluorination enhanced etching is illustrated using HF fluorination of $Al_2O_3$. For these experiments, the $Al_2O_3$ ALD film was grown on silicon wafers using TMA (97%, Sigma-Aldrich) and $H_2O$ at 200, 250 and 300° C. using 200 cycles of $Al_2O_3$ ALD. Each ALD cycle consisted of a 10 s static reactant exposure preceding a 30 s viscous purge with ultra-high purity $N_2$ gas (1.4 Torr) to remove any excess reactants or reaction byproducts. Five $N_2$ purge cycles (2 s $N_2$ pressurize to 1.4 Torr followed by a 15 s purge) ensured the removal of all excess reactants. The TMA exposures were about 0.7 Torr s and the $H_2O$ exposures were about 0.7 Torr s.

After $Al_2O_3$ growth, the thickness measured by ellipsometry was approximately 185 Å. The $Al_2O_3$ film was then etched using TMA (97%, Sigma-Aldrich) and HF-pyridine (70 wt % HF, Sigma-Aldrich) at 300° C. One TMA-HF cycle consisted of one static TMA pulse followed by one static HF pulse, with $N_2$ gas purging in between reactant exposures. The following conditions were used for the TMA and HF exposures during the ALE cycle. A 20 s static reactant exposure preceded a 20 s viscous purge with ultra-high purity $N_2$ gas (1.4 Torr) to remove any excess reactants or reaction byproducts. Five $N_2$ purge cycles (2 s $N_2$ pressurize to 1.4 Torr followed by a 15 s purge) ensured the removal of all excess reactants.

Figure 29:
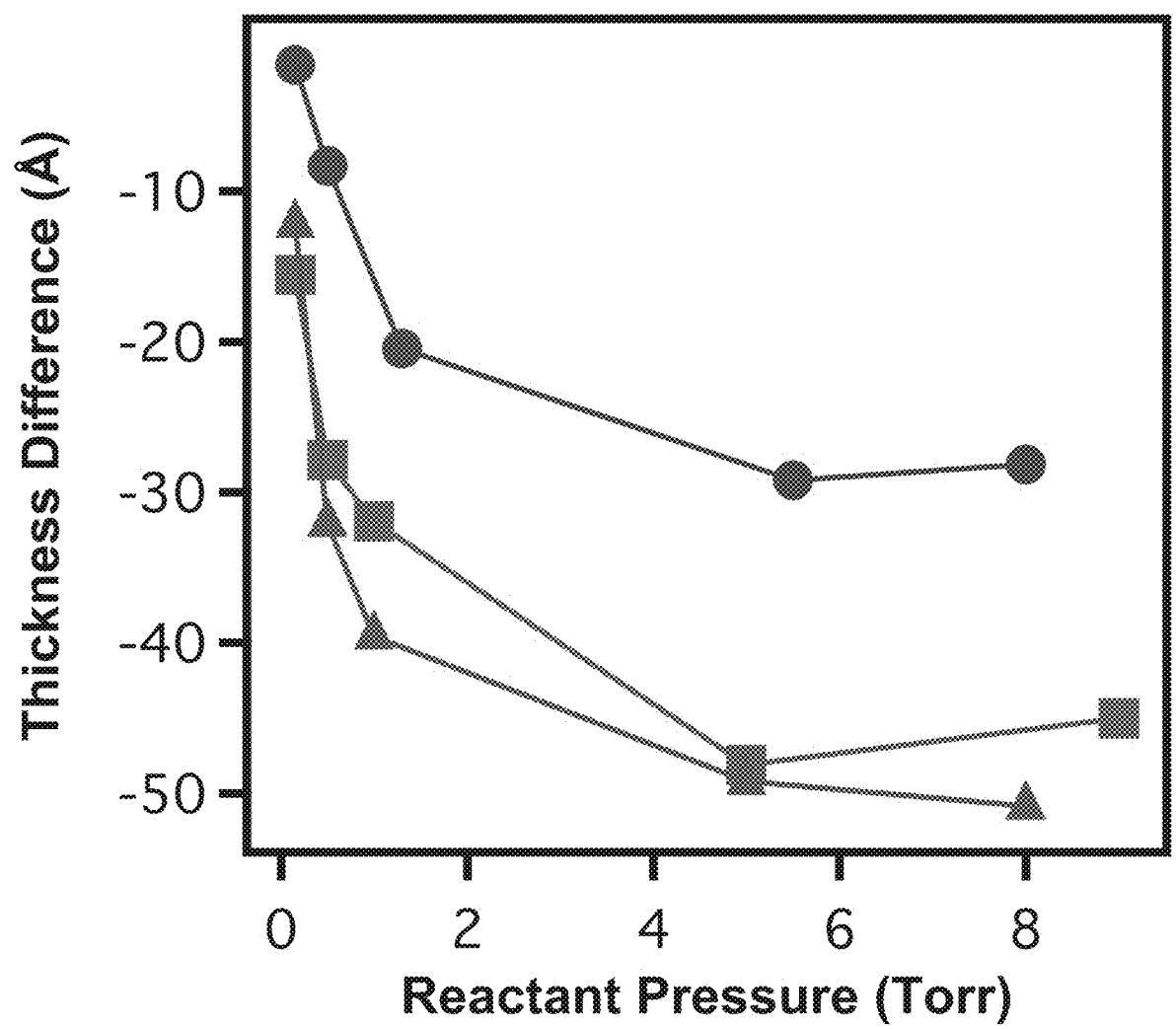
FIG. 29 shows the $Al_2O_3$ thickness change after 20 HF/TMA reaction cycles at 200, 250 and 300° C. for different HF fluorination pressures as described in Example 10.

FIG. 29 illustrates the $Al_2O_3$ thickness change versus the HF pressure for 20 cycles of TMA-HF ALE. Experiments were performed with the TMA and HF pressures varying from 0.15, 0.5, 1.0, 5.0, and 9.0 Torr. The $Al_2O_3$ thickness change increased with both HF pressure and temperatures. The $Al_2O_3$ ALE rates at 200° C. increased from 0.08 Å/cycle at 0.15 Torr to 1.4 Å/cycle at 8 Torr. The $Al_2O_3$ ALE rates at 300° C. increased from 0.61 Å/cycle at 0.15 Torr to 2.5 Å/cycle at 8 Torr.

Complementary FTIR experiments were performed to analyze the conversion of $Al_2O_3$ to $AlF_3$ versus HF pressure and temperature. In situ FTIR measurements were performed in a reactor equipped with an FTIR spectrometer to study the effect of hydrogen fluoride (HF) exposures on an $Al_2O_3$ ALD film. The transmission FTIR measurements were performed on high surface area Si nanoparticles with a native $SiO_2$ layer. The large surface area provided by the nanopowder substrate improved the signal-to-noise ratio for the infrared absorption measurements.

15 cycles of $Al_2O_3$ ALD were grown on the Si|$SiO_2$ nanoparticles with $Al_2O_3$ ALD using TMA (97%, Sigma-Aldrich) and $H_2O$ (Chromasolv for HPLC, Sigma-Aldrich) at 250° C. The TMA exposures were about 1.0 Torr s and the $H_2O$ exposures were about 0.75 Torr s. Each exposure was separated by a 180 s purge to remove excess reactant and reaction byproducts from the chamber. A constant flow of 100 sccm of ultra-high purity (UHP) $N_2$ gas was delivered into the reactor during the $Al_2O_3$ ALD reactions. The $Al_2O_3$ ALD layers grown on the Si|$SiO_2$ nanoparticles were subsequently subjected to 0.5 Torr, 1.0 Torr, and 5 Torr static exposures of HF for 30 s derived from HF-pyridine (70 wt % HF, Sigma-Aldrich) at 250° C. At each pressure, the static HF exposures were repeated until no further absorbance change was observed, indicating self-saturating behavior.

Figure 30:
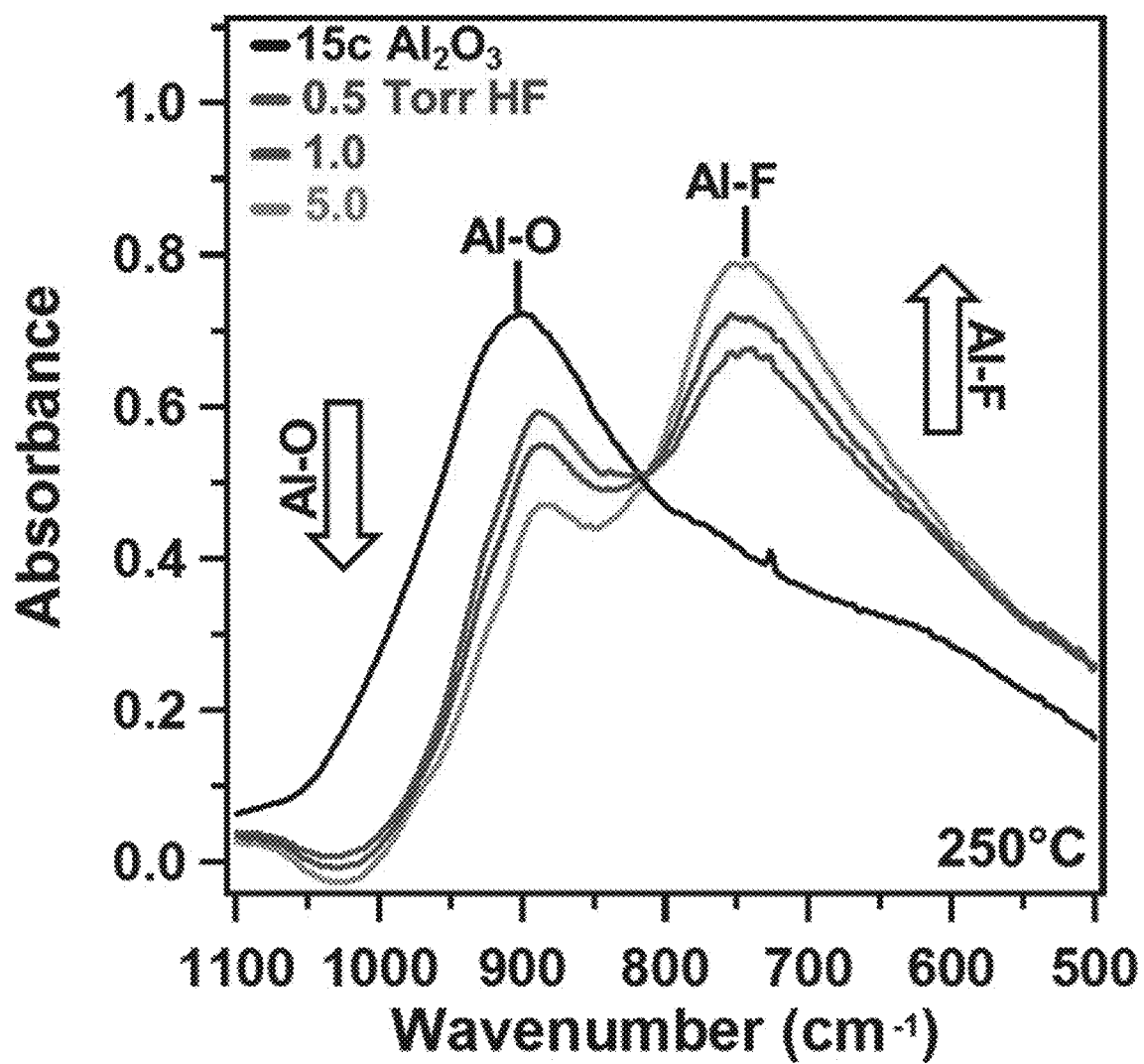
FIG. 30 shows the infrared absorbance in the region of the Al—O stretching vibration for $Al_2O_3$ and the Al—F stretching vibration for $AlF_3$. The initial absorbance for $Al_2O_3$ converts to absorbance for $AlF_3$ after HF exposure at different HF pressures at 250° C.

FIG. 30 shows the effect of the HF exposures on the $Al_2O_3$ ALD film. These FTIR spectra are referenced to the initial Si|$SiO_2$ nanoparticles. After static HF exposures at 0.5 Torr, an absorbance loss was observed at ~1000 cm$^{-1}$ that corresponds with the removal of some absorbance from the Al—O stretching vibrations in the $Al_2O_3$ ALD film. In addition, an absorbance feature appeared at 500-800 cm$^{-1}$. This feature is consistent with Al—F stretching vibrations in $AlF_3$ and suggests that an $AlF_3$ layer forms from the conversion of $Al_2O_3$ to $AlF_3$ during the HF exposures. After 15 static exposures of HF at 0.5 Torr on the $Al_2O_3$ ALD surface, no further absorbance changes were observed indicating that the $AlF_3$ layer passivates the underlying $Al_2O_3$ film.

Further conversion of $Al_2O_3$ to $AlF_3$ was observed when the pressure of the HF static exposures was increased to 1.0 Torr. After 5 static exposures of HF at 1.0 Torr on the $Al_2O_3$ ALD film, no further absorbance changes were observed, indicating that the $AlF_3$ layer is again passivating the underlying $Al_2O_3$ film. Further conversion of $Al_2O_3$ to $AlF_3$ was again observed when the pressure of the HF static exposures was increased to 5.0 Torr. No further absorbance changes were observed after 5 static exposures of HF at 5.0 Torr on the $Al_2O_3$ ALD film. This behavior indicates that higher pressures of HF are able to create thicker fluoride layers and that each pressure produces fluoride layers that passivate the underlying film. In addition, an isosbestic point was observed that indicates that the $Al_2O_3$ and $AlF_3$ regions are decoupled and that pure $Al_2O_3$ is converted to pure $AlF_3$ with no frequency mixing or $AlO_xF_y$ intermediates.

Figure 31:
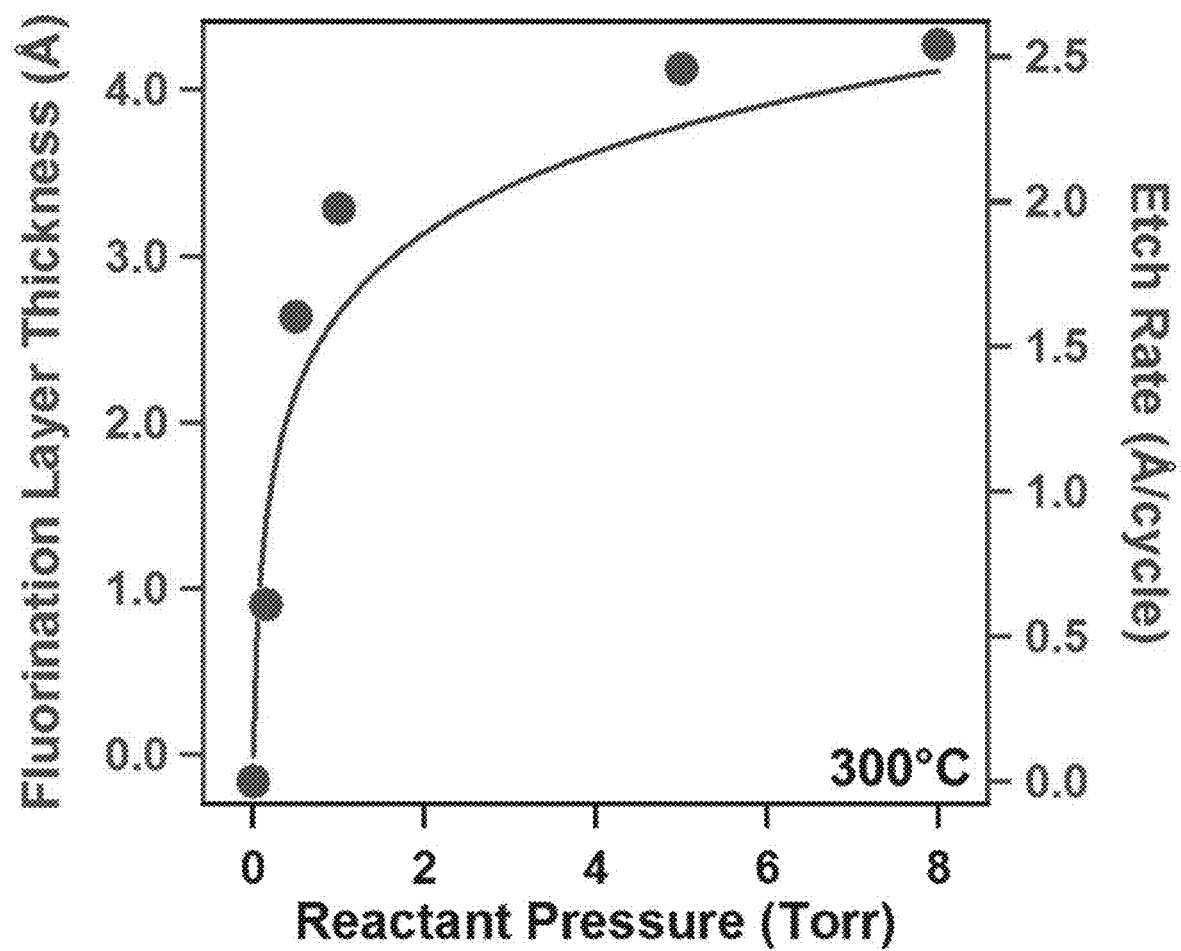
FIG. 31 shows a correlation of the fluorination layer thickness on $Al_2O_3$ versus HF pressure measured by x-ray photoelectron spectroscopy and the $Al_2O_3$ ALE etch rates versus HF and TMA reactant pressures.

FIG. 31 shows the correlation between the fluorination layer thickness on $Al_2O_3$ versus HF pressure measured by x-ray photoelectron spectroscopy and the $Al_2O_3$ ALE etch rates versus HF and TMA reactant pressures. The correlation between fluorination layer thickness and $Al_2O_3$ ALE etch rate is excellent. These results demonstrate that higher HF pressures produce thicker fluoride layers on $Al_2O_3$ and that the thicker fluoride layers produce higher $Al_2O_3$ ALE etch rates.

Example 11: Reactant Pressure Enhanced Etch Rate for $SiO_2$ ALE

Figure 32:
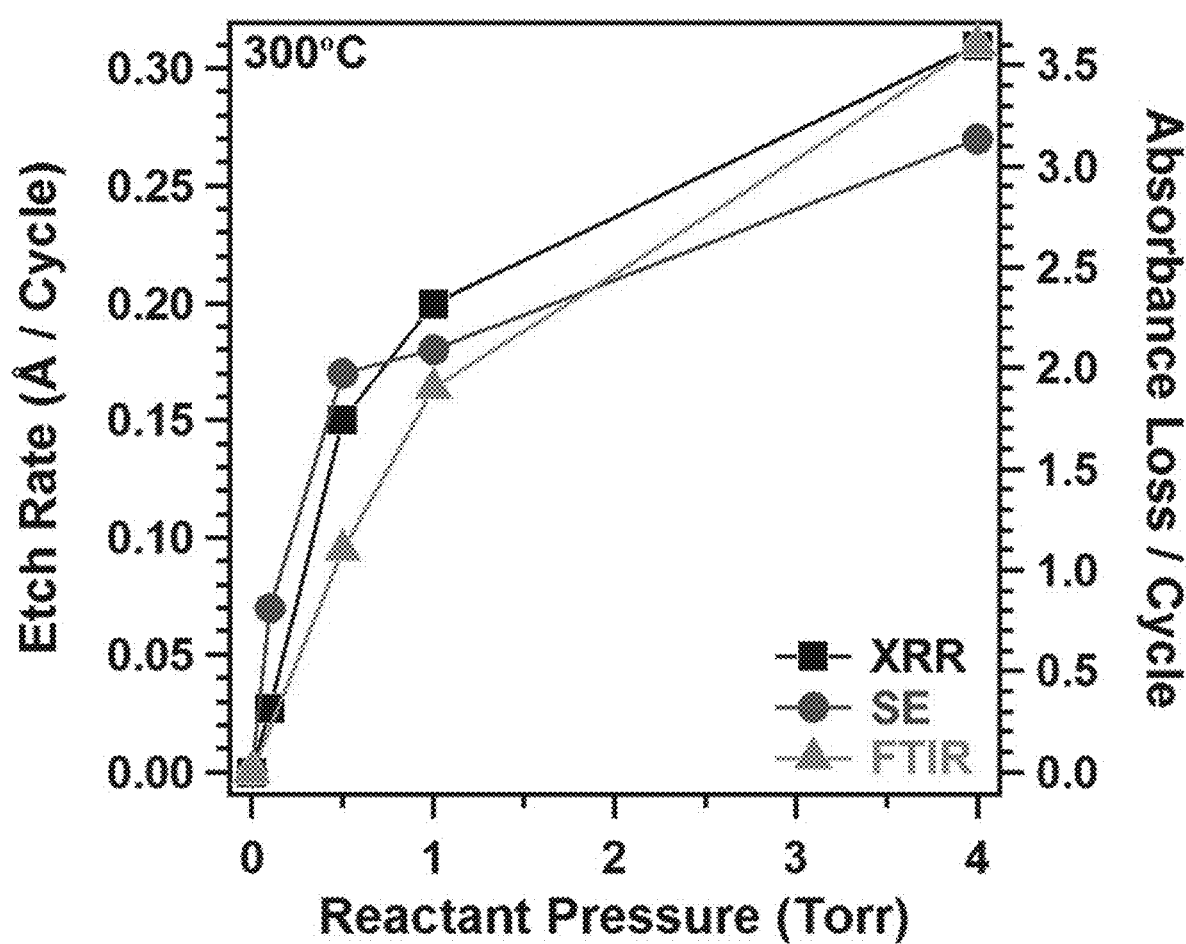
FIG. 32 displays $SiO_2$ ALE etch rates obtained from x-ray reflectivity and spectroscopic ellipsometry measurements compared with absorbance loss versus cycle for $SiO_2$ ALE obtained from FIG. 18 versus reactant pressure as described in Example 11.

The etch rate for $SiO_2$ ALE with TMA and HfF can also be enhanced by reactant pressure. FIG. 32 shows the $SiO_2$ ALE etch as a function of reactant pressure. The $SiO_2$ ALE etch rates versus reactant pressure were determined from x-ray reflectivity and spectroscopic ellipsometry measurements. The absorbance loss per cycle of the Si—O stretching vibrations versus reactant pressure is also included for comparison. The etch rates and absorbance loss per cycle are both enhanced at larger reactant pressures.

The size of the enhancement does begin to self-limit at higher reactant pressure. This effect is understood in terms of the self-limiting behavior of both the fluorination and conversion reactions. In both cases, either the fluoride or $Al_2O_3$ surface layer acts as a diffusion barrier and slows the surface reaction. Analogous behavior is observed for the oxidation of silicon substrates. The self-limiting oxidation of silicon is explained by the classic Deal-Grove kinetics.

Figure 33:
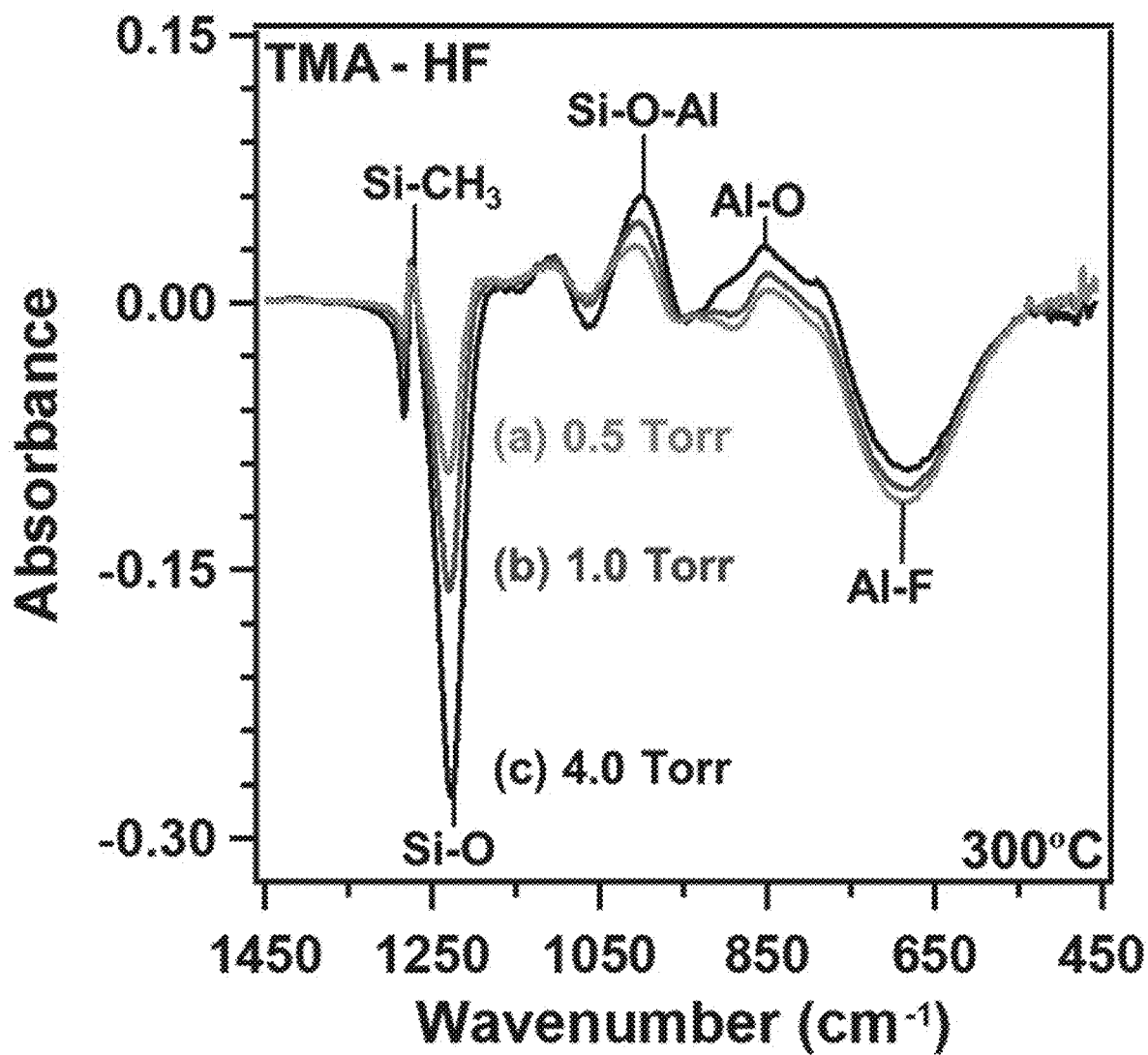
FIG. 33 shows difference infrared absorption spectra between 450-1450 $cm^{-1}$ for increasing TMA pressures of (a) 0.5 (b) 1.0 and (c) 4.0 Torr at 300° C. Difference spectra are referenced to the spectrum after the previous HF exposure at 1 Torr for 30 s.

The self-limiting behavior of the fluorination and conversion reactions is also observed by other FTIR spectroscopy investigations. The absorbance losses for Si—O and Al—F stretching vibrations on the $SiO_2$ surface after TMA exposures during $SiO_2$ ALE are shown in FIG. 33. The absorbance losses are self-limiting at each TMA pressure. The absorbance losses are also larger at the higher TMA pressures. This behavior argues that the higher $SiO_2$ ALE etch rates at higher TMA pressures are correlated with the larger amounts of conversion reaction.

Figure 34:
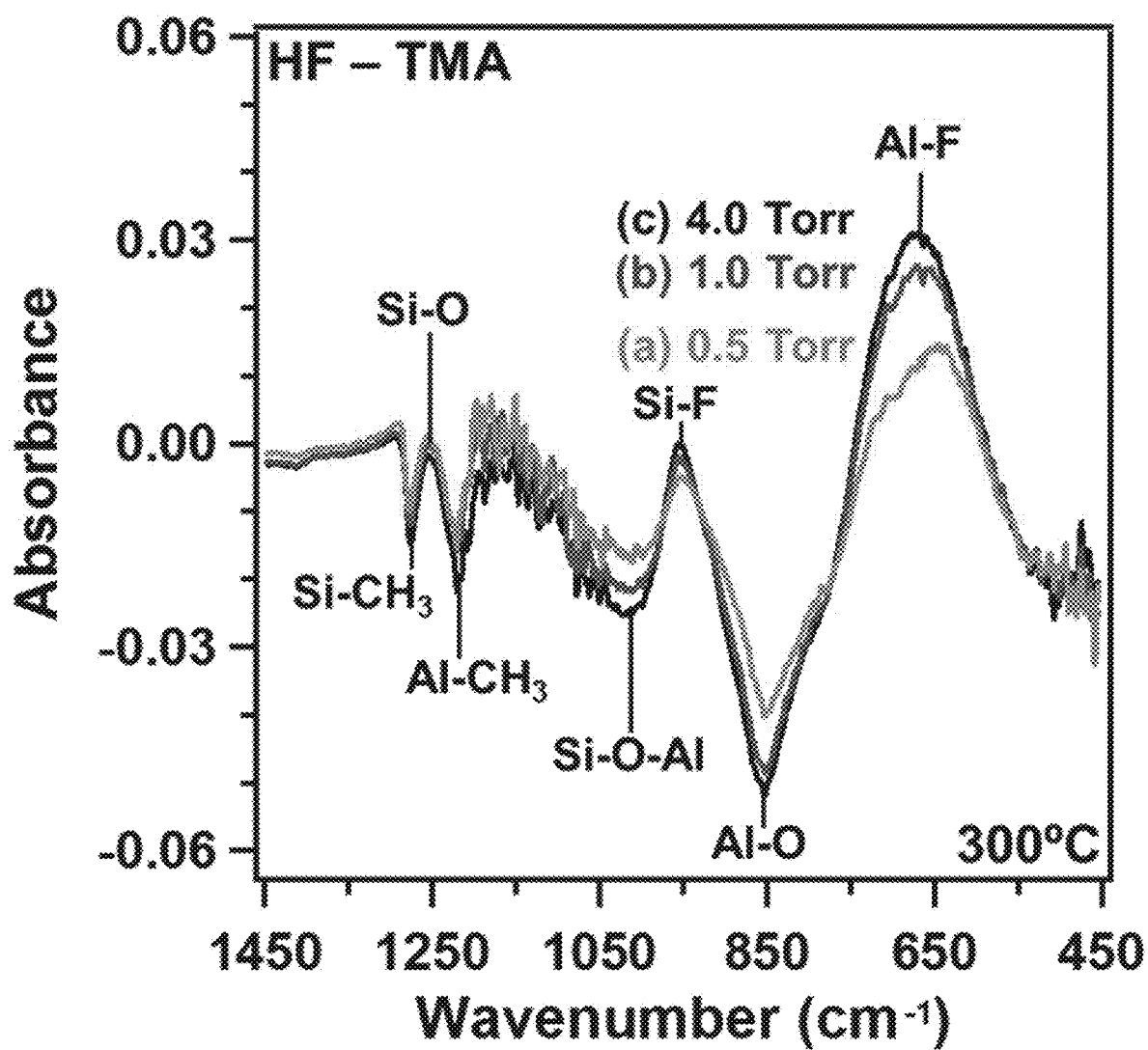
FIG. 34 shows difference infrared absorption spectra between 450-1450 $cm^{-1}$ for increasing HF pressures of (a) 0.5 (b) 1.0 and (c) 4.0 Torr at 300° C. Difference spectra are referenced to the spectrum after the previous TMA exposure at 1 Torr for 30 s.

The absorbance gains for Al—F and Si—F stretching vibrations on the $SiO_2$ surface after HF exposures during $SiO_2$ ALE are shown in FIG. 34. The absorbance losses are self-limiting at each HF pressure. The absorbance gains are also larger at the higher HF pressures. This behavior argues that the higher $SiO_2$ ALE etch rates at higher HF pressures are correlated with the larger amounts of fluorination. The higher $SiO_2$ ALE etch rates at higher reactant pressures can be explained by larger amounts of both fluorination and conversion reactions.

Example 12: Smooth, Ultrathin Films Using "Deposit/Etch Back" Method

Nucleation effects can often lead to roughness in ultrathin deposited films. Initial nucleation leads to the formation of islands on the surface. Large film thicknesses may be required for these islands to grow together to form a continuous and pinhole free thicker films. Thermal ALE can then be used to obtain very high quality ultrathin films by etching back this thicker film to produce a much thinner film.

Figure 35:
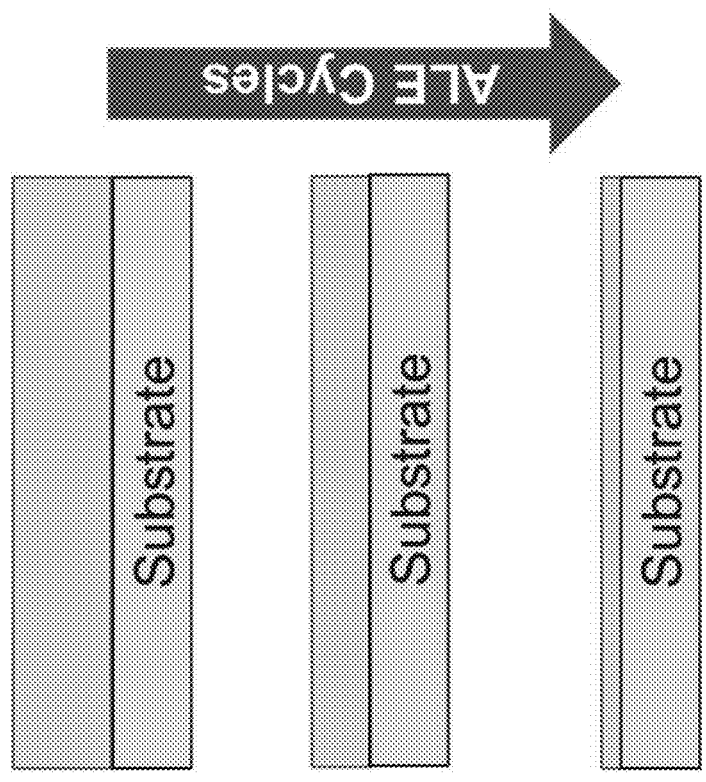
FIG. 35 illustrates a "deposit/etch back" strategy to obtain an ultrathin continuous film from a thin film that initially nucleates by forming islands as described in Example 12. The thick film with some roughness can be etched back to obtain a much smoother film than would have been produced by growing to this ultrathin thickness.
Figure 35:
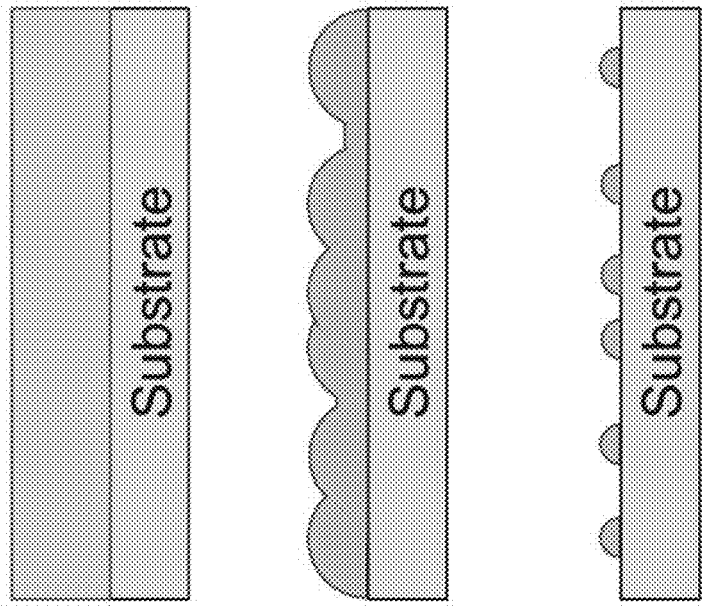
Figure 36:
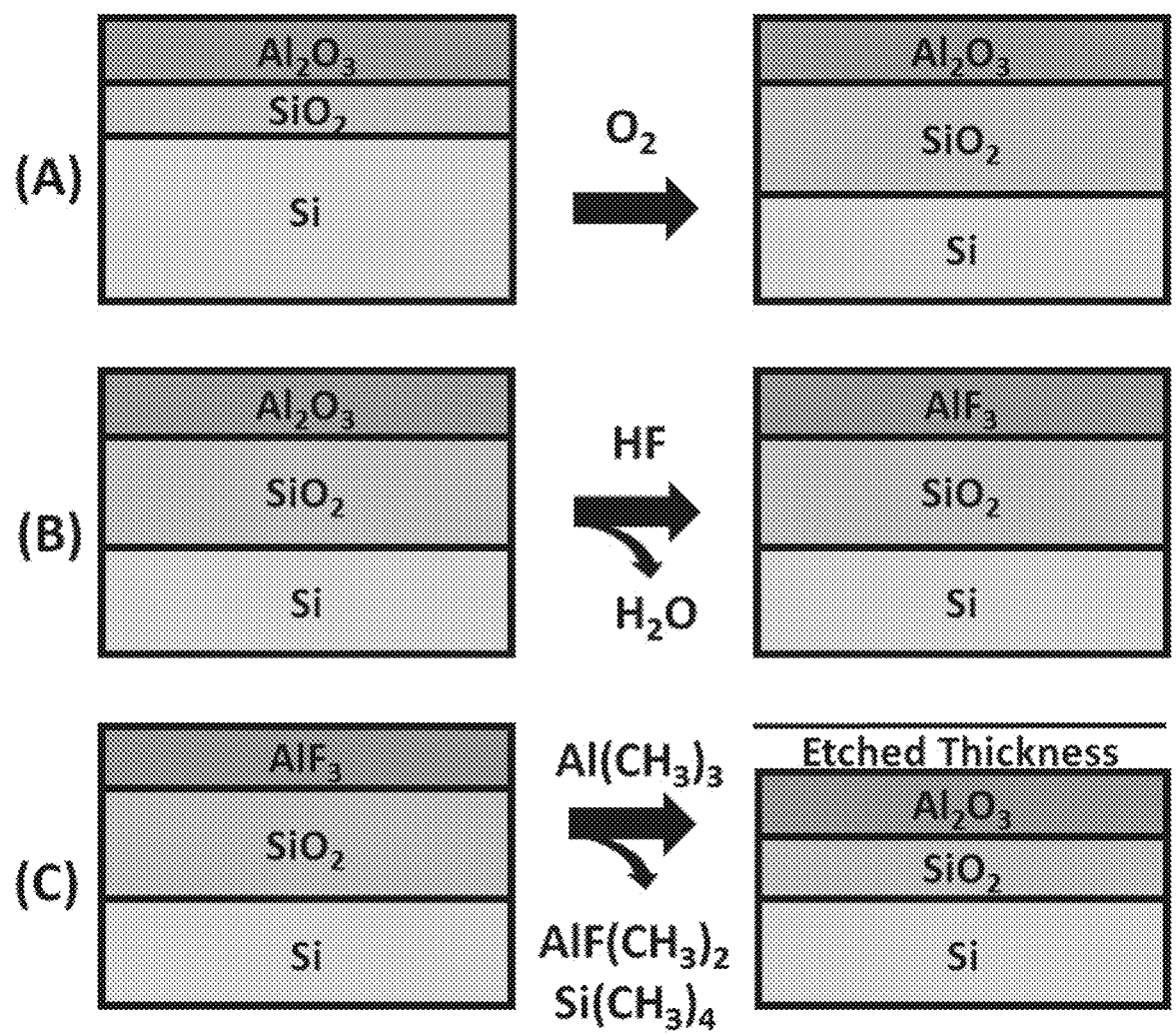
FIG. 36 is a schematic for thermal Si ALE based on (A) oxidation by $O_2$; (B) fluorination by HF; and (C) ligand-exchange and conversion by $Al(CH_3)_3$.

In the "deposit/etch back" strategy, a thicker film is first deposited and then etched back to a thinner film. The roughness of the thicker film can be reduced by the thermal ALE process. A schematic of the "deposit/etch back" strategy is shown in FIG. 35 using ALD to grow the film and thermal ALE to etch the film. ALE can etch the thicker film back and obtain a smoother surface than would have been produced by growing to this ultrathin thickness.

Example 13: Si ALE Using TMA and HF

Materials and Methods

Figure 37:
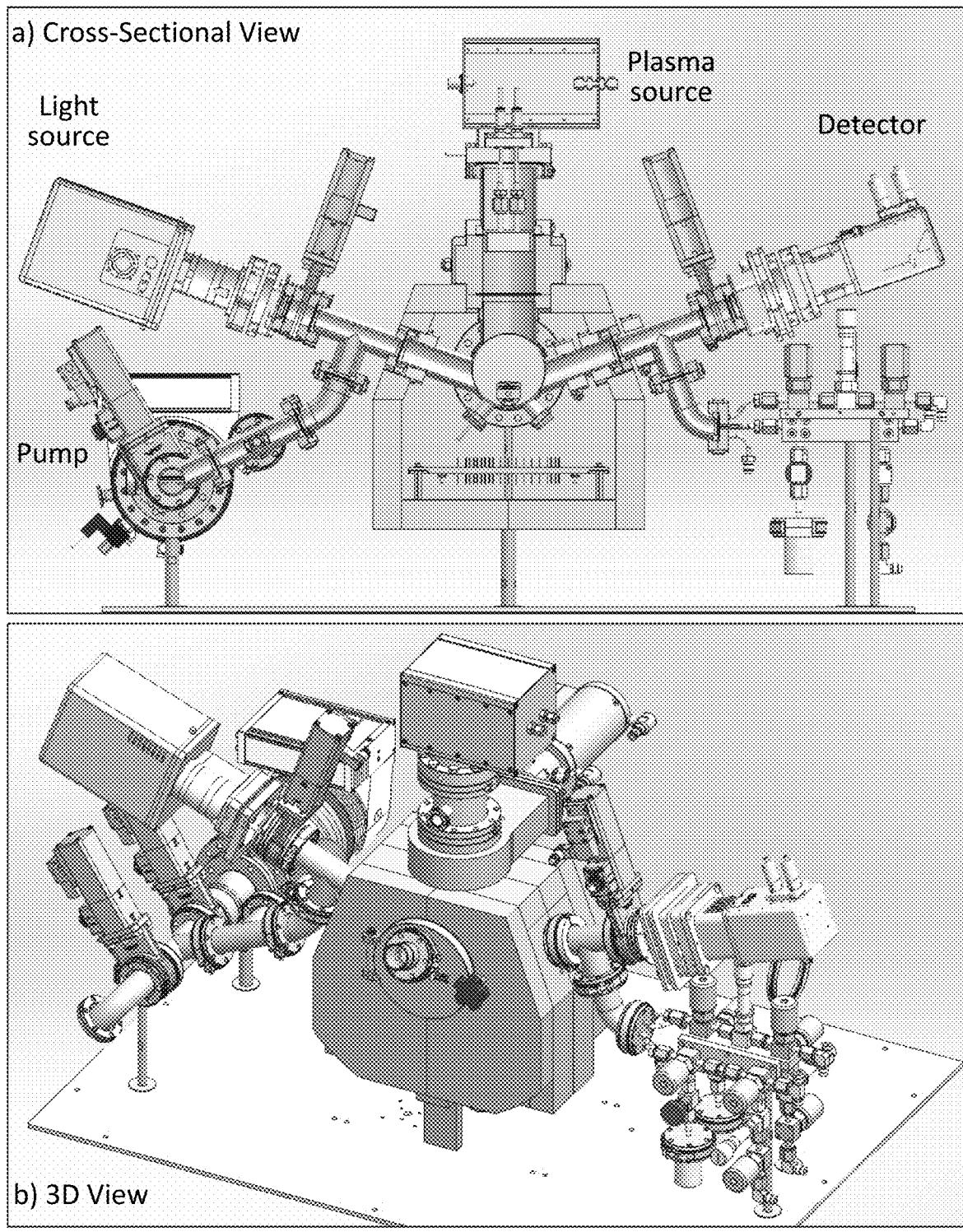
FIG. 37 is a set of diagrams of a warm wall reactor with hot sample stage equipped with in situ spectroscopic ellipsometry used for Si ALE experiments. The top image shows a cross sectional view of the reactor and the bottom image shows a ¾ angle 3D view of the reactor.

Thermal ALE of silicon was performed in a warm wall reactor with a hot sample stage type reactor as shown in FIG. 37. The etching was studied at sample temperatures varying from 225 to 290° C. The substrate heating was performed using a cartridge heater. The reactor walls were held at 160° C. at all times. The reactor was pumped with a mechanical pump (Alcatel Adixen 2010C1, France). The base pressure of the reactor was maintained at 1 Torr with a constant flow of 100 SCCM of UHP grade $N_2$ (99.9999%, Airgas, U.S.A.).

The reactor was also equipped with a mass spectrometer for gas analysis (Stanford research systems RGA-200, U.S.A.). A turbomolecular pump (Pfeiffer HiPace 300 C, U.S.A) was used to pump the mass spectrometer and could also pump the reactor for leak checking. The reactor also contained a plasma source (Meaglow hollow cathode plasma source, Canada) on top of the reactor. This plasma source was not employed for these experiments.

Two sets of boron-doped SOI wafers were used as substrates. One of the SOI samples had a 70 nm thick Si layer on a 2000 nm $SiO_2$ buried oxide (BOX) (University Wafer). The second SOI sample had a 100 nm thick Si <100> layer on a 200 nm $SiO_2$ BOX (University Wafer). All the data presented in this paper were acquired using the 70 nm thick Si layer. The different SOI wafers yielded equivalent results. The SOI wafers were precut to 2.5×2.5 cm size coupons before use. Thermal ALE of $SiO_2$ was performed using 80 nm thick wet thermal $SiO_2$ on Si<100> (University Wafer).

Figure 38:
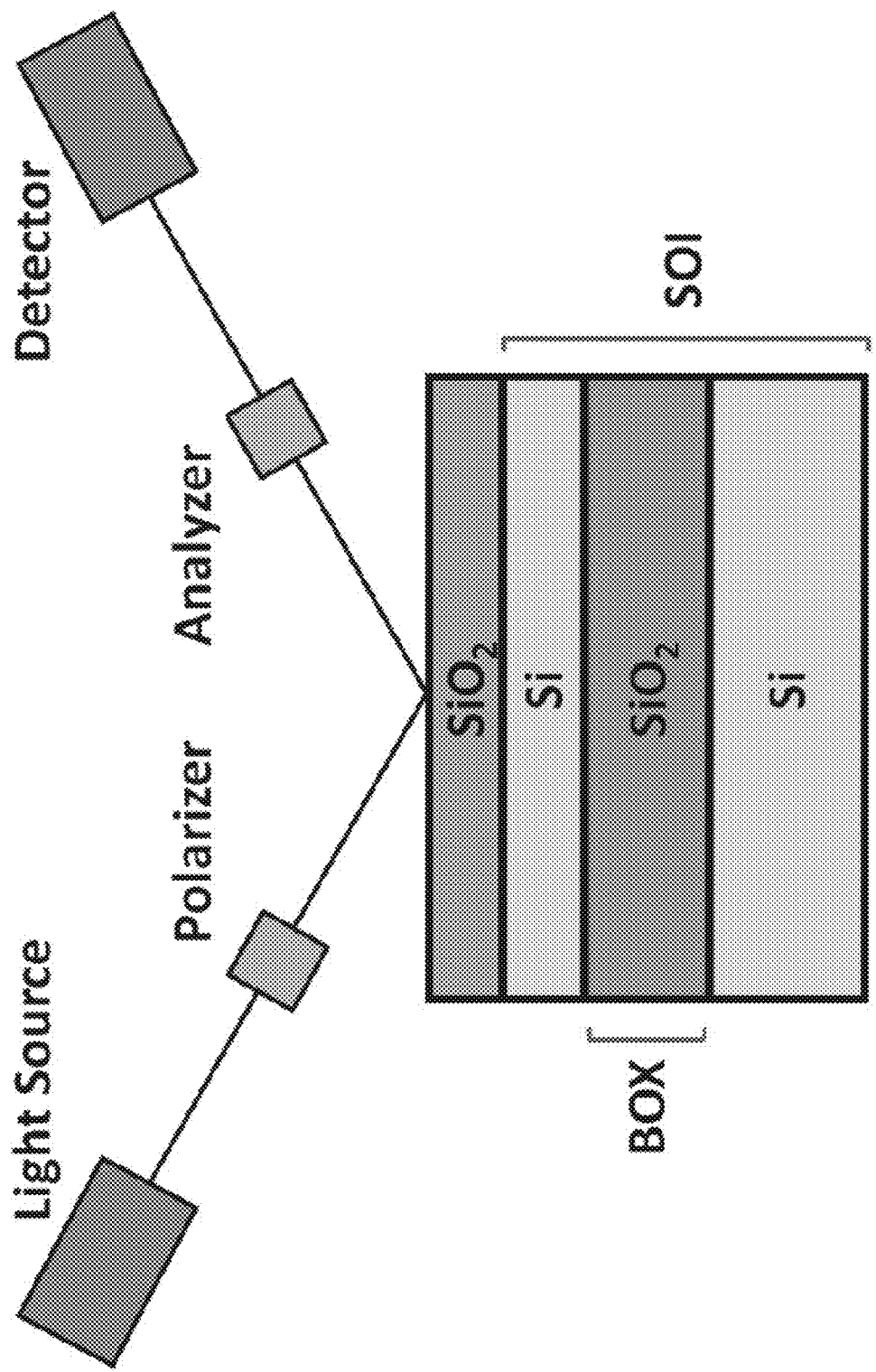
FIG. 38 is a schematic of an ellipsometer beam interacting with a film stack on a silicon-on-insulator (SOI) wafer. The film stack was comprised of a $SiO_2$ layer, a Si layer, a $SiO_2$ buried oxide (BOX), and an underlying Si substrate.

The reactor was equipped with a spectroscopic ellipsometer (J. A. Woollam M-2000D, U.S.A.) for in situ monitoring of film thickness. The ellipsometer has a spectral range from 240 to 1700 nm and utilizes an incidence angle of 70°. A schematic showing the film stack and ellipsometer optical beams is depicted in FIG. 38. The following fitting layers were used to model film thickness changes: $SiO_2$ JAW ($SiO_2$)/B-Spline (Si)/$SiO_2$ JAW (BOX $SiO_2$)/INTRA_JAW (Si—$SiO_2$ interface layer)/Si Temp JAW (Si substrate). These fitting layers are part of the standard instrument package. This modeling was performed using CompleteE-ASE (J. A. Woollam, U.S.A.) analysis software. Data was acquired by fixing the thickness of the BOX oxide and the underlying substrate and letting the top layers $SiO_2$ JAW ($SiO_2$) and B-Spline (Si) be variable components. The ellipsometer scan time was 5 s.

Silicon oxide ALE was performed using TMA and HF as reported elsewhere herein. Trimethylaluminum (97%) and HF, derived from HF-pyridine (70 wt. %), were purchased from Sigma-Aldrich (U.S.A.). The ALE cycle consisted of static doses of TMA, HF, and $O_2$ followed by 30 s nitrogen purge times. Industrial grade oxygen was used as the oxygen source (Airgas, U.S.A.). All precursors during the ALE and oxidation experiments were held at room temperature. In the Si oxidation experiments, one cycle consisted of a 10 s static $O_2$ exposure followed by a 30 s purge time.

No special wet pre-cleaning procedures were applied to clean the SOI wafers or the thermal $SiO_2$ samples prior to ALE. UHP nitrogen was applied to dust off the samples prior to use. Prior to the silicon oxidation experiment, the native oxide on the SOI wafer was removed by wet etching. This wet etching was accomplished by dipping for one minute in a 1:50 aqueous HF solution. After this wet HF treatment, the SOI sample was rinsed using DI water.

To achieve the static exposures, the mass flow controllers (MFCs) for the reactants and the nitrogen were closed and the reactor isolation valve was shut simultaneously at a background $N_2$ pressure of 1 Torr. Static exposure was then conducted for various time periods. The reported pressures of the reactants refer to their partial pressures with respect to the 1 Torr of background $N_2$ gas.

$SiO_2$ ALE Baseline Studies

Figure 39A:
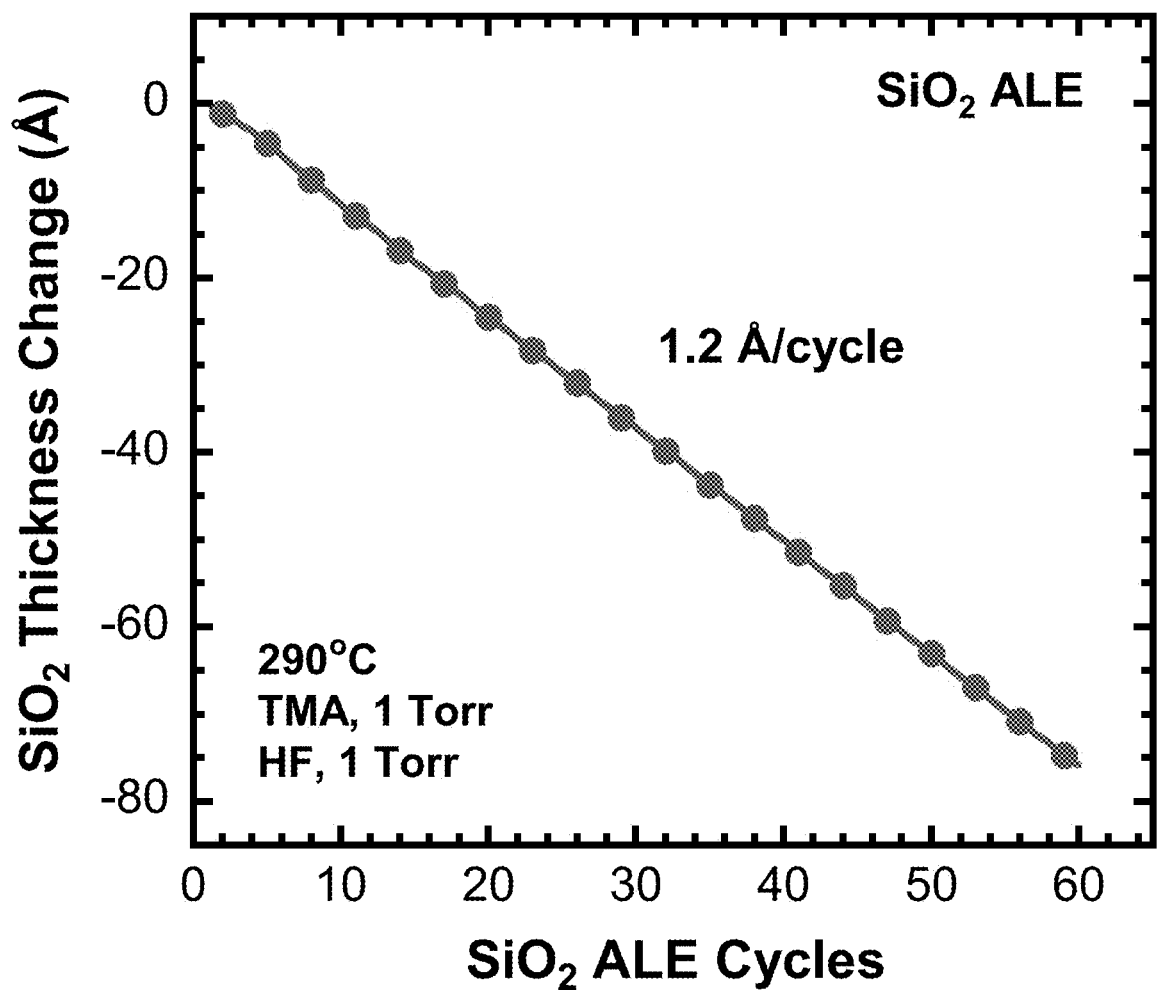
FIG. 39A is a graph of the change in $SiO_2$ thickness versus the number of $SiO_2$ ALE cycles during $SiO_2$ ALE using sequential TMA and HF exposures at 290° C.

Thermal $SiO_2$ ALE was first performed to establish a baseline for the Si ALE studies. FIG. 39A shows the $SiO_2$ thickness versus $SiO_2$ ALE cycles measured by in situ SE at 290° C. This etch temperature of 290° C. was chosen to avoid potential problems with TMA decomposition that may occur at higher temperatures. The results in FIG. 39A were obtained using sequential static exposures of TMA and HF for 5 s at partial pressures of 1.0 Torr. The static exposures were followed by purges times of 30 s.

FIG. 39A shows that the etching of the $SiO_2$ film thickness was linear. The $SiO_2$ ALE was characterized by an etch rate of ~1.2 Å/cycle. These results support the results reported elsewhere herein where a linear reduction of $SiO_2$ film thickness was observed using $SiO_2$ ALE with TMA and HF as the reactants at 300° C.

Si ALE using $O_2$, HF and TMA

Figure 39B:
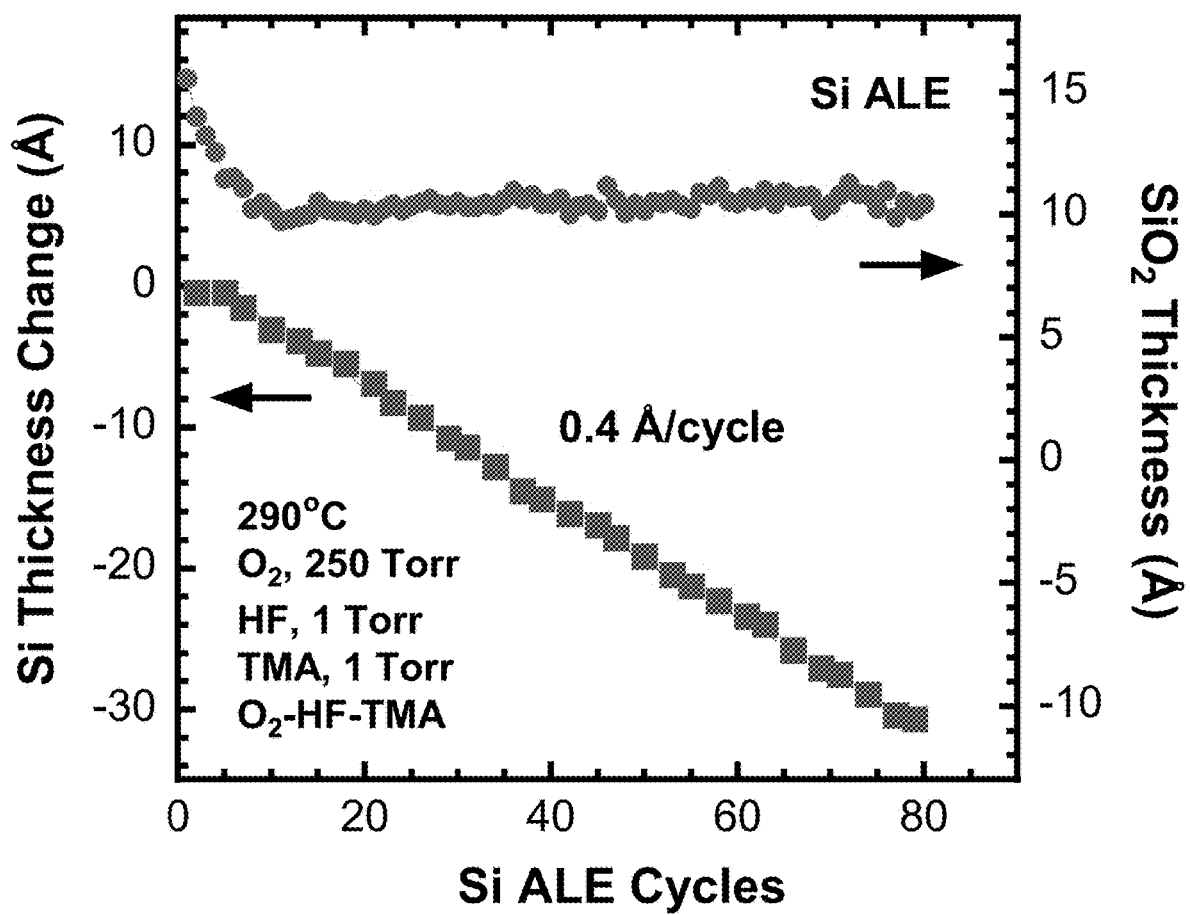
FIG. 39B is a graph of the change in Si thickness and $SiO_2$ film thickness versus number of Si ALE cycles during thermal Si ALE using sequential exposures of $O_2$, HF and TMA at 290° C.

FIG. 39B shows the change in film thickness for both $SiO_2$ and Si during Si ALE at 290° C. using a precursor dose sequence of $O_2$—HF-TMA. The $SiO_2$ ALE process utilized static reactant pressures of 250, 1.0 and 1.0 Torr and exposure times of 10, 5 and 5 s for $O_2$, HF and TMA, respectively. FIG. 39B shows that the Si film thickness decreased linearly with number of Si ALE cycles. A Si etch rate of ~0.4 Å/cycle was observed after a short nucleation period of 2-3 cycles.

During the first ~10 cycles, the thickness of the $SiO_2$ layer decreased from ~16 Å to ~10 Å. For the next ~70 cycles, the $SiO_2$ thickness stayed fixed at ~10-12 Å. Si ALE occurred at an etch rate of ~0.4 Å/cycle while the $SiO_2$ film thickness was essentially constant. During these cycles, the sequential Si oxidation and the $SiO_2$ etching processes reached a steady state.

Figure 40A:
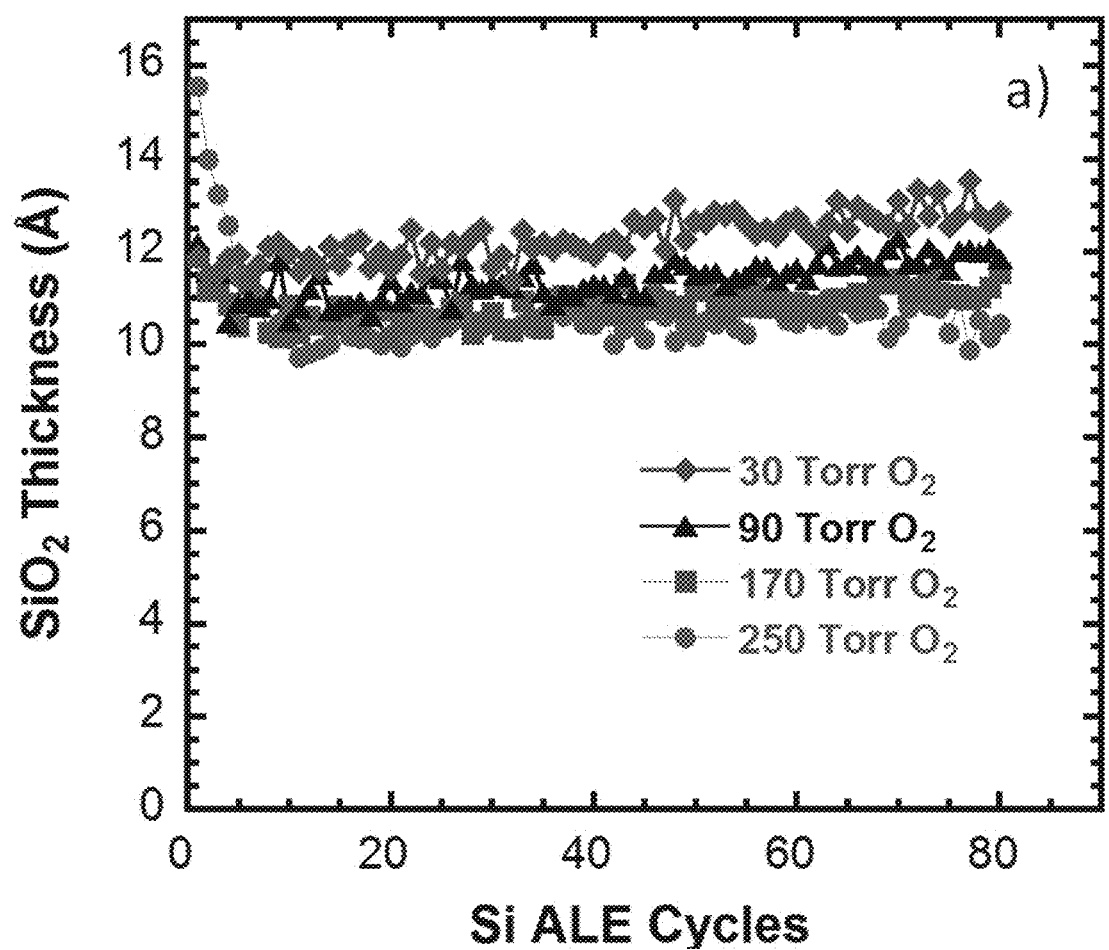
FIGS. 40A-40B are graphs showing $SiO_2$ thickness (FIG. 40A) and Si thickness change (MG 40B) versus the number of Si ALE cycles for various $O_2$ pressures during Si ALE at 290° C.
Figure 40B:
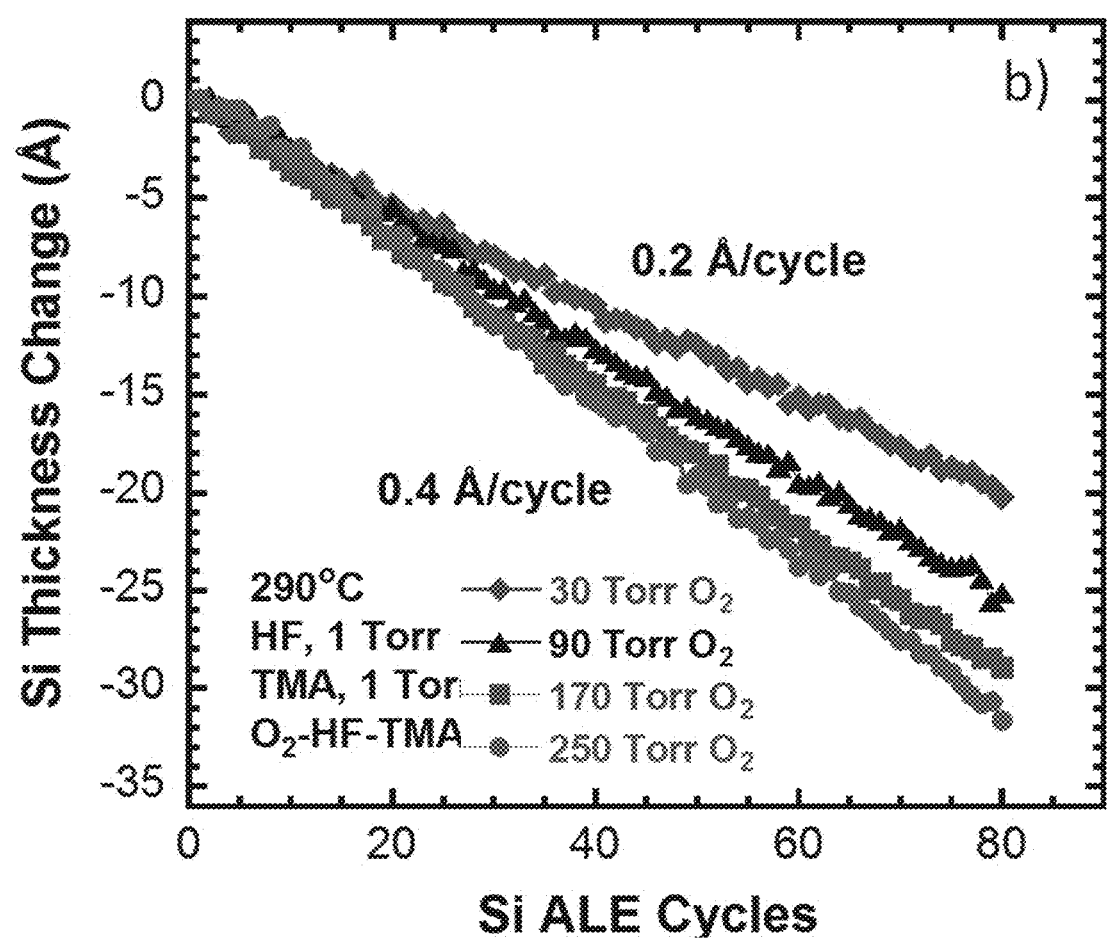

FIGS. 40A-40B display the results for Si ALE at various $O_2$ pressures. The $O_2$ pressures tested were 30, 90, 170 and 250 Torr. A dose sequence of $O_2$—HF-TMA was employed with TMA and HF partial pressures of 1.0 Torr. Static exposure times for $O_2$, TMA and HF were 10, 5 and 5 s respectively. The nitrogen purge time after each static dose was 30 s. FIG. 40A shows the thickness of the $SiO_2$ layer and FIG. 40B shows the thickness of the underlying Si during Si ALE.

FIG. 40A shows that at $O_2$ pressures between 30-250 Torr, the $SiO_2$ thickness remained constant at ~11 Å during Si ALE. At the lowest $O_2$ pressure of 30 Torr, the $SiO_2$ thickness appeared to increase slightly with the number of Si ALE cycles. Oxidation of Si using dry $O_2$ is a temperature and pressure-dependent process. A reduction in the silicon oxidation was expected at lower $O_2$ pressure. The apparent increase in the $SiO_2$ thickness at lower $O_2$ pressures is contrary to this expectation. Without intending to be limited to any particular theory, it is possible that silicon oxidation may become more heterogeneous at lower $O_2$ pressures. Two-dimensional oxide island nucleation may lead to pinholes and roughness in the $SiO_2$ film at thin $SiO_2$ thicknesses. Roughness in the $SiO_2$ film thickness at lower $O_2$ pressures can then be mistaken for the observed increase in 'effective layer thickness' in the ellipsometry analysis.

FIG. 40B shows that the Si layer thickness linearly decreased with number of ALE cycles at all $O_2$ pressures. The Si etch rate decreased from ~0.4 Å/cycle at 250 Torr to ~0.2 Å/cycle at 30 Torr. This trend is attributed to the reduction in the silicon oxidation at lower $O_2$ pressures. This reduction is not strictly proportional to the difference in $O_2$ pressures. The reduction of $O_2$ pressures from 90 to 30 Torr produced a significantly higher reduction in Si etch rate than the reduction from 250 to 170 Torr. Based on results of FIGS. 40A-40B, the optimal $O_2$ pressure tested for Si ALE was 250 Torr. The $O_2$ pressure of 250 Torr yielded the largest Si etch rate and did not display any evidence for an increase in surface roughness that may be caused by thin $SiO_2$ thicknesses.

Figure 41A:
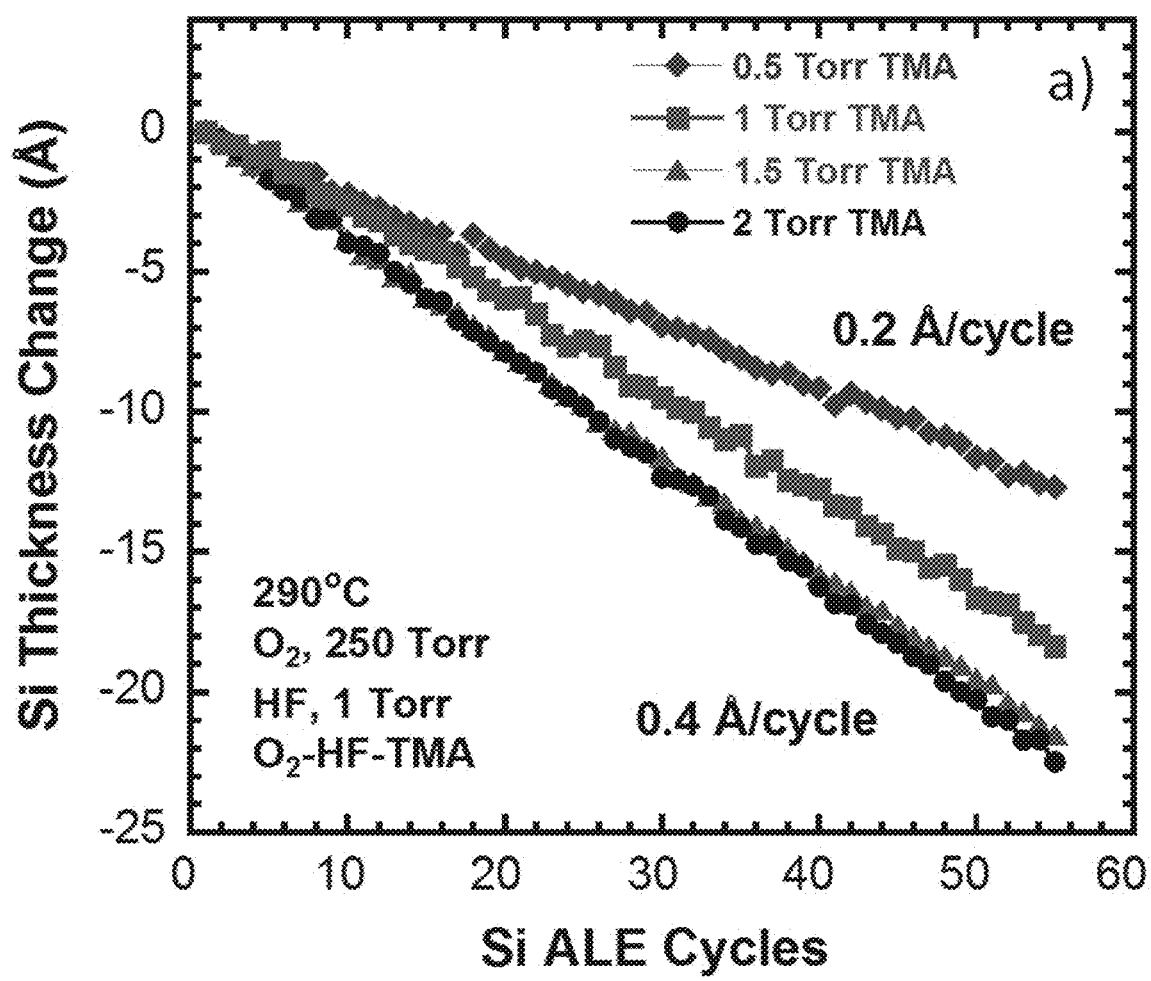
FIGS. 41A-41B are graphs showing the change in Si thickness versus number of Si ALE cycles for various TMA pressures (FIG. 41A) and Si thickness change versus number of Si ALE cycles for various HF pressures (FIG. 41B) during Si ALE at 290° C.
Figure 41B:
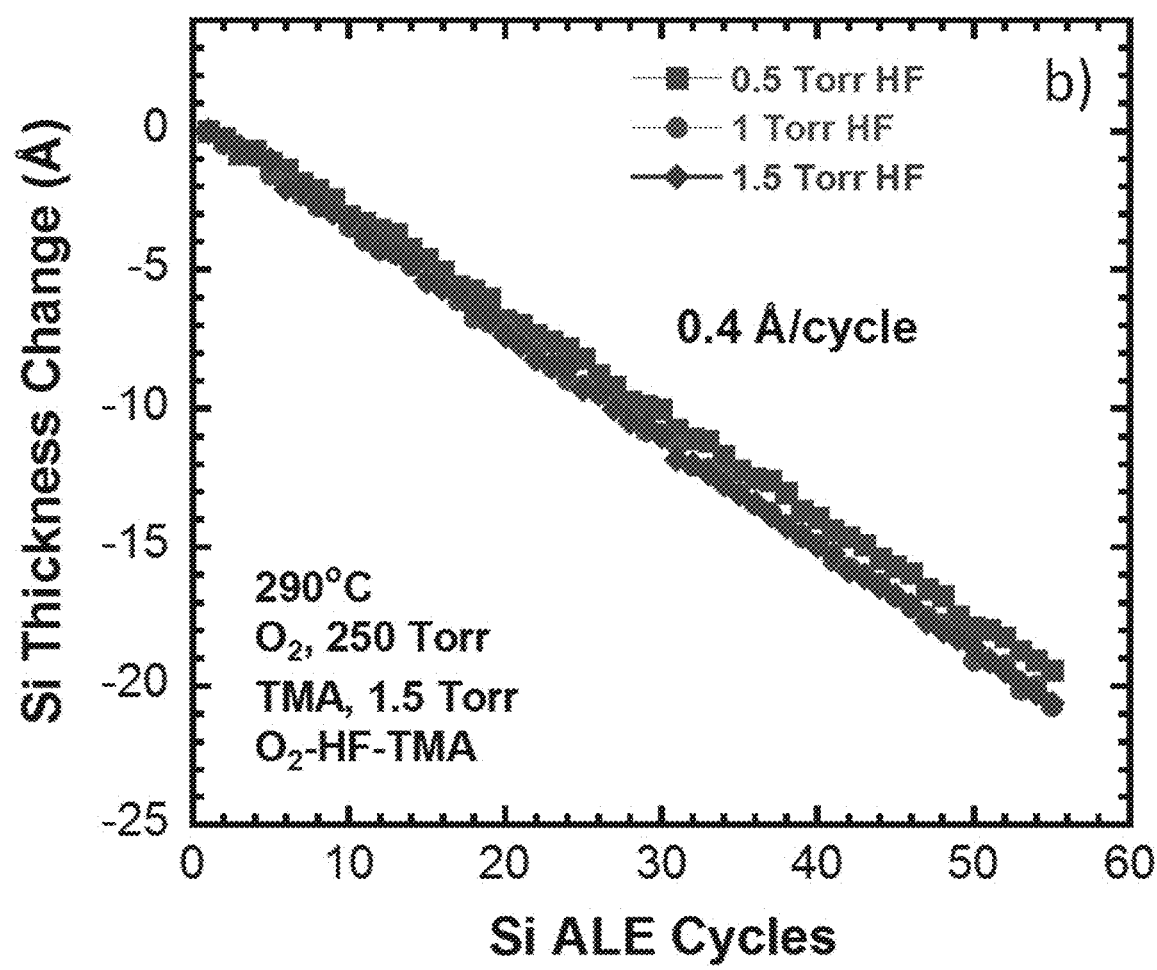

FIGS. 41A-41B show the effect of various partial pressures of TMA and HF on the Si etch rate at 290° C. These SE measurements were obtained using an $O_2$—HF-TMA precursor sequence. The static exposure times for $O_2$, TMA and HF were 10, 5 and 5 s, respectively, with purge times of 30 s. In FIG. 41A, the partial pressures of $O_2$ and HF were fixed at 250 Torr and 1 Torr respectively, while the pressure of TMA was varied from 0.5 to 2.0 Torr. The Si film etch rate increased from about 0.2 Å/cycle at 0.5 Torr TMA to about 0.4 Å/cycle at 1.5 Torr TMA. A further increase of the TMA pressure from 1.5 Torr to 2.0 Torr had a negligible effect on the Si etch rate.

FIG. 41B shows the Si thickness versus number of Si ALE cycles for the $O_2$ and TMA pressures fixed at 250 and 1.5 Torr, respectively, and the HF pressure varied from 0.5 Torr to 1.5 Torr. These results show no change in silicon etch rate for the different HF partial pressures. All of the HF partial pressures lead to a Si etch rate of 0.4 Å/cycle. The Si etch rates were much more sensitive to a change of the TMA partial pressure than a change of the HF partial pressure.

Effect of $O_2$—HF-TMA versus $O_2$-TMA-HF Exposure Sequence

Figure 42A:
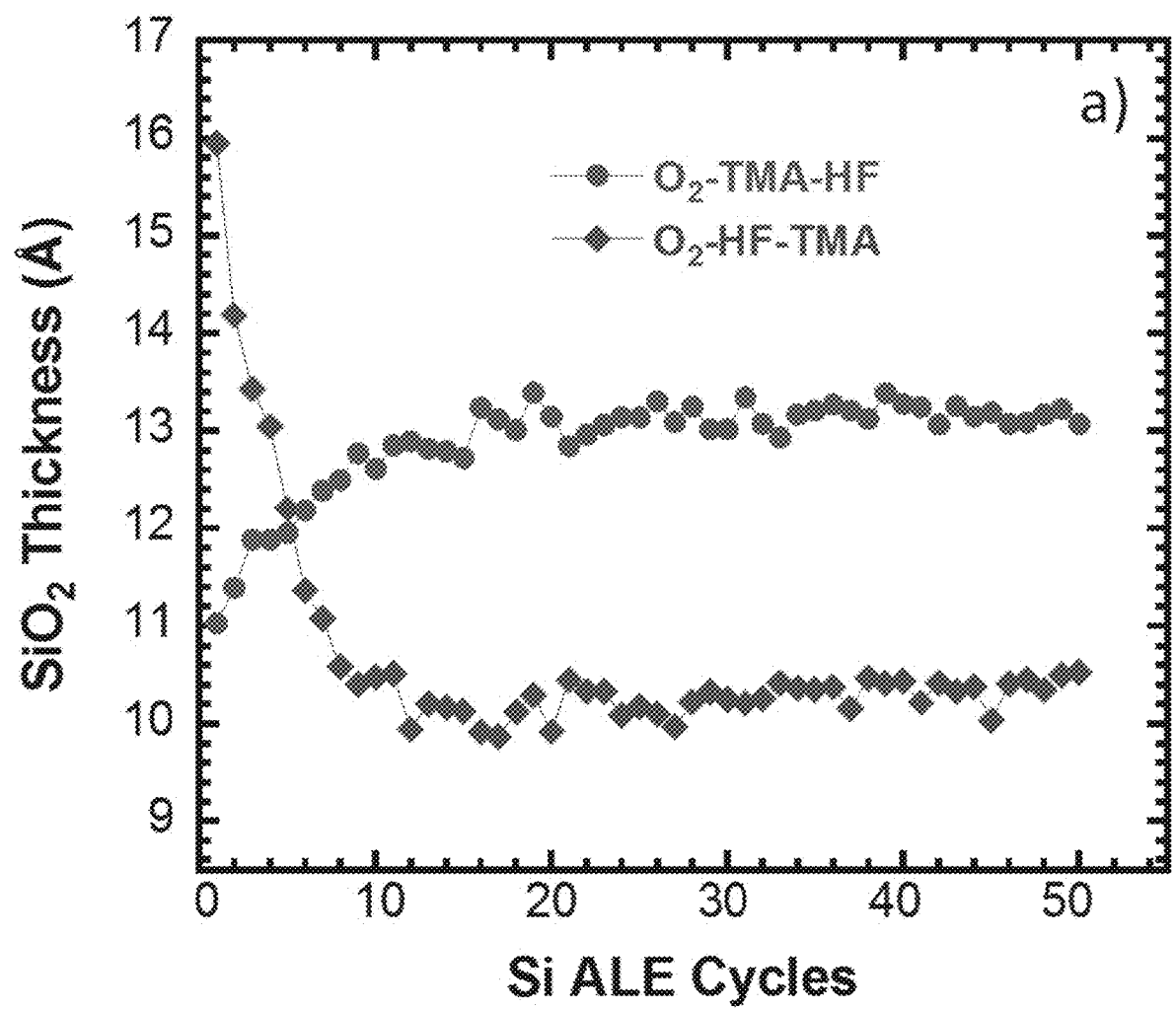
FIGS. 42A-42B are graphs showing $SiO_2$ thickness (FIG. 42A) and Si thickness change versus number of Si ALE cycles (FIG. 42B) for the $O_2$—HF-TMA and $O_2$-TMA-HF exposure sequences at 290° C.
Figure 42B:
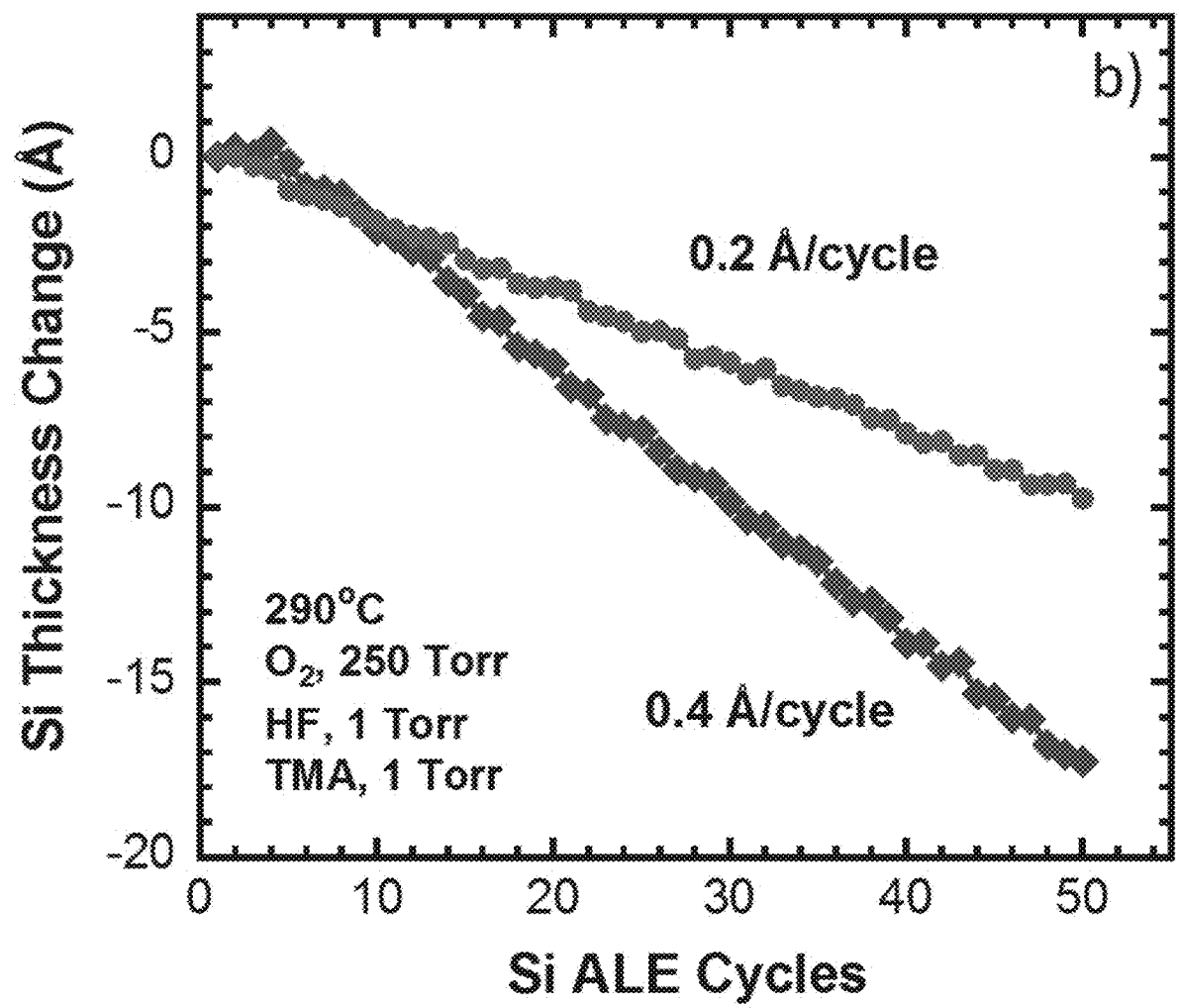

The effect of the $O_2$—HF-TMA and $O_2$-TMA-HF precursor sequences on Si ALE are shown in FIGS. 42A-42B. These experiments were performed at 290° C. using static exposure times for $O_2$, TMA and HF of 10, 5 and 5 s, respectively, with purge times of 30 s between exposures. The partial pressures of $O_2$, TMA and HF were 250 Torr, 1.0 Torr and 1.0 Torr respectively. The results for the $O_2$-TMA-HF exposure sequence were obtained immediately after the $O_2$—HF-TMA exposure sequence.

FIG. 42A shows $SiO_2$ thickness during the two exposure sequences. For the $O_2$—HF-TMA sequence, the thickness of the $SiO_2$ layer was reduced quickly from the native oxide thickness of ~16 Å and reaches a constant thickness of ~11 Å after ~10 Si ALE cycles. For the $O_2$-TMA-HF sequence, the $SiO_2$ thickness gradually increased from the initial oxide thickness of ~11 Å and reached a constant thickness of 13 Å after 15-20 Si ALE cycles.

FIG. 42B displays the Si film thickness during the $O_2$—HF-TMA and $O_2$-TMA-HF precursor sequences. The $O_2$—HF-TMA exposure sequence yielded a Si etch rate of 0.4 Å/cycle. Switching to the $O_2$-TMA-HF exposure sequence reduced the Si etch rate to 0.2 Å/cycle. The different precursor sequences changed the surface chemistry during Si ALE. Without intending to be limited to any particular theory, the $O_2$-TMA-HF sequence is believed to reduce the Si etch rate by producing additional $Al_2O_3$ on the surface when the TMA exposures follow the $O_2$ exposures. This additional surface oxide can act as a diffusion barrier and reduce the oxidation of the underlying silicon during the $O_2$ exposures and the resulting Si etch rate.

Without intending to be limited to any particular theory, the $O_2$—HF-TMA exposure sequence may also be more favorable because the TMA exposure occurs after the HF exposure. The HF exposure fluorinates the $Al_2O_3$ surface layer to produce an $AlF_3$ surface layer. The TMA can then easily undergo ligand-exchange reactions with the $AlF_3$ surface layer and produce volatile etch products such as $AlF(CH_3)_2$. For the $O_2$-TMA-HF exposure sequence, the $O_2$ exposure precedes the TMA exposure. The $O_2$ exposure may alter the fluorinated surface layer produced by the HF exposure. This change to the fluorinated surface layer may subsequently affect the TMA ligand-exchange reaction and reduce the Si etch rate.

Figure 43:
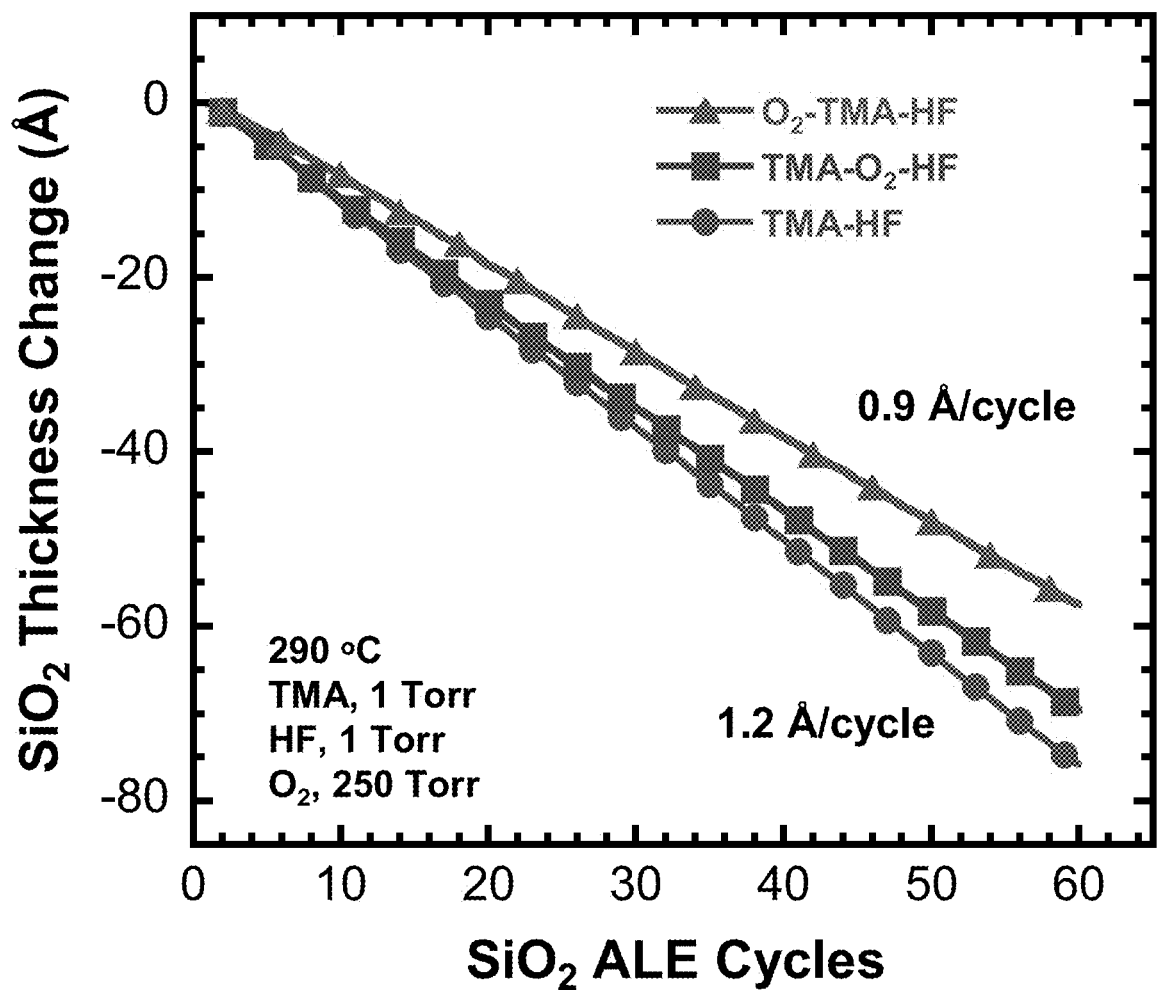
FIG. 43 is a graph showing the change in $SiO_2$ thickness versus the number of $SiO_2$ ALE cycles during $SiO_2$ ALE using various exposure sequences at 290° C. Exposure sequences were $O_2$-TMA-HF, $O_2$—HF-TMA and TMA-HF.

The effects of the $O_2$ exposures and the different exposure sequences were also explored for $SiO_2$ ALE. FIG. 43 compares the $SiO_2$ thickness versus $SiO_2$ ALE cycles for the TMA-HF, $O_2$—HF-TMA and $O_2$-TMA-HF exposure sequences at 290° C. Static exposure times for $O_2$, TMA and HF were 10, 5 and 5 s, respectively, with purge times of 30 s between exposures. The partial pressures of $O_2$, TMA and HF were 250 Torr, 1.0 Torr and 1.0 Torr, respectively. The addition of the $O_2$ exposure to the $SiO_2$ ALE process reduced the $SiO_2$ etch rate.

FIG. 43 shows that the TMA-HF exposure sequence had a $SiO_2$ etch rate of 1.2 Å/cycle. The $O_2$—HF-TMA exposure sequence had a lower $SiO_2$ etch rate of 0.9 Å/cycle. The $SiO_2$ etch process was hindered by the addition of the $O_2$ exposure. Without intending to be limited to any particular theory, the $O_2$ exposures may be reacting with surface aluminum species to produce a thin film of $Al_2O_3$ that acts as a diffusion barrier and impedes the conversion of $SiO_2$ to $Al_2O_3$ by TMA. The $O_2$ exposure may also be leading to a change of surface species that affects the ligand-exchange reaction between TMA and the fluorinated surface. Both the oxide diffusion barrier and change of surface species resulting from the $O_2$ exposure could reduce the $SiO_2$ etch rate.

Si Etch Rate Versus Temperature

Figure 44:
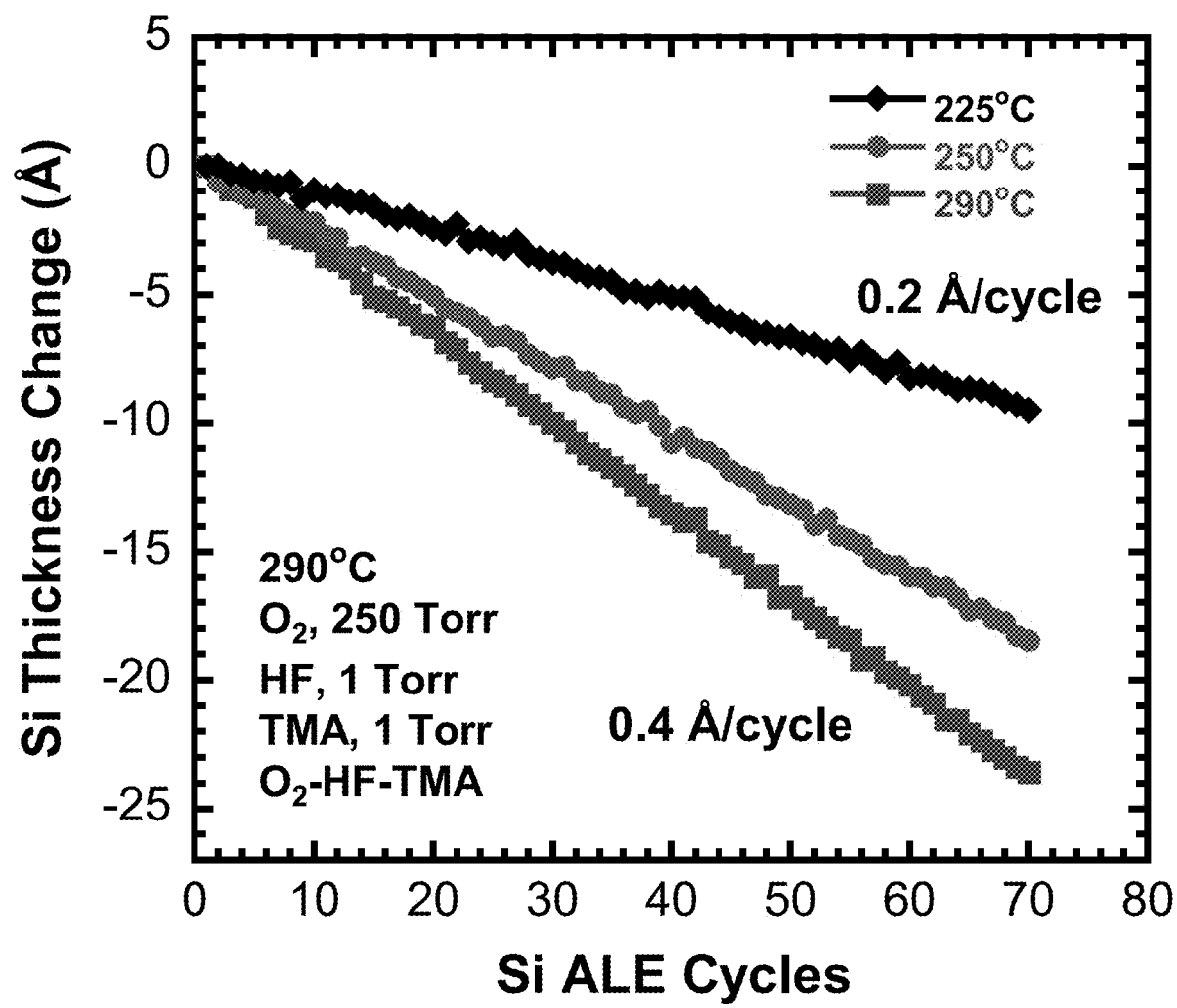
FIG. 44 is a graph showing the change in Si thickness versus the number of Si ALE cycles during Si ALE at 290, 250, and 225° C. Si ALE was performed using the $O_2$—HF-TMA exposure sequence.

The Si ALE process was also found to be dependent on the substrate temperature. FIG. 44 shows the Si film thickness versus Si ALE cycles at substrate temperatures of 225, 250 and 290° C. These experiments were performed with static exposures times for $O_2$, TMA and HF of 10, 5 and 5 s, respectively. Purge times of 30 s were employed between successive exposures. The partial pressures of $O_2$, TMA and HF were 250 Torr, 1.0 Torr and 1.0 Torr, respectively.

A substrate temperature of 290° C. yielded a Si etch rate of 0.4 Å/cycle. Lower substrate temperatures led to a reduction in the Si etch rate. The etch rate was 0.2 Å/cycle at the lowest sample temperature of 225° C. This temperature dependence of the Si etch rate is consistent with earlier measurements of the temperature dependence of the $SiO_2$ etch rate using TMA and HF. This temperature dependence is likely the result of more conversion of $SiO_2$ to $Al_2O_3$ during the TMA conversion reaction at higher temperatures.

$SiO_2$ Thickness During Si Oxidation

Figure 45:
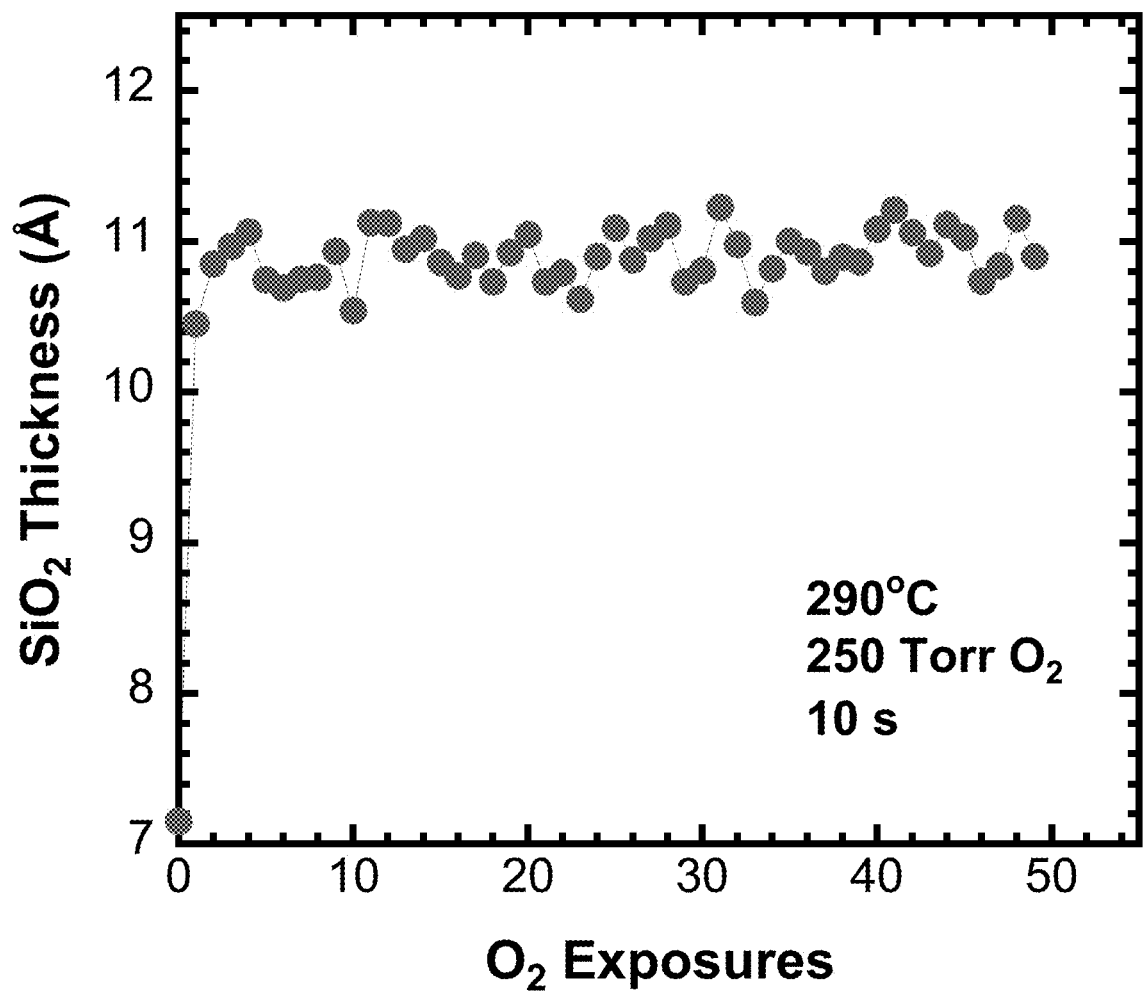
FIG. 45 is a graph of $SiO_2$ thickness versus number of $O_2$ exposures at 250 Torr and 290° C. The initial sample was a wet-etched SOI wafer.

Silicon oxidation is usually performed at much higher temperatures and pressures than the temperatures of 225-290° C. and $O_2$ pressures of 30-250 Torr that were employed in the experiments reported herein. Typical silicon oxidation temperatures and $O_2$ pressures vary from 800-1000° C. and about 760 Torr. To characterize silicon oxidation under the reaction conditions during Si ALE, additional experiments of silicon oxidation were performed at 290° C. and $O_2$ pressures of 250 Torr under reaction conditions that matched the Si ALE experiments. FIG. 45 shows the $SiO_2$ thickness on silicon after consecutive static $O_2$ exposures at 250 Torr for 10 s with purge times of 30 s. Prior to oxidation, the SOI wafer was wet-etched using an aqueous HF solution (1:50) to remove the native silicon oxide. The SE measurements of the $SiO_2$ thickness were recorded after each $O_2$ exposure.

FIG. 45 shows that ~7 Å of oxide is on the Si surface after the wet etching. This silicon oxide thickness is considered an "effective" oxide thickness and is not a real oxide thickness. This "effective" oxide thickness is an artifact of the ellipsometric measurements. The thickness of the effective oxide after wet etching in FIG. 45 is consistent with other effective oxide thicknesses that have been observed by ellipsometry after HF wet etching of the native oxide on silicon.

FIG. 45 shows that the first $O_2$ exposure on the wet-etched SOI wafer produced a $SiO_2$ thickness of ~10.5 Å. Subsequent oxygen exposures lead to smaller increases until a $SiO_2$ thickness of ~11 Å was obtained after 4-5 $O_2$ exposures. Similar oxidation behavior has been previously reported under similar reaction conditions. At 300° C. and $O_2$ pressures of 1 Torr, the silicon oxidation rate was initially high at ~1 Å/s. The oxidation rate then slowed dramatically to ~0.04 Å/s after reaching an oxide thickness of ~6 Å.

The $SiO_2$ thickness was self-limiting at ~11 Å at the $O_2$ pressure of 250 Torr and substrate temperature of 290° C. This $SiO_2$ thickness of ~11 Å also almost identical to the $SiO_2$ thickness of ~11 Å observed during Si ALE in FIGS. 39, 41A and 41B. This $SiO_2$ thickness of ~11 Å was also reached after only one $O_2$ exposure at 250 Torr for 10 s at 290° C. This behavior suggests that the $O_2$ exposures used during the Si ALE experiments were sufficient for self-limiting silicon oxidation.

Atomic Force Microscopy Measurements

Atomic-force-microscopy (AFM) measurements were employed to compare the surface roughness of the SOI wafers before and after Si ALE. FIGS. 46A-46B show AFM images of the SOI wafers after 100 Si ALE cycles using $O_2$ pressures of 250 Torr and 30 Torr at 290° C. FIG. 46A displays an AFM image of the SOI wafer after 100 Si ALE cycles at an $O_2$ pressure of 250 Torr. The AFM measurement of the as-received SOI wafer was nearly identical with the SOI wafer after 100 Si ALE cycles at an $O_2$ pressure of 250 Torr at 290° C. The RMS roughness was ~2 Å for the as-received SOI wafer and for the SOI wafer after the etch process using 250 Torr of $O_2$. This RMS roughness was uniform across the 2.5 cm×2.5 cm SOI wafer.

FIG. 46B shows an AFM image of the SOI wafer after 100 Si ALE cycles at an $O_2$ pressure of 30 Torr. The lower $O_2$ pressure of 30 Torr in the Si ALE cycle lead to an increased RMS roughness of ~8.6 Å. In addition, the image in FIG. 46B showed signs of porosity. This higher roughness, with evidence for porosity, is consistent with the higher $SiO_2$ thickness observed by ellipsometry during Si ALE at lower $O_2$ pressures. Without intending to be limited to any particular theory, the $SiO_2$ film roughness and porosity may lead to a larger effective $SiO_2$ thickness from the ellipsometry analysis. These observations suggest that an $O_2$ pressure of 30 Torr is too low for Si ALE. Higher $O_2$ pressures were needed to maintain adequate silicon oxidation for uniform silicon etching during Si ALE without surface roughening.

Example 14: SiN ALE Using $O_3$, HF and TMA

Data was obtained for silicon nitride (SiN) ALE, as an extension of the Si ALE results reported in Example 13. A proposed mechanism for SiN ALE is shown in FIG. 47. This mechanism is similar to the mechanism proposed for Si ALE. Analysis of SiN ALE was performed using in situ spectroscopic ellipsometry as shown in FIG. 48.

$O_3$ was used as the oxidation reactant in the SiN ALE experiments. FIG. 49 shows the oxidation of the surface of the SiN wafer using $O_3$ exposures. The $O_3$ exposures produced a $SiO_2$ layer on the SiN that is self-limiting versus $SiO_2$ thickness, similar to the results observed for Si ALE.

SiN ALE using either the $O_3$—HF-TMA or $O_3$-TMA-HF exposure sequences is shown in FIGS. 50A-50B. Similar to the Si ALE methods, the preferred exposure sequence for SiN ALE was $O_3$—HF-TMA because this sequence gave the highest SiN etch rate. The $O_3$—HF-TMA exposure sequence also yielded a constant $SiO_2$ thickness on top of the SiN wafer.

FIGS. 51A-51B show SiN ALE versus TMA or HF pressure using $O_3$ as the oxidation reactant. It was found that higher TMA and HF pressures lead to slightly higher SiN etch rates.

The temperature dependence of SiN ALE using $O_3$ as the oxidation reactant is shown in FIG. 52. Higher temperatures lead to higher SiN etch rates.

The effect of $O_3$ pressure on the SiN ALE is shown in FIG. 53. The SiN etch rate was found to be constant at 0.5 Å/cycle for $O_3$ pressures from 37-250 Torr. In addition, the $SiO_2$ layer on top of the SiN wafer was also very constant at ~12 Å. Without intending to be limited to any particular theory, the $SiO_2$ layer formed a "cap" on the SiN wafer, limiting the etch rate.

SiN ALE was found to smooth the SiN wafer. FIGS. 54A-54B show AFM images of the SiN wafer before and after ALE. Prior to SiN ALE, the RMS roughness of the SiN wafer was 4.7 Å. After 80 cycles of SiN ALE, the wafer surface was smoothed and had a RMS roughness of 3.1 Å.

The $SiO_2$ "cap" on the SiN wafer was partially removed following SiN ALE. FIG. 55 shows both SiN ALE and then $SiO_2$ ALE after the SiN ALE. The $SiO_2$ ALE removed a fraction of the $SiO_2$ thickness on top of the SiN wafer.

SiN ALE was also performed using $O_2$ as the oxidation reactant. FIG. 56 shows the results for SiN ALE using an $O_2$—HF-TMA exposure sequence. The SiN ALE was only weakly dependent on the $O_2$ pressure. FIG. 57 shows SiN ALE for various $O_2$ pressures ranging from 250-450 Torr.

Example 15: Si ALE of Ultrathin Si Films

Si ALE methods of the invention were used to prepare precisely controlled ultrathin silicon films that displayed quantum confinement effects. Silicon quantum wells and silicon nanomembranes display band gap shifts at silicon film thicknesses <100 Å. Silicon in the quantum confinement regime also undergoes a change from an indirect to a direct band gap transition. Consequently, Si ALE can be used for silicon band gap tuning and optoelectronics applications.

FIG. 58 displays the silicon thickness during Si ALE for an initial silicon film thickness of ~100 Å. The etching was performed using partial pressures of $O_2$, HF and TMA of 250 Torr, 1.0 Torr and 1.0 Torr, respectively. The static exposures times for $O_2$, HF and TMA were 10, 5 and 5 s, respectively, with purge times of 30 s. FIG. 58 shows a linear decrease in the silicon film thickness versus number of Si ALE cycles over the entire thickness range. The etch rate was ~0.5 Å/cycle from the initial silicon film thickness of ~100 Å until the silicon film was completed removed from the $SiO_2$ film on the SOI wafer. No change in the etch rate for silicon films in the quantum confinement regime was observed at silicon thicknesses <100 Å.

The linearity of the silicon thickness reduction with Si ALE cycles displayed in FIG. 58 suggests that Si ALE can produce precise ultrathin silicon thicknesses. These controlled ultrathin silicon thicknesses are useful for advanced semiconductor fabrication. Ultrathin silicon thicknesses could also have application in other silicon areas such as optoelectronics, photonics, flexible electronics, thermoelectrics, microelectromechanical systems and ultrathin separation membranes.

Example 16: Si ALE Using Ozone ($O_3$) as Oxidant

Si ALE can also be performed using $O_3$ instead of $O_2$ with a reactant exposure sequence $O_3$—HF-TMA, similar to that described in Example 14. Silicon ALE using $O_2$ with a reactant exposure sequence $O_2$—HF-TMA was discussed earlier in Example 13.

Spectroscopic ellipsometry was used to determine the Si and $SiO_2$ film thicknesses during Si ALE using the reactant exposure sequence $O_3$—HF-TMA at 290° C. FIG. 59 displays the change in Si thickness and $SiO_2$ film thickness versus number of Si ALE cycles. The Si thickness decreased linearly versus number of reaction cycles. In contrast, the thickness of the $SiO_2$ layer remained relatively constant at ~17 Å.

The ozone pressure was found to affect the etch rate during Si ALE. FIG. 60A shows the Si thickness change and FIG. 60B shows the $SiO_2$ thickness versus the number of Si ALE cycles for various $O_3$ pressures during Si ALE at 290° C. using a reactant exposure sequence $O_3$—HF-TMA. The $O_3$ pressure had almost no effect on the etching rate during Si ALE. In addition, the $O_3$ pressure led to only slight changes in the thickness of the $SiO_2$ thickness during Si ALE.

The pressure of HF and TMA during Si ALE while using $O_3$ as the reactant was also found to have an effect on the Si etch rate. FIG. 61 displays the change in Si thickness versus number of Si ALE cycles for various TMA and HF pressures during Si ALE at 290° C. using a reactant exposure sequence $O_3$—HF-TMA. The Si ALE etch rate increased with increasing pressure from 0.5 Torr to 2 Torr and then showed little change for increases in the pressure from 2 Torr to 3 Torr. Temperature also altered the etch rate during Si ALE using the $O_3$—HF-TMA exposure sequence. FIG. 62 is a graph showing the change in Si thickness versus the number of Si ALE cycles during Si ALE at 290, 270, and 250° C.

The surface roughness of the silicon surface after Si ALE is dependent on the $O_3$ pressure. FIGS. 63A-63B display AFM images and graphs of SOI wafers after 100 cycles of Si ALE using the $O_3$—HF-TMA exposure sequence at 290° C. with $O_3$ pressures at 250 Torr (FIG. 63A) and $O_3$ pressures at 30 Torr (FIG. 63B). RMS surface roughness was 2.0 Å with $O_3$ pressure at 250 Torr and 8.6 Å with $O_3$ pressure at 30 Torr.

At the conclusion of Si ALE, the $SiO_2$ film on top of the Si film can be removed by $SiO_2$ ALE. FIG. 64 displays the removal of the $SiO_2$ layer from Si using $SiO_2$ ALE at 290° C. with TMA and HF as the precursors. These results are shown after 35 initial Si ALE cycles using the $O_3$—HF-TMA exposure sequence at 290° C.

$O_3$ can also etch silicon in the ultrathin film thickness regime. FIG. 65 shows the Si thickness versus number of Si ALE cycles using the $O_3$—HF-TMA exposure sequence during Si ALE at 290° C. Si ALE was performed on an ultrathin silicon film with an initial thickness of 85 Å on the $SiO_2$ layer of an SOI wafer.

The disclosures of each and every patent, patent application, and publication cited herein are hereby incorporated herein by reference in their entirety.

While the invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A method of atomic layer etching (ALE) a solid substrate comprising a first element compound, the method comprising the sequential steps of:
    (a) contacting the solid substrate with a gaseous second element precursor, wherein the second element precursor comprises at least one ligand selected from the group consisting of a monodentate ligand, chelate and any combinations thereof,
        whereby a first element product is formed;
    (b) contacting the solid substrate formed in step (a) with a halogen-containing gas,
        whereby a first element halide is formed; and
    (c) optionally repeating steps (a) and (b) one or more times;
    wherein, in at least one time point selected from the group consisting of: during step (a), inbetween step (a) and step (b), during step (b), and inbetween step (b) and step (a) of the following iteration, the surface is treated with an agent that removes at least a fraction of any ligand, or any residual surface species that results from a surface reaction that occurs during at least one time point selected from the group consisting of during step (a), inbetween step (a) and step (b), during step (b), and inbetween step (b) and step (a) of the following iteration, that is bound to or adsorbed onto the solid substrate,
    wherein the agent is at least one selected from the group consisting of a radical, photon, ion, electron, alkali metal catalyst, alkaline earth catalyst, and trimethylaluminum,
        wherein the alkali metal catalyst is formed on the solid substrate from an alkali metal molecular precursor, and
        wherein the alkaline earth metal catalyst is formed on the solid substrate from an alkaline earth metal molecular precursor;
    wherein the monodentate ligand comprises at least one selected from the group consisting of alkyl, hydride, carbonyl, halide, alkoxide, alkylamide, silylamide and any combinations thereof; and,
    wherein the chelate comprises at least one selected from the group consisting of β-diketonate, amidinate, acetamidinate, β-diketiminate, diamino alkoxide, metallocene and any combinations thereof;
    whereby the solid substrate is etched.

2. The method of claim 1, wherein the solid substrate is contacted with a halogen-containing gas before step (a), thereby forming a first element halide.

3. The method of claim 1, wherein treatment with the agent etches the solid substrate at a higher rate or lowers the temperature required for etching of the solid substrate as compared to a control method without treatment with the agent.

4. The method of claim 1, wherein the first element comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn, and any combinations thereof.

5. The method of claim 4, wherein the agent comprises a radical generated by a plasma and wherein the plasma comprises a $H_2$ plasma or an Ar plasma.

6. The method of claim 1, wherein the second element comprises at least one selected from the group consisting of Sn, Ge, Al, B, Ga, In, Zn, Ni, Pb, Si, S, P, Hf, Zr, Ti, and any combinations thereof.

7. The method of claim 1, wherein the agent comprises a molecular precursor that adsorbs on the solid substrate and displaces other surface-adsorbed species that limit the progress of the ALE.

8. The method of claim 1, wherein the solid substrate is contained in a single system and is sequentially contacted with the gaseous compound of the second element in step (a) and the halogen-containing gas in step (b), wherein the solid substrate is purged with an inert gas after at least one of step (a) and step (b).

9. The method of claim 1, wherein the gaseous compound of the second element in step (a) and the halogen-containing gas in step (b) are contained in separate systems, and the solid substrate is physically moved from one system to the other.

10. The method of claim 1, wherein the first element compound comprises at least one selected from the group consisting of element oxide, element nitride, element phosphide, element sulfide, element arsenide, element fluoride, element silicide, element boride, element carbide, element selenide, element telluride, elemental element, element alloy, hybrid organic-inorganic material, and any combinations thereof.

11. The method of claim 1, wherein the solid substrate is first submitted to a chemical treatment that results in the formation, on at least a portion of the surface of the solid substrate, of a element compound selected from the group consisting of a element oxide, element nitride, element phosphide, element sulfide, element arsenide, element fluoride, element silicide, element boride, element carbide, element selenide, element telluride, elemental element, element alloy, hybrid organic-inorganic material, and any combinations thereof.

12. A method of atomic layer etching (ALE) a solid substrate comprising a first element compound, the method comprising the sequential steps of:
  (x) submitting the solid substrate to a chemical treatment that results in the formation, on at least a portion of the surface of the solid substrate, of a first element compound selected from the group consisting of a first element oxide, first element nitride, first element phosphide, first element sulfide, first element arsenide, first element fluoride, first element silicide, first element boride, first element carbide, first element selenide, first element telluride, elemental first element, first element alloy, and hybrid organic-inorganic material;
  (b) contacting the solid substrate formed in step (x) with a halogen-containing gas, whereby first element halide is formed as a product on the surface;
  (a) contacting the solid substrate formed in step (b) with a gaseous second element precursor, wherein the precursor comprises at least one selected from the group consisting of monodentate ligands, chelates and any combinations thereof, whereby a first element reaction product is formed; and
  (c) optionally repeating steps (x), (b) and (a) one or more times;
  wherein, in at least one time point selected from the group consisting of: during step (x), inbetween step (x) and step (b), during step (b), inbetween step (b) and step (a), during step (a), and inbetween step (a) and step (x) of the following iteration, the surface is treated with an agent that removes at least a fraction of any ligand, or any residual surface species that results from a surface reaction that occurs during at least one time point selected from the group consisting of during step (x), inbetween step (x) and step (b), during step (b), inbetween step (b) and step (a), during step (a), and inbetween step (a) and the step (x) of the following iteration, that is bound to or adsorbed onto the solid substrate;
  wherein the agent is at least one selected from the group consisting of a radical, photon, ion, electron, alkali metal catalyst, alkaline earth catalyst, and trimethylaluminum,
    wherein the alkali metal catalyst is formed on the solid substrate from an alkali metal molecular precursor, and
    wherein the alkaline earth metal catalyst is formed on the solid substrate from an alkaline earth metal molecular precursor;
  wherein the monodentate ligand comprises at least one selected from the group consisting of alkyl, hydride, carbonyl, halide, alkoxide, alkylamide, silylamide and any combinations thereof; and,
  wherein the chelate comprises at least one selected from the group consisting of β-diketonate, amidinate, acetamidinate, β-diketiminate, diamino alkoxide, metallocene and any combinations thereof;
  whereby the solid substrate is etched.

13. The method of claim 12, wherein the solid substrate comprises at least one selected from the group consisting of Si, SiN, $SiN_xO_y$, $Si_xGe_y$, SiC, $SiB_3$, SiP, SiAs, SiSe, RuSi, $Ti_xSi_y$, $V_xSi_y$, $Nb_xSi_y$, $Mo_xSi_y$, $Ta_xSi_y$, $Re_xSi_y$, and $W_xSi_y$, wherein x is an integer from 1 to 6 and y is an integer from 1 to 6.

14. The method of claim 12, wherein the chemical treatment is oxidation, the first element compound formed in (x) is $SiO_2$, the halogen containing gas is HF, and the gaseous second element precursor is $Al(CH_3)_3$.

15. The method of claim 12, wherein the chemical treatment is oxidation conducted by contacting the solid substrate with at least one oxidant selected from the group consisting of oxygen ($O_2$), ozone ($O_3$), hydrogen peroxide ($H_2O_2$), water ($H_2O$), and an oxygen-containing plasma.

16. The method of claim 15, wherein the solid substrate is contacted with the oxidant at a temperature of about 30° C. to about 400° C.

17. The method of claim 15, wherein the solid substrate is contacted with the oxidant at a pressure of about 20 Torr to about 400 Torr.

18. The method of claim 12, wherein the solid substrate is contained in a single system and is sequentially contacted with the chemical treatment in step (x), the halogen-containing gas in step (b) and the gaseous compound of the second element in step (a) and wherein the solid substrate is purged with an inert gas after at least one of step (x), step (b) and step (a).

19. The method of claim 12, wherein the chemical treatment in step (x), the halogen-containing gas in step (b) and the gaseous compound of the second element in step (a) are contained in separate systems, and the solid substrate is physically moved from one system to the other.

20. The method of claim 12, wherein the first element comprises at least one selected from the group consisting of Al, Hf, Zr, Fe, Ni, Co, Mn, Mg, Rh, Ru, Cr, Si, Ti, Ga, In, Zn, Pb, Ge, Ta, Cu, W, Mo, Pt, Cd, Sn and any combinations thereof.

21. The method of claim 1, wherein the second element comprises at least one selected from the group consisting of Sn, Ge, Al, B, Ga, In, Zn, Ni, Pb, Si, S, P, Hf, Zr, Ti and any combinations thereof.

* * * * *